(12) United States Patent
Maejima

(10) Patent No.: US 11,282,568 B2
(45) Date of Patent: Mar. 22, 2022

(54) SEMICONDUCTOR STORAGE DEVICE HAVING A MEMORY UNIT BONDED TO A CIRCUIT UNIT AND CONNECTED TO EACH OTHER BY A PLURALITY OF BONDING METALS

(71) Applicant: KIOXIA CORPORATION, Tokyo (JP)

(72) Inventor: Hiroshi Maejima, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/008,452

(22) Filed: Aug. 31, 2020

(65) Prior Publication Data

US 2021/0125660 A1 Apr. 29, 2021

(30) Foreign Application Priority Data

Oct. 29, 2019 (JP) .............................. JP2019-196382

(51) Int. Cl.

| G11C 11/4094 | (2006.01) |
|---|---|
| G11C 7/10 | (2006.01) |
| G11C 5/06 | (2006.01) |
| G11C 11/4097 | (2006.01) |
| G11C 11/408 | (2006.01) |
| G11C 11/4074 | (2006.01) |
| G11C 11/4091 | (2006.01) |

(52) U.S. Cl.
CPC ............ *G11C 11/4094* (2013.01); *G11C 5/06* (2013.01); *G11C 7/106* (2013.01); *G11C 7/1087* (2013.01); *G11C 11/4074* (2013.01); *G11C 11/4085* (2013.01); *G11C 11/4091* (2013.01); *G11C 11/4097* (2013.01)

(58) Field of Classification Search
CPC ............ G11C 11/4094; G11C 11/4074; G11C 11/4085; G11C 11/4091; G11C 11/4097; G11C 5/06; G11C 7/106; G11C 7/1087
USPC ..................................................... 365/185.13
See application file for complete search history.

(56) References Cited

U.S. PATENT DOCUMENTS

| 8,036,010 | B2 | 10/2011 | Maejima |
| 10,026,491 | B2 | 7/2018 | Utsunomiya et al. |
| 10,283,493 | B1* | 5/2019 | Nishida ............. H01L 27/11582 |
| 10,381,374 | B2* | 8/2019 | Tagami ............. H01L 27/11582 |
| 10,510,738 | B2* | 12/2019 | Kim ....................... H01L 24/80 |

(Continued)

FOREIGN PATENT DOCUMENTS

| JP | 2009-223971 A | 10/2009 |
| TW | I665682 B | 7/2019 |

OTHER PUBLICATIONS

U.S. Appl. No. 16/795,763, filed Feb. 20, 2020.

*Primary Examiner* — Son L Mai
(74) *Attorney, Agent, or Firm* — Kim & Stewart LLP

(57) ABSTRACT

A semiconductor storage device includes a memory unit and a circuit unit bonded to the memory unit. The memory unit includes first and second memory cells, first and second bit lines respectively connected to the first and second memory cells, and first and second bonding metals respectively connected to the first and second bit lines. The circuit unit includes a sense amplifier unit including a first wire, a third bonding metal connected with the first wire and opposed to the first bonding metal, and a fourth bonding metal connected with the first wire and opposed to the second bonding metal.

18 Claims, 39 Drawing Sheets

(56) References Cited

U.S. PATENT DOCUMENTS

| | | | |
|---|---|---|---|
| 10,580,788 B2 * | 3/2020 | Zhu | H01L 21/76802 |
| 10,665,581 B1 * | 5/2020 | Zhou | H01L 24/73 |
| 10,734,080 B2 * | 8/2020 | Chibvongodze | H01L 27/1157 |
| 10,741,535 B1 * | 8/2020 | Nishikawa | H01L 24/09 |
| 10,847,523 B1 * | 11/2020 | Yeh | H01L 27/11512 |
| 10,854,619 B2 * | 12/2020 | Chibvongodze | H01L 27/11575 |
| 11,011,209 B2 * | 5/2021 | Kim | H01L 27/11519 |
| 11,024,385 B2 * | 6/2021 | Chibvongodze | G11C 16/10 |
| 2019/0326322 A1 | 10/2019 | Tagami et al. | |
| 2020/0335513 A1 | 10/2020 | Morozumi et al. | |

* cited by examiner

SEMICONDUCTOR STORAGE DEVICE HAVING A MEMORY UNIT BONDED TO A CIRCUIT UNIT AND CONNECTED TO EACH OTHER BY A PLURALITY OF BONDING METALS

CROSS-REFERENCE TO RELATED APPLICATION

This application is based upon and claims the benefit of priority from Japanese Patent Application No. 2019-196382, filed Oct. 29, 2019, the entire contents of which are incorporated herein by reference.

FIELD

Embodiments described herein relate generally to a semiconductor storage device.

BACKGROUND

A NAND flash memory capable of storing data in a non-volatile manner is known.

DETAILED DESCRIPTION

Figure 1:
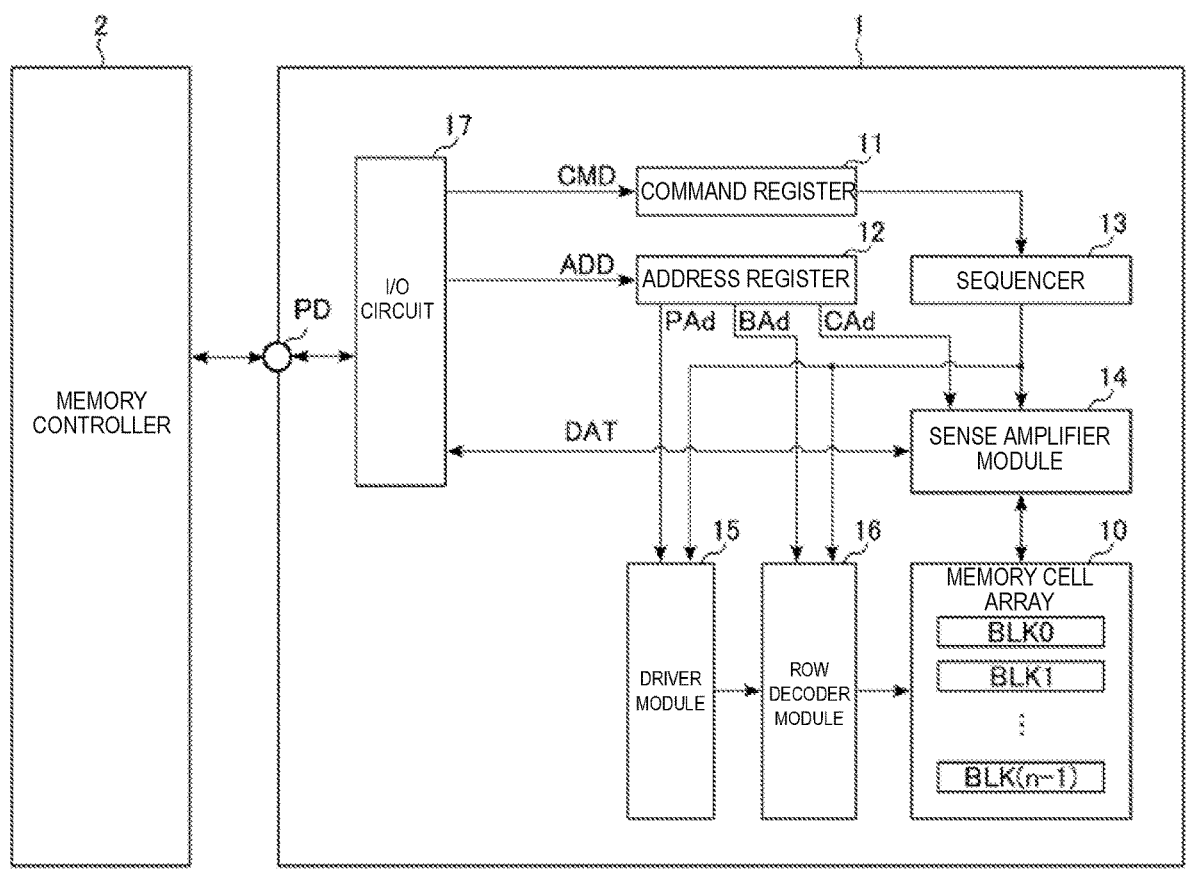
FIG. 1 is a block diagram showing a semiconductor storage device according to a first embodiment.

Embodiments provide a semiconductor storage device that is capable of reducing power consumption.

In general, according to one embodiment, the semiconductor storage device includes a memory unit and a circuit unit bonded to the memory unit. The memory unit includes first and second memory cells, first and second bit lines respectively connected to the first and second memory cells, and first and second bonding metals respectively connected to the first and second bit lines. The circuit unit includes a sense amplifier unit including a first wire, and a third bonding metal connected with the first wire and opposed to the first bonding metal, and a fourth bonding metal connected with the first wire and opposed to the second bonding metal.

Hereinafter, embodiments will be described with reference to drawings. The embodiments describe a device or a method for embodying a technical idea of the present disclosure. The drawings are schematic diagrams. Dimensions and ratios in the drawings are not necessarily the same as actual dimensions and ratios. The technical idea of the present disclosure is not limited by shapes, structures, arrangements, and the like of components described herein.

In the following description, components having substantially the same functions and configurations are denoted by the same reference numerals. Numbers or lowercase letters following capital letters that make up reference symbols are used to distinguish among elements that have similar configurations from each other. Similarly, letters following numerals that make up reference symbols are used to distinguish among elements that have similar configurations from each other. When there is no need to distinguish elements indicated by the same reference symbols from each other, the elements are referred to using only the reference symbols.

1. First Embodiment

A semiconductor storage device 1 according to the first embodiment is, for example, a NAND flash memory. Hereinafter, the semiconductor storage device 1 according to the first embodiment will be described.

1.1 Overall Configuration of Semiconductor Storage Device 1

FIG. 1 shows a configuration example of the semiconductor storage device 1 according to the first embodiment. As shown in FIG. 1, the semiconductor storage device 1 can be controlled by an external memory controller 2. The semiconductor storage device 1 includes a memory cell array 10, a command register 11, an address register 12, a sequencer 13, a sense amplifier module 14, a driver module 15, a row decoder module 16, an input and output circuit 17, an input and output pad PD and the like.

The memory cell array 10 includes a plurality of blocks BLK0 to BLK(n−1) (n is an integer equal to or larger than 1). One block BLK is a set of a plurality of memory cells capable of storing data in a non-volatile manner, and is used as an erase unit of data, or the like. The memory cell array 10 is provided with a plurality of bit lines and a plurality of word lines. Each memory cell is associated with, for example, one bit line and one word line.

The command register 11 stores a command CMD received from the memory controller 2 by the semiconductor storage device 1. The command CMD includes an instruction to cause the sequencer 13 to execute a read operation, a write operation, an erase operation, and the like.

The address register 12 stores address information ADD received from the memory controller 2 by the semiconductor storage device 1. The address information ADD includes a block address BAd, a page address PAd, a column address CAd, and the like. For example, the block address BAd, the page address PAd, and the column address CAd are respectively used to select a block BLK, a word line, and a bit line.

The sequencer 13 controls an entire operation of the semiconductor storage device 1. For example, based on the command CMD stored in the command register 11, the sequencer 13 controls the sense amplifier module 14, the driver module 15, the row decoder module 16, and the like to execute a read operation, a write operation, an erase operation, and the like.

In a write operation, the sense amplifier module 14 applies a predetermined voltage to each bit line according to write data DAT received from the memory controller 2. In a read operation, the sense amplifier module 14 determines data stored in a memory cell based on a voltage of a bit line, and transfers a determination result to the memory controller 2 as read data DAT.

The driver module 15 generates a voltage to be used in a read operation, a write operation, an erase operation, and the like. Then, based on the page address PAd stored in the address register 12, for example, the driver module applies the generated voltage to a signal line corresponding to a selected word line.

The row decoder module 16 selects one corresponding block BLK in the memory cell array 10 based on the block address BAd stored in the address register 12. Then, the row decoder module 16 transfers the voltage applied to the signal line corresponding to the selected word line to a selected word line in the selected block BLK.

The input and output circuit 17 receives the command CMD, the address information ADD, and the write data DAT from the memory controller 2 via the input and output pad PD, and sends them to the command register 11, the address register 12, and the sense amplifier module 14, respectively. In addition, the input and output circuit 17 receives the read data DAT from the sense amplifier module 14, and sends it to the memory controller 2 via the input and output pad PD. A plurality of (for example, 8) input and output pads PD may be provided.

The semiconductor storage device 1 and the memory controller 2 described above may be combined to form a single semiconductor device. Examples of such a semiconductor device include a memory card such as an SD™ card, a solid state drive (SSD), and the like.

Figure 2:
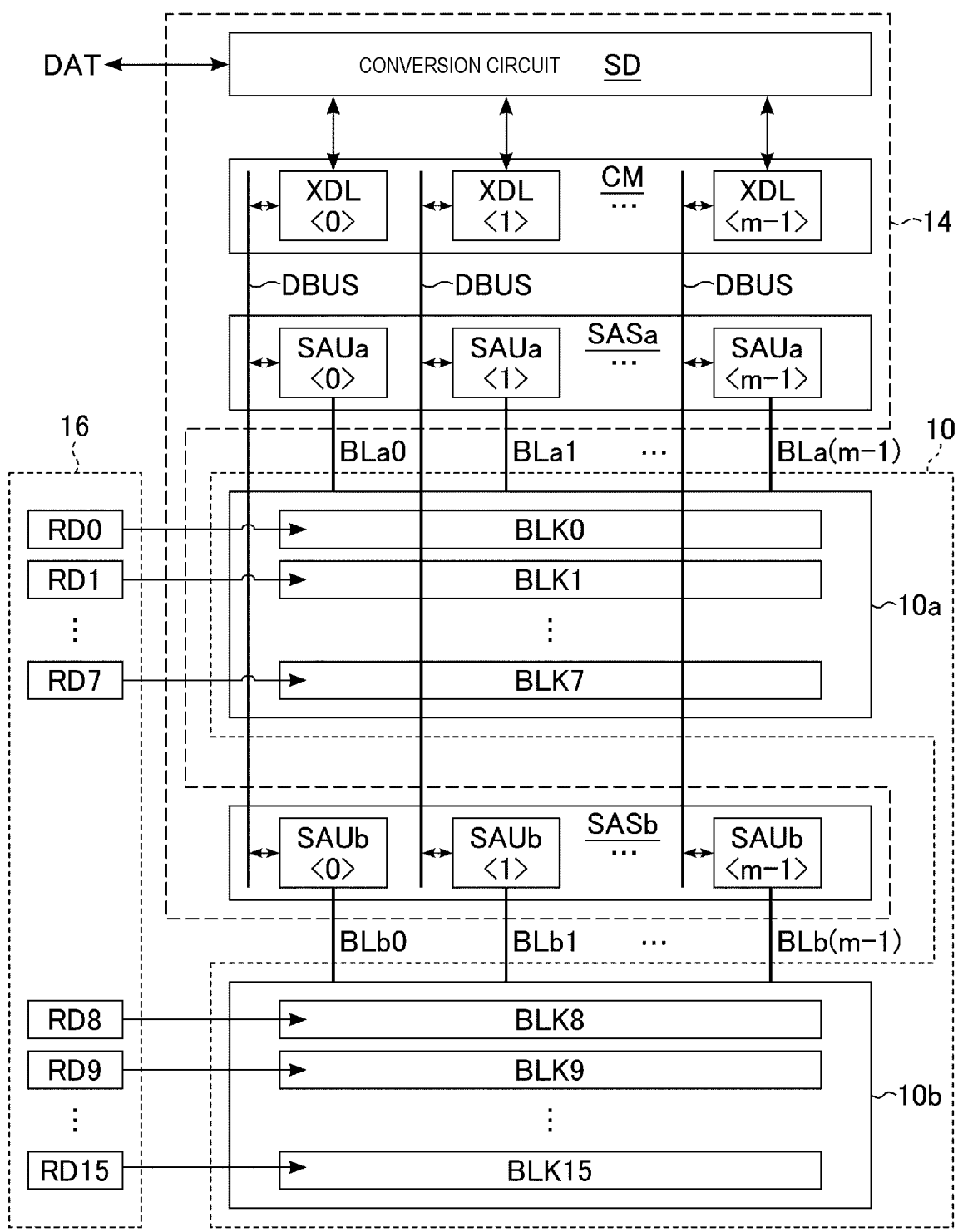
FIG. 2 is a detailed block diagram showing a memory cell array, a sense amplifier module, and a row decoder module provided in the semiconductor storage device according to the first embodiment.

FIG. 2 shows a more detailed configuration example of the memory cell array 10, the sense amplifier module 14, and the row decoder module 16 provided in the semiconductor storage device 1 according to the first embodiment. In the first embodiment, for example, the memory cell array 10 includes 16 blocks BLK. However, the number of blocks is not limited to 16, and the memory cell array 10 may have more blocks. In the first embodiment, for example, the semiconductor storage device 1 includes one plane. For example, a combination of the memory cell array 10, the sense amplifier module 14, and the row decoder module 16 may form a plane, and one block per plane may be accessible at one time. However, the number of plane(s) is not limited to 1, and the semiconductor storage device 1 may include two or more planes. As shown in FIG. 2, the memory cell array 10 is divided into, for example, a memory cell array 10*a* and a memory cell array 10*b*. The sense amplifier module includes sense amplifier sets SASa and SASb, a cache memory CM, and a conversion circuit SD.

The memory cell array 10*a* includes blocks BLK0 to BLK7. The memory cell array 10*b* includes blocks BLK8 to BLK15. The number of blocks BLK provided in each of the memory cell arrays 10*a* and 10*b* may be any other number. The number of blocks BLK provided in the memory cell array 10*a* and the number of blocks BLK provided in the memory cell array 10*b* may be the same, or may be different.

Bit lines BLa0 to BLa(m−1) (m is an integer equal to or larger than 1) are connected to the memory cell array 10*a*. Bit lines BLb0 to BLb(m−1) are connected to the memory cell array 10*b*. In this manner, for example, the same number of bit lines BL are connected to each of the memory cell arrays 10*a* and 10*b*. The bit lines BLa and BLb denoted by the same reference numeral may be one bit line BL that is a wire divided into two portions corresponding to the memory cell arrays 10*a* and 10*b*. The bit lines BLa and BLb denoted by the same reference numeral are associated with, for example, the same column address CAd.

The sense amplifier sets SASa and SASb are respectively associated with the memory cell arrays 10*a* and 10*b*. The sense amplifier set SASa includes sense amplifier units SAUa<0> to SAUa<m−1>. The sense amplifier set SASb includes sense amplifier units SAUb<0> to SAUb<m−1>. Each sense amplifier unit SAU is connected to at least one bit line BL. For example, the sense amplifier units SAUa<0> to SAUa<m−1> are respectively connected to the bit lines BLa0 to BLa(m−1). The sense amplifier units SAUb<0> to SAUb<m−1> are respectively connected to the bit lines BLb0 to BLb(m−1).

The cache memory CM includes latch circuits XDL<0> to XDL<m−1>. Each of the latch circuits XDL temporarily stores read data, write data, and the like, and is connected to a set including the sense amplifier units SAUa and SAUb via a different bus DBUS. Specifically, the latch circuit XDL<0> is connected to the sense amplifier units SAUa<0> and SAUb<0>. The latch circuit XDL<1> is connected to the sense amplifier units SAUa<1> and SAUb<1>. Similarly, the latch circuit XDL<m−1> is connected to the sense amplifier units SAUa<m−1> and SAUb<m−1>.

The conversion circuit SD is a parallel-to-serial conversion circuit. Specifically, the conversion circuit SD serially transfers data DAT received parallelly from the cache memory CM to the input and output circuit 17 of the semiconductor storage device 1. Alternatively, the conversion circuit SD parallelly transfers data DAT serially transferred from the input and output circuit 17 to the cache memory CM. The conversion circuit SD may have a function of storing information associated with the column address CAd. Such information may be allocated to each of the bit lines BLa and BLb.

The row decoder module 16 includes row decoders RD0 to RD15 the number of which is the same as the number of the blocks BLK. The row decoders RD0 to RD15 are respectively associated with the blocks BLK0 to BLK15. Each row decoder RD has a function of decoding the block address BAd. Then, a row decoder RD corresponding to a selected block BLK applies a voltage to a wire in an associated block BLK.

1.2 Circuit Configuration of Semiconductor Storage Device 1

1.2.1 Circuit Configuration of Memory Cell Array 10

Figure 3:
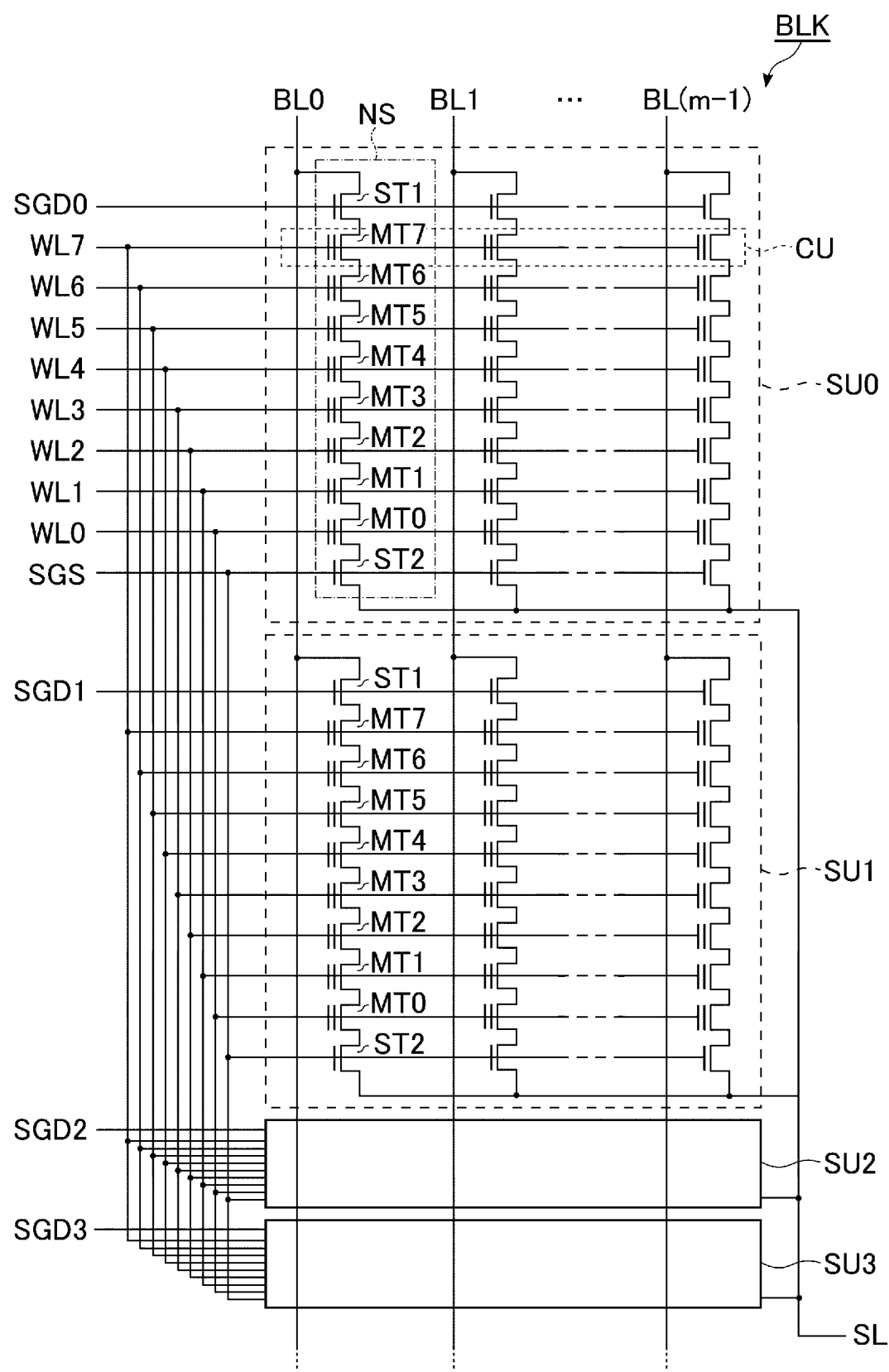
FIG. 3 is a circuit diagram showing an example of a circuit configuration of the memory cell array provided in the semiconductor storage device according to the first embodiment.

FIG. 3 shows an example of a circuit configuration of the memory cell array 10 provided in the semiconductor storage device 1 according to the first embodiment. Among a plurality of blocks BLK provided in the memory cell array 10, one block BLK is extracted and shown in FIG. 3. As shown in FIG. 3, the block BLK includes, for example, four string units SU0 to SU3.

A string unit SU includes a plurality of NAND strings NS that are respectively associated with the bit lines BL0 to BL(m−1). Each NAND string NS includes, for example, memory cell transistors MT0 to MT7 and select transistors ST1 and ST2. A memory cell transistor MT includes a control gate and a charge storage layer and stores data in a non-volatile manner. The select transistors ST1 and ST2 are used to select the string unit SU during various operations.

In each NAND string NS, the memory cell transistors MT0 to MT7 are connected in series. A drain of the select transistor ST1 is connected to an associated bit line BL. A source of the select transistor ST1 is connected to one end of the memory cell transistors MT0 to MT7 that are connected in series. A drain of the select transistor ST2 is connected to the other end of the memory cell transistors MT0 to MT7 that are connected in series. A source of the select transistor ST2 is connected to a source line SL.

In the same block BLK, control gates of the memory cell transistors MT0 to MT7 are commonly connected to respective word lines WL0 to WL7. Gates of the select transistors ST1 in the string units SU0 to SU3 are respectively connected to select gate lines SGD0 to SGD3. Gates of the select transistors ST2 provided in the same block BLK are commonly connected to a select gate line SGS.

A different column address is allocated to each of the bit lines BL0 to BL(m−1). The bit line BLa is shared by NAND strings NS to which the same column address is allocated in a plurality of blocks BLK provided in the memory cell array 10a. The bit line BLb is shared by NAND strings NS to which the same column address is allocated in a plurality of blocks BLK provided in the memory cell array 10b. The word lines WL0 to WL7 are provided on a per block BLK basis. The source line SL is shared by the plurality of blocks BLK.

A set including a plurality of memory cell transistors MT connected to a common word line WL in one string unit SU is referred to as a cell unit CU. For example, a storage capacity of the cell unit CU including the memory cell transistors MT that each store one-bit data is defined as "one page data". The cell unit CU may have a storage capacity equal to or larger than two page data corresponding to the number of bits of data stored in the memory cell transistors MT.

The circuit configuration of the memory cell array 10 provided in the semiconductor storage device 1 according to the first embodiment is not limited to the configuration described above. For example, the number of string units SU provided in the blocks BLK, the number of memory cell transistors MT and the number of select transistors ST1 and ST2 that are provided in each NAND string NS may be any number.

1.2.2 Circuit Configuration of Sense Amplifier Module 14

Figure 4:
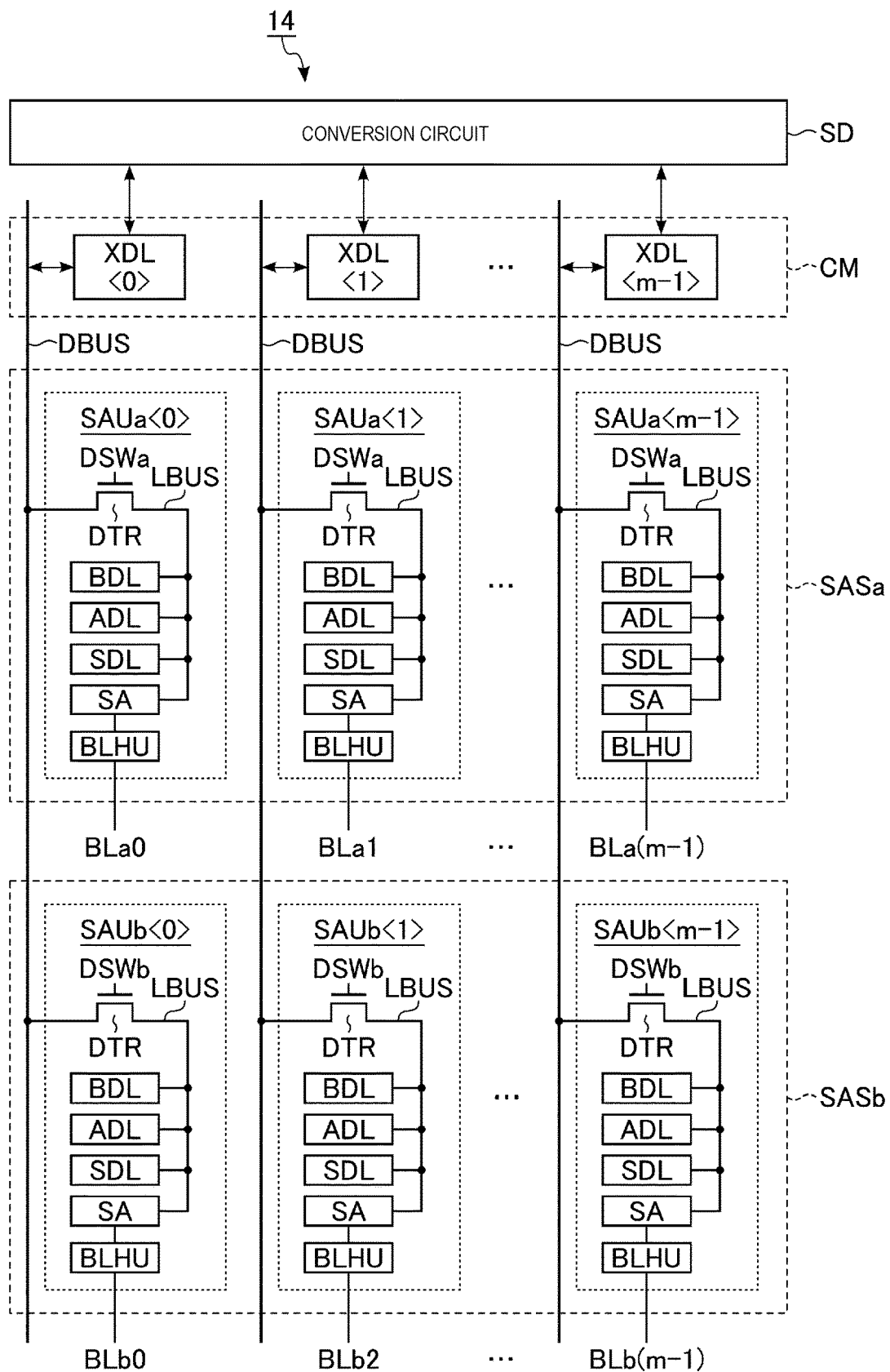
FIG. 4 is a circuit diagram showing an example of a circuit configuration of the sense amplifier module provided in the semiconductor storage device according to the first embodiment.

FIG. 4 shows an example of a circuit configuration of the sense amplifier module 14 provided in the semiconductor storage device 1 according to the first embodiment, and shows a detailed circuit configuration of the sense amplifier units SAUa and SAUb. As shown in FIG. 4, each sense amplifier unit SAU includes a bit line connection unit BLHU, a sense amplifier SA, latch circuits SDL, ADL, and BDL, a bus LBUS, a transistor DTR, and the like. Hereinafter, a circuit configuration of the sense amplifier units SAU will be described focusing on one sense amplifier unit SAU.

The bit line connection unit BLHU includes a transistor having a high breakdown voltage and is connected between an associated bit line BL and the sense amplifier SA. In a read operation, the sense amplifier SA determines, for example, whether read data is "0" or "1" based on a voltage of the associated bit line BL. In other words, the sense amplifier SA senses data read out to the associated bit line BL and determines data stored in a selected memory cell.

Each of the latch circuits SDL, ADL, and BDL temporarily stores read data, write data, and the like. The sense amplifier SA can change the voltage applied to the bit line BL based on data stored in the latch circuit SDL. The bus LBUS is connected to the sense amplifier SA and the latch circuits SDL, ADL, and BDL. The sense amplifier SA and the latch circuits SDL, ADL, and BDL can transmit and receive data to and from each other via the bus LBUS.

The transistor DTR is connected between the bus LBUS and a bus DBUS. A control signal DSWa is input into a gate of the transistor DTR in the sense amplifier unit SAUa. A control signal DSWb is input into a gate of the transistor DTR in the sense amplifier unit SAUb. The sequencer 13 can electrically connect either the sense amplifier unit SAUa or the sense amplifier unit SAUb with the latch circuit XDL by controlling one of the control signals DSWa and DSWb to an "H" level and the other one to an "L" level.

Figure 5:
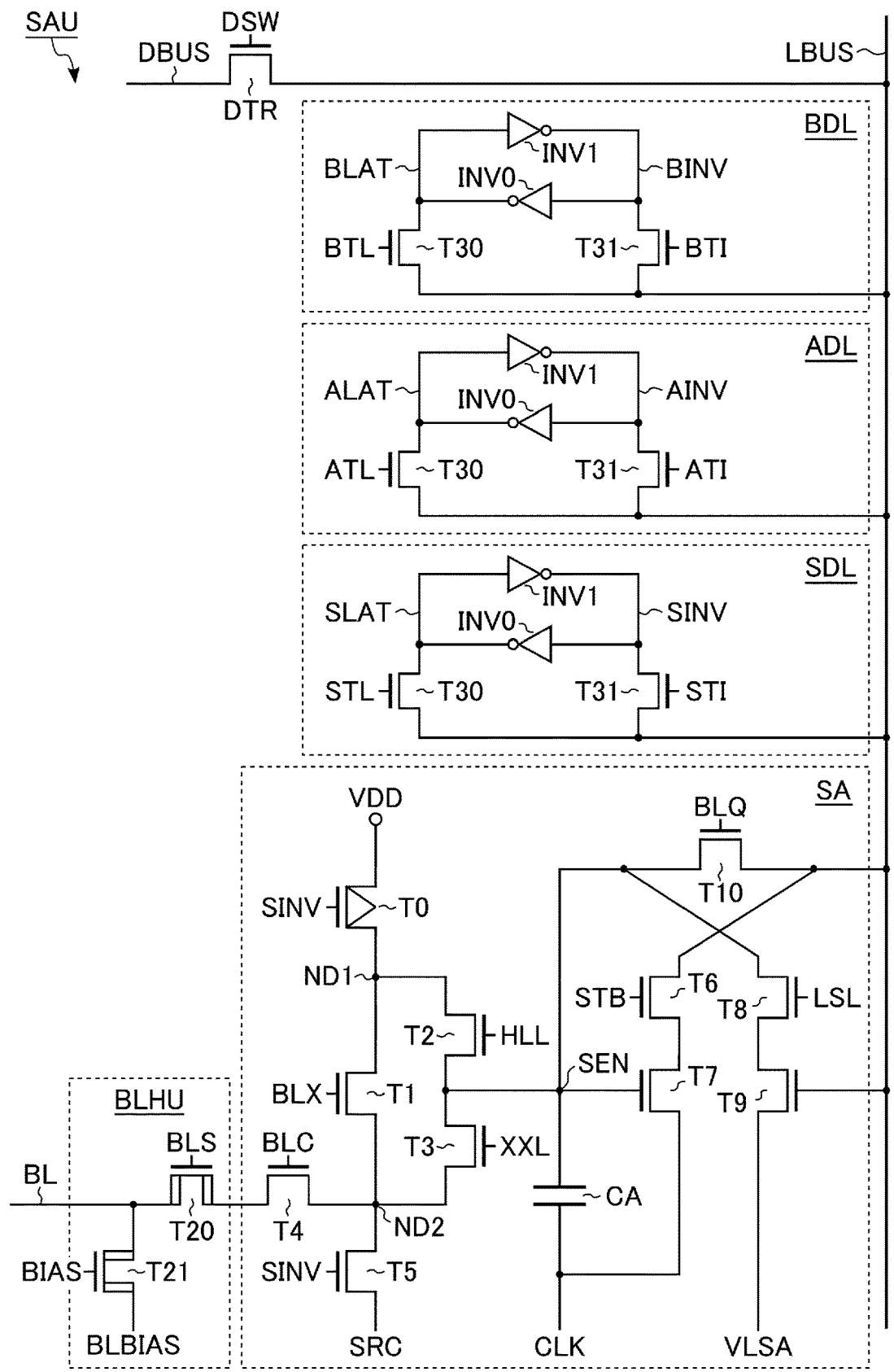
FIG. 5 is a circuit diagram showing an example of a circuit configuration of a sense amplifier unit in the semiconductor storage device according to the first embodiment.

FIG. 5 shows an example of a more detailed circuit configuration of the sense amplifier unit SAU in the semiconductor storage device 1 according to the first embodiment. As shown in FIG. 5, the sense amplifier SA includes transistors T0 to T10, a capacitor CA and the like. The bit line connection unit BLHU includes transistors T20 and T21. The latch circuits SDL, ADL, and BDL have similar configurations. For example, each of the latch circuits SDL, ADL, and BDL includes transistors T30 and T31 and inverters INV0 and INV1.

The transistor T0 is a P-type MOS transistor. The transistors T1 to T10, T20, T21, T30, and T31 are N-type MOS transistors. Breakdown voltages of the transistors T20 and T21 are higher than breakdown voltages of the transistors T1 to T10. Hereinafter, the transistors T0 to T10 are referred to as transistors having low breakdown voltages, and the transistors T20 and T21 are referred to as transistors having high breakdown voltages.

(Connection Relationship of Elements in Sense Amplifier SA)

A source of the transistor T0 is connected to a power supply line. A drain of the transistor T0 is connected to a node ND1. A gate of the transistor T0 is connected to a node SINV. A drain of the transistor T1 is connected to the node ND1. A source of the transistor T1 is connected to a node ND2. A control signal BLX is input into a gate of the transistor T1. A drain of the transistor T2 is connected to the node ND1. A source of the transistor T2 is connected to a node SEN. A control signal HLL is input into a gate of the transistor T2. A drain of the transistor T3 is connected to the node SEN. A source of the transistor T3 is connected to the node ND2. A control signal XXL is input into a gate of the transistor T3.

A drain of the transistor T4 is connected to the node ND2. A control signal BLC is input into a gate of the transistor T4. A drain of the transistor T5 is connected to the node ND2. A source of the transistor T5 is connected to a node SRC. A gate of the transistor T5 is connected to a node SINV. A drain of the transistor T6 is connected to a bus LBUS. A control signal STB is input into a gate of the transistor T6. A drain of the transistor T7 is connected to a source of the transistor T6. A source of the transistor T7 is connected to a node CLK. A gate of the transistor T7 is connected to the node SEN.

A drain of the transistor T8 is connected to the node SEN. A control signal LSL is input into a gate of the transistor T8. A drain of the transistor T9 is connected to a source of the transistor T8. A source of the transistor T9 is connected to a node VLSA. A gate of the transistor T9 is connected to the bus LBUS. A drain of the transistor T10 is connected to the bus LBUS. A source of the transistor T10 is connected to the node SEN. A control signal BLQ is input into a gate of the transistor T10. One electrode of the capacitor CA is connected to the node SEN. The other electrode of the capacitor CA is connected to the node CLK. A clock signal, for example, is input into the node CLK.

(Connection Relationship of Elements in Bit Line Connection Unit BLHU)

A drain of the transistor T20 is connected to the source of the transistor T4. A source of the transistor T20 is connected to an associated bit line BL. A control signal BLS is input into a gate of the transistor T20. A drain of the transistor T21 is connected to a node BLBIAS. A source of the transistor T21 is connected to the associated bit line BL. A control signal BIAS is input into a gate of the transistor T21.

(Connection Relationship of Elements in Latch Circuits SDL, ADL, and BDL)

A drain of the transistor T30 is connected to the bus LBUS. A source of the transistor T30 is connected to an output node of the inverter INV0 and an input node of the inverter INV1. A drain of the transistor T31 is connected to the bus LBUS. A source of the transistor T31 is connected to an input node of the inverter INV0 and an output node of the inverter INV1. Control signals STL and STI are respectively input into gates of the transistors T30 and T31 in the latch circuit SDL. Control signals ATL and ATI are respectively input into gates of the transistors T30 and T31 in the latch circuit ADL. Control signals BTL and BTI are respectively input into gates of the transistors T30 and T31 in the latch circuit BDL.

An input node and an output node of the inverter INV0 in the latch circuit SDL respectively correspond to nodes SINV and SLAT. An input node and an output node of the inverter INV0 in the latch circuit ADL respectively correspond to nodes AINV and ALAT. An input node and an output node of the inverter INV0 in the latch circuit BDL respectively correspond to nodes BINV and BLAT.

In the circuit configuration of the sense amplifier unit SAU described above, a power supply voltage VDD, for example, is applied to the power supply line connected to the source of the transistor T0. A ground voltage VSS, for example, is applied to each of the nodes SRC, CLK, and VLSA. An erase voltage VERA, for example, is applied to the node BLBIAS. A voltage of the node SINV is changed based on data stored in the latch circuit SDL. Control signals BLX, HLL, XXL, BLC, STB, LSL, BLQ, BLS, BIAS, STL, STI, ATL, ATI, BTL, and BTI are generated by, for example, the sequencer 13. In a read operation, the sense amplifier SA determines data read out to the bit line BL based on timing when, for example, the control signal STB is asserted.

The sense amplifier module 14 provided in the semiconductor storage device 1 according to the first embodiment is not limited to the circuit configuration described above. For example, the number of latch circuits provided in each sense amplifier unit SAU can be appropriately changed based on the number of pages stored in one cell unit CU. The sense amplifier SA may have other circuit configurations as long as the sense amplifier SA can determine data read out to the bit line BL. The transistor T21 may be omitted in the bit line connection unit BLHU. The sense amplifier module 14 may further include a plurality of transistors capable of charging the buses LBUS and DBUS and the like.

1.2.3 Circuit Configuration of Row Decoder Module 16

Figure 6:
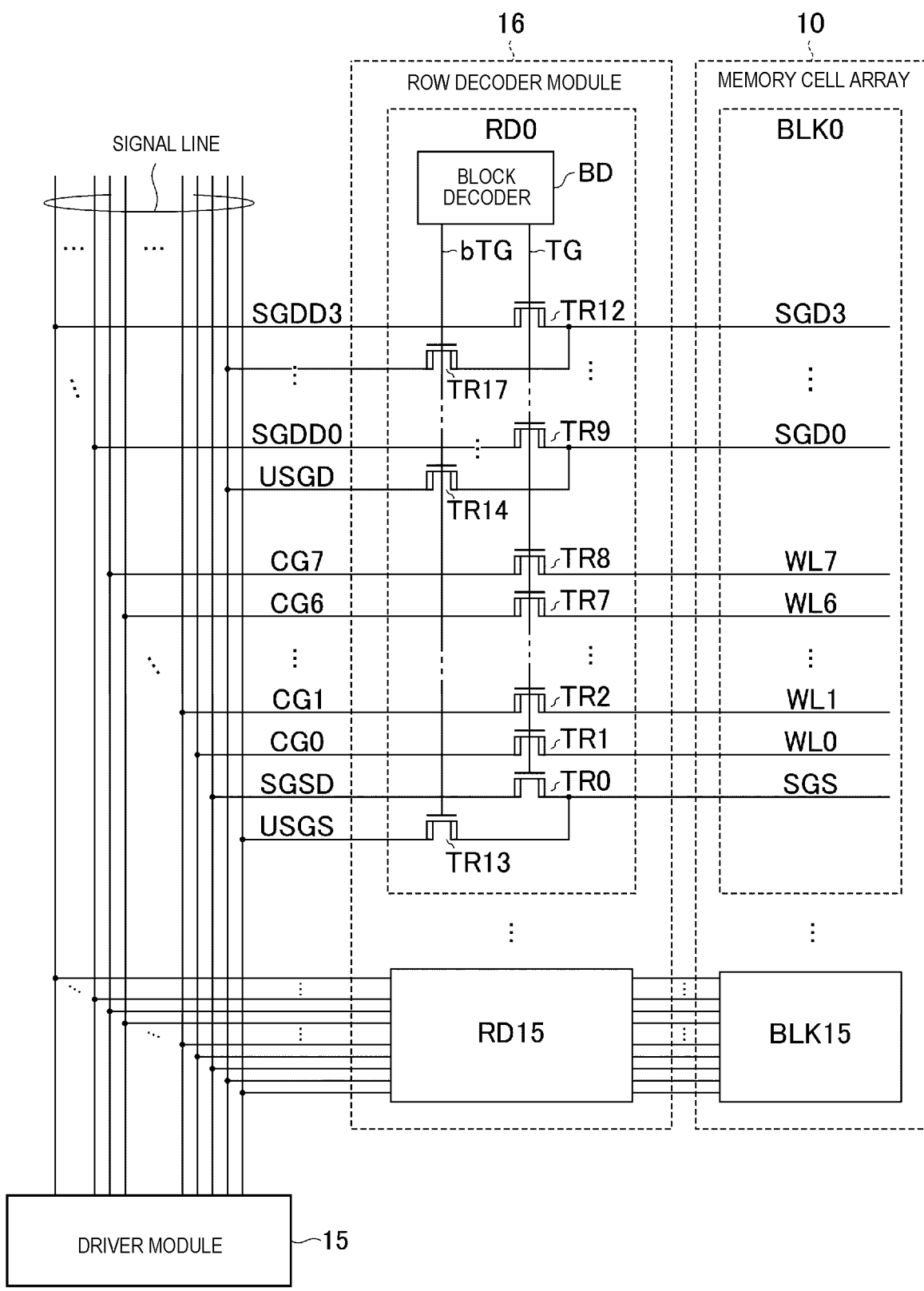
FIG. 6 is a circuit diagram showing an example of a circuit configuration of the row decoder module provided in the semiconductor storage device according to the first embodiment.

FIG. 6 shows an example of a circuit configuration of the row decoder module 16 provided in the semiconductor storage device 1 according to the first embodiment, and shows a detailed circuit configuration of the row decoder RD0. Other row decoders RD have the same circuit configuration as the row decoder RD0. As shown in FIG. 6, each row decoder RD includes a block decoder BD, transfer gate lines TG and bTG, transistors TR0 to TR17, and the like.

The block decoder BD decodes a block address BAd. The block decoder BD applies a predetermined voltage to each of the transfer gate lines TG and bTG based on a decoding result. Specifically, the block decoder BD applies, to the transfer gate line bTG, a signal inverted from a signal applied to the transfer gate line TG. That is, a voltage applied to the transfer gate line TG and a voltage applied to the transfer gate line bTG have a complementary relationship.

The transistors TR0 to TR17 are N-type MOS transistors having a high breakdown voltage. Gates of the transistors TR0 to TR12 are commonly connected to the transfer gate line TG. Gates of the transistors TR13 to TR17 are commonly connected to the transfer gate line bTG. That is, the transistors TR are controlled by the block decoder BD. The transistors TR are connected to the driver module 15 via a signal line shared among blocks BLK.

A drain of the transistor TR0 is connected to a signal line SGSD. The signal line SGSD is shared among the plurality of blocks BLK and is used as a global transfer gate line corresponding to a selected block BLK. A source of the transistor TR0 is connected to a select gate line SGS. The select gate line SGS is used as a local transfer gate line provided on a per block basis.

Drains of the transistors TR1 to TR8 are respectively connected to signal lines CG0 to CG7. Each of the signal lines CG0 to CG7 is used as a global word line shared among the plurality of blocks BLK. Sources of the transistors TR1 to TR8 are respectively connected to the word lines WL0 to WL7. Each of the word lines WL0 to WL7 is used as a local word line provided on a per block basis.

Drains of the transistors TR9 to TR12 are respectively connected to signal lines SGDD0 to SGDD3. Each of the signal lines SGDD0 to SGDD3 is shared among the plurality of blocks BLK and is used as a global transfer gate line corresponding to a selected block BLK. Sources of the transistors TR9 to TR12 are respectively connected to select gate lines SGD0 to SGD3. Each of the select gate lines SGD0 to SGD3 is used as a local transfer gate line provided on a per block basis.

A drain of the transistor TR13 is connected to a signal line USGS. A source of the transistor TR13 is connected to the select gate line SGS. Drains of the transistors TR14 to TR17 are commonly connected to a signal line USGD. Sources of the transistors TR14 to TR17 are respectively connected to the select gate lines SGD0 to SGD3. Each of the signal lines USGS and USGD is shared among the plurality of blocks BLK and is used as a global transfer gate line corresponding to a non-selected block BLK.

With the above configuration, the row decoder module 16 can select a block BLK. Briefly, during various types of operations, a block decoder BD corresponding to a selected block BLK respectively applies voltages of an "H" level and an "L" level to the transfer gate lines TG and bTG, and a block decoder BD corresponding to a non-selected block BLK respectively applies voltages of an "L" level and an "H" level to the transfer gate lines TG and bTG.

The row decoder module 16 provided in the semiconductor storage device 1 according to the first embodiment is not limited to the circuit configuration described above. For example, the number of transistors TR provided in the row decoder module 16 may be appropriately changed based on the number of memory cell transistors, select transistors, and the like provided in each block BLK.

1.3 Structure of Semiconductor Storage Device 1

Hereinafter, an example of a structure of the semiconductor storage device 1 according to the first embodiment will be described. In the following reference drawings, an X direction corresponds to an extending direction of a word line WL, a Y direction corresponds to an extending direction of a bit line BL, and a Z direction corresponds to a vertical direction with respect to a surface of a semiconductor substrate used for forming the semiconductor storage device 1. Hatching is appropriately added in a plan view for easy understanding of the drawings. The hatching added in the plan view is not necessarily associated with a material or a characteristic of a component indicated by hatching. In a plan view and a cross-sectional view, a wire, a contact, an interlayer insulation film, and the like are omitted as appropriate for easier understanding of the drawings.

1.3.1 Overall Structure of Semiconductor Storage Device

Figure 7:
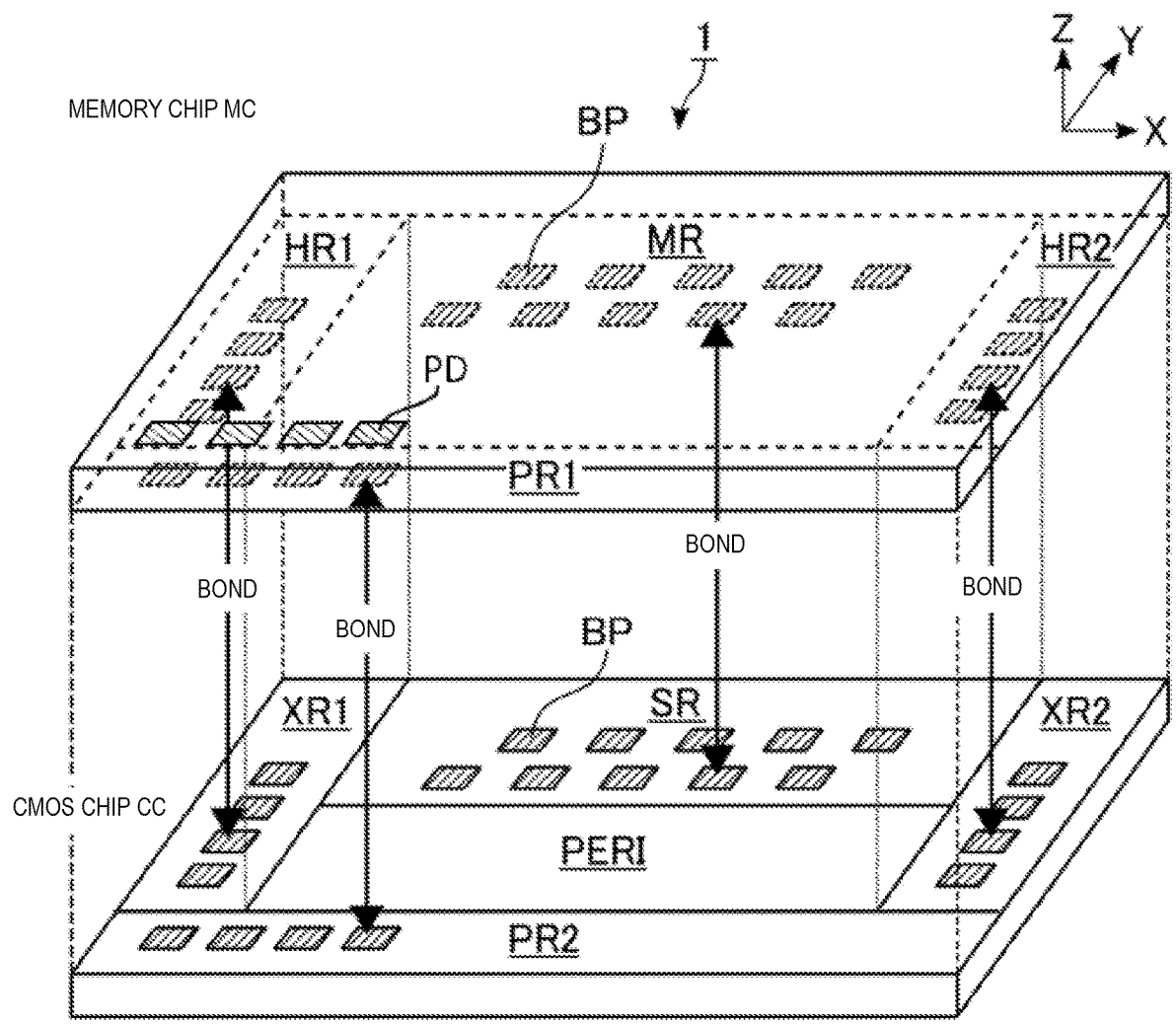
FIG. 7 is a perspective view showing an example of a structure of the semiconductor storage device according to the first embodiment.

FIG. 7 shows an example of an overall structure of the semiconductor storage device 1 according to the first embodiment. As shown in FIG. 7, the semiconductor storage device 1 includes a memory chip MC and a CMOS chip CC, and has a structure in which, for example, a lower surface of the memory chip MC and an upper surface of the CMOS chip CC are bonded together. The memory chip MC includes a structure corresponding to the memory cell array 10. The CMOS chip CC includes structures corresponding to the command register 11, the address register 12, the sequencer 13, the sense amplifier module 14, the driver module 15, the row decoder module 16, and the like.

A region of the memory chip MC is divided into a memory region MR, lead-out regions HR1 and HR2, a pad region PR1, and the like. The memory region MR occupies most of the memory chip MC and is used to store data. For example, the memory region MR includes a plurality of NAND strings NS. The lead-out regions HR1 and HR2 sandwich the memory region MR in the X direction. The lead-out regions HR1 and HR2 are used to connect stacked wires in the memory chip MC and the row decoder module 16 in the CMOS chip CC. The pad region PR1 is adjacent to the memory region MR and the lead-out regions HR1 and HR2 in the Y direction. The pad region PR1 includes, for example, the input and output pad PD for connection with the external memory controller 2.

The memory chip MC includes a plurality of bonding pads BP on respective lower surfaces of the memory region MR, the lead-out regions HR1 and HR2, and the pad region PR1. The bonding pads BP are also referred to as, for example, bonding metals. The bonding pads BP in the memory region MR are connected to an associated bit line BL. The bonding pads BP in a lead-out region HR are connected to an associated wire (such as a word line WL) among stacked wires provided in the memory region MR. The bonding pads BP in the pad region PR1 are connected to input and output pads PD provided on the upper surface of the memory chip MC. The input and output pads PD provided on the memory chip MC is used to, for example, connect the semiconductor storage device 1 and the memory controller 2.

A region of the CMOS chip CC is divided into a sense amplifier region SR, a peripheral circuit region PERI, transfer regions XR1 and XR2, a pad region PR2, and the like. The sense amplifier region SR and the peripheral circuit region PERI in the CMOS chip CC are adjacent to each other in the Y direction and overlap with the memory region MR in the memory chip MC as viewed from the Z direction. The sense amplifier region SR includes the sense amplifier module 14. The peripheral circuit region PERI includes the sequencer 13 and the like. The transfer regions XR1 and XR2 in the CMOS chip CC sandwich the sense amplifier region SR and the peripheral circuit region PERI in the X direction, and respectively overlap with the lead-out regions HR1 and HR2 in the memory chip MC as viewed from the Z direction. The transfer regions XR1 and XR2 include a plurality of transistors TR in the row decoder module 16. The pad region PR2 in the CMOS chip CC overlaps with the pad region PR1 in the memory chip MC as viewed from the Z direction. The pad region PR2 includes the input and output circuit 17 and the like of the semiconductor storage device 1.

The CMOS chip CC includes a plurality of bonding pads BP on respective upper surfaces of the sense amplifier region SR, the peripheral circuit region PERI, the transfer regions XR1 and XR2, and the pad region PR2. A plurality of bonding pads BP in the sense amplifier region SR overlap with a plurality of bonding pads BP in the memory region MR. A plurality of bonding pads BP in the transfer region XR1 respectively overlap with a plurality of bonding pads BP in the lead-out region HR1. A plurality of bonding pads BP in the transfer region XR2 overlap with a plurality of bonding pads BP in the lead-out region HR2. A plurality of bonding pads BP in the pad region PR1 overlap with a plurality of bonding pads BP in the pad region PR2.

Of the plurality of bonding pads BP provided in the semiconductor storage device 1, two bonding pads BP facing each other on the memory chip MC and the CMOS chip CC are bonded together (indicated as "bond" in FIG. 7). Accordingly, a circuit in the memory chip MC and a circuit in the CMOS chip CC are electrically connected. The bonding pad BP on the memory chip MC and the bonding pad BP on the CMOS chip CC may be in contact with each other directly or via a conductive adhesive etc. such that two facing bonding pads BP form a boundary therebetween. Alternatively, the bonding pad BP on the memory chip MC and the bonding pad BP on the CMOS chip CC may be welded (integrated) into one piece.

The semiconductor storage device 1 according to the first embodiment is not limited to the structure described above. For example, at least one lead-out region HR adjacent to the memory region MR may be provided. The semiconductor storage device 1 may include a plurality of sets, each including a memory region MR and a lead-out region HR. In this case, a set including the sense amplifier region SR, the transfer region XR, and the peripheral circuit region PERI is appropriately provided corresponding to an arrangement of the memory region MR and the lead-out region HR. Arrangements of the memory chip MC and the CMOS chip CC may be reversed. In this case, bonding pads BP provided on an upper surface of the memory chip MC and bonding pads BP provided on a lower surface of the CMOS chip CC are bonded together, and the input and output pad PD for connecting with the external memory controller 2 is provided on the upper surface of the CMOS chip CC.

1.3.2 Structure of Memory Chip MC (Planar Layout of Memory Chip MC)

Figure 8:
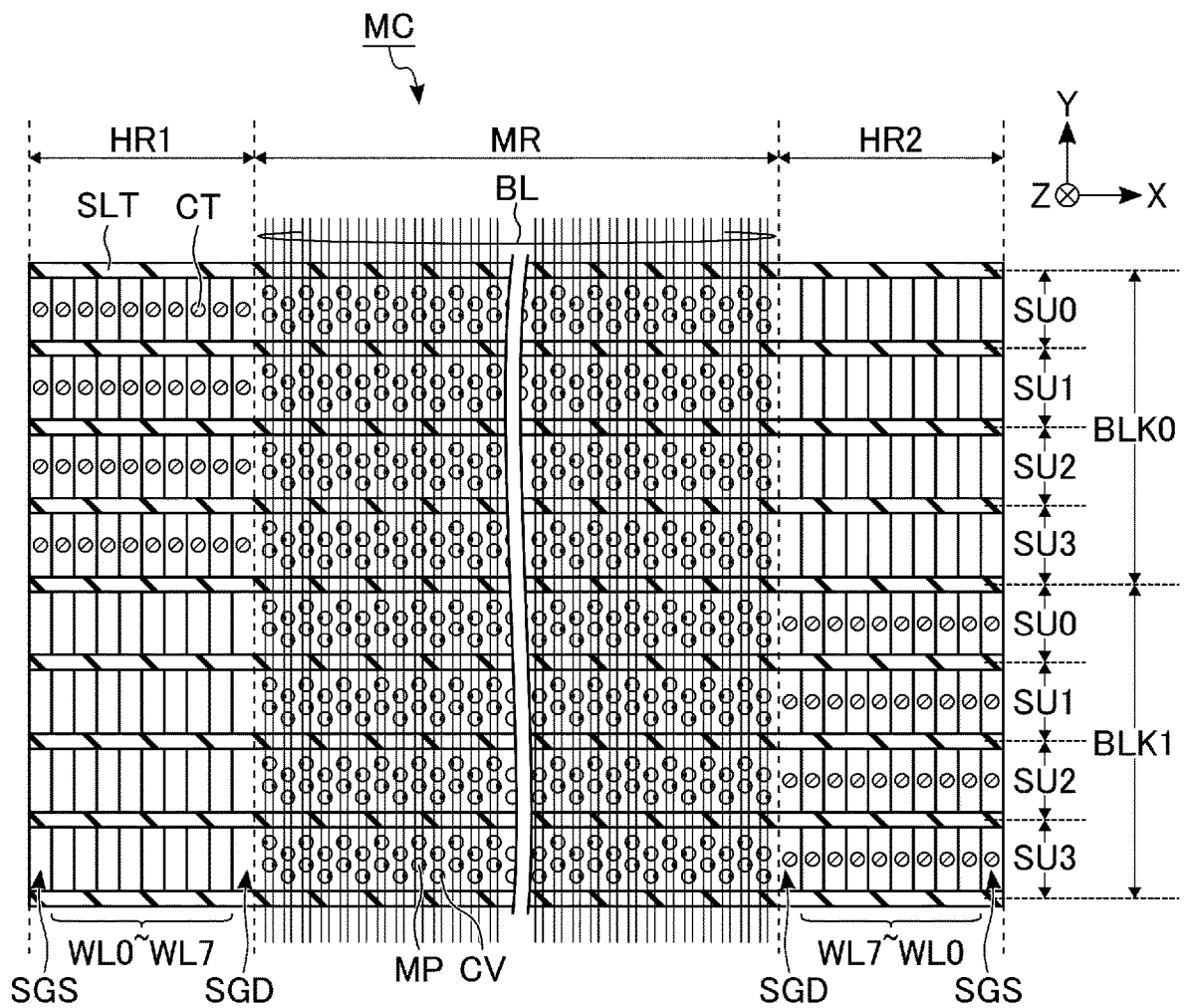
FIG. 8 is a plan view showing an example of a planar layout of a memory chip provided in the semiconductor storage device according to the first embodiment.

FIG. 8 shows an example of a planar layout of the memory chip MC provided in the semiconductor storage device 1 according to the first embodiment. Regions corresponding to the blocks BLK0 and BLK1 are extracted and shown in FIG. 8. As shown in FIG. 8, the memory chip MC includes a plurality of slits SLT, a plurality of memory pillars MP, a plurality of bit lines BL, and a plurality of contacts CT and CV.

The plurality of slits SLT are arranged in the Y direction. Each slit SLT extends in the X direction and crosses the memory region MR and the lead-out regions HR1 and HR2. Each slit SLT divides and insulates conductor layers that are adjacent to the slit SLT. Specifically, the slit SLT divides and insulates a plurality of wire layers respectively corresponding to the word lines WL0 to WL7 and the select gate lines SGD and SGS.

Each of the memory pillars MP functions as, for example, a NAND string NS. The plurality of memory pillars MP are arranged, for example, in a staggered pattern in four rows in a region between adjacent slits SLT in the memory region MR. In the present example, each of regions partitioned by the slits SLT corresponds to a string unit SU. The number and arrangement of the memory pillars MP between adjacent slits SLT may be appropriately changed. Slits SLT interposed between slits SLT provided at a boundary portion of blocks BLK may divide at least the select gate line SGD.

The plurality of bit lines BL separately extend in the Y direction and are arranged in the X direction. Each bit line BL overlaps with at least one memory pillar MP in each string unit SU as viewed from the Z direction. In the present example, two bit lines BL overlap with one memory pillar MP. A contact CV is provided between one of the plurality of bit lines BL that overlaps with a memory pillar MP and the memory pillar MP. Each memory pillar MP is connected to an associated bit line BL via a contact CV.

In each of the lead-out regions HR1 and HR2, each of the select gate line SGS, the word lines WL0 to WL7, and the select gate line SGD has a portion (a terrace portion) that does not overlap with a wire layer (a conductor layer) of an upper layer. A shape of the portion that does not overlap with a wire layer of an upper layer in each of the lead-out regions HR1 and HR2 is similar to a step shape, a terrace shape, a rimstone shape, or the like. Specifically, steps are provided between the select gate line SGS and the word line WL0, between the word line WL0 and the word line WL1 . . . between the word line WL6 and the word line WL7, and between the word line WL7 and the select gate line SGD.

Each contact CT is used to connect each of the word lines WL0 to WL7 and the select gate lines SGS and SGD with the row decoder module 16. Each contact CT is provided on a terrace portion of any one of the word lines WL0 to WL7 and the select gate lines SGS and SGD. The word lines WL and the select gate lines SGS that are used as common wires in the same block BLK are electrically connected to each other via a wire layer connected to contacts CT.

For example, contacts CT associated with the block BLK0 are provided in the lead-out region HR1, and contacts CT associated with the block BLK1 are provided in the lead-out region HR2. In other words, for example, even-numbered blocks BLK are connected to the row decoder module 16 via contacts CT in the lead-out region HR1, and odd-numbered blocks BLK are connected to the row decoder module 16 via contacts CT in the lead-out region HR2.

The planar layout of the memory chip MC described above is repeated in the Y direction in the memory region MR and the lead-out regions HR1 and HR2. An arrangement of the contacts CT in each block BLK is not limited to the layout described above. For example, when one of the lead-out regions HR is omitted, contacts CT corresponding to each block BLK are all provided in the other lead-out region HR that is in contact with the memory region MR. The contacts CT may be provided at two sides in the lead-out regions HR1 and HR2, and a voltage may be applied from two sides of each block BLK. In addition, the lead-out region HR may be interposed between the memory regions MR.

Figure 9:
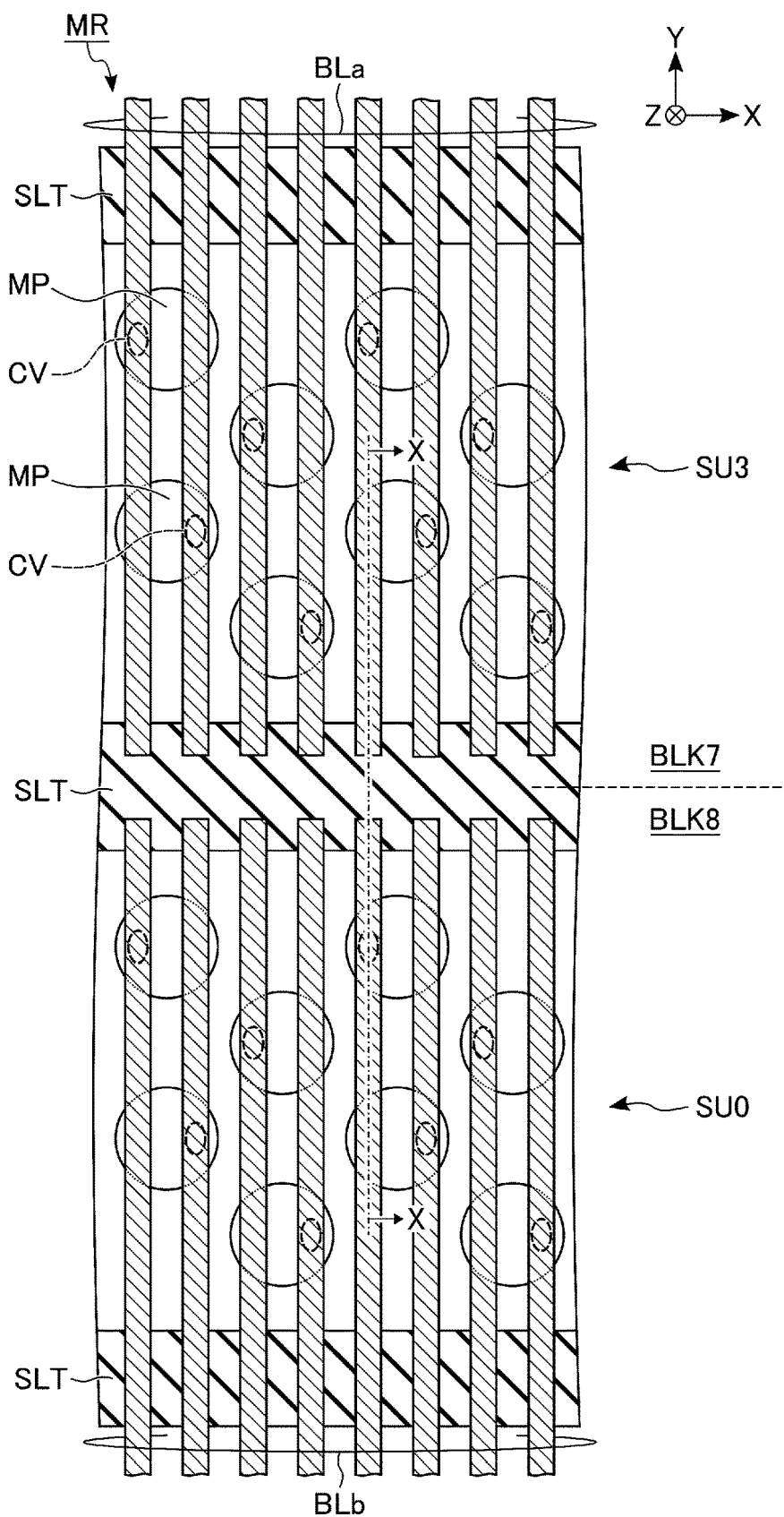
FIG. 9 is a plan view showing an example of a planar layout of a memory region in the memory chip provided in the semiconductor storage device according to the first embodiment.

The bit lines BL extending in the Y direction are divided into two sets in the semiconductor storage device 1 according to the first embodiment. FIG. 9 shows an example of a planar layout of the memory region MR in the memory chip MC provided in the semiconductor storage device 1 according to the first embodiment. A region corresponding to a boundary portion between the memory cell arrays 10$a$ and 10$b$ is extracted and shown in FIG. 9. Specifically, FIG. 9 shows a region including the string unit SU3 of the block BLK7 and the string unit SU0 of the block BLK8.

As shown in FIG. 9, the bit line BLa connected to a memory pillar MP of the block BLK7 and the bit line BLb connected to a memory pillar MP of the block BLK8 are separated from each other in the semiconductor storage device 1 according to the first embodiment. A width of a slit SLT provided at a boundary portion between the memory cell arrays 10$a$ and 10$b$, that is, a width of a slit SLT provided between the blocks BLK7 and BLK8 is larger than a width of a slit SLT provided between adjacent blocks BLK in the memory cell array 10$a$ or 10$b$.

(Cross-Sectional Structure of Memory Chip MC)

Figure 10:
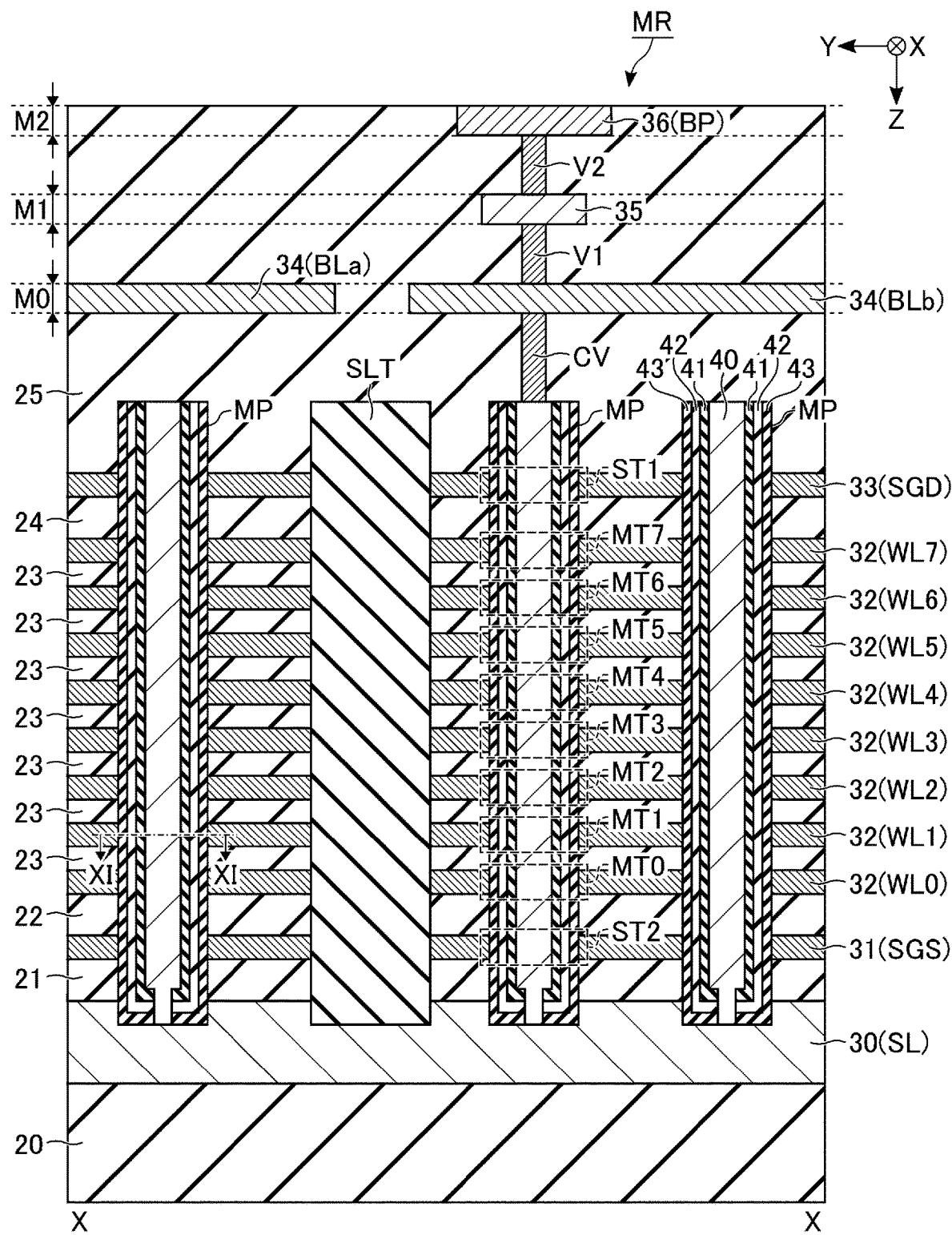
FIG. 10 is a cross-sectional view taken along a line X-X in FIG. 9 and showing an example of a cross-sectional structure of the memory region in the memory chip provided in the semiconductor storage device according to the first embodiment.

FIG. 10 is a cross-sectional view taken along a line X-X in FIG. 9, and shows an example of a cross-sectional structure of the memory region MR in the memory chip MC provided in the semiconductor storage device 1 according to the first embodiment. The Z direction in FIG. 10 is inverted with respect to the Z direction in FIG. 7. That is, an "upper side" corresponds to a lower side of FIG. 10 and a "lower side" corresponds to an upper side of FIG. 10. As shown in FIG. 10, the memory chip MC in the memory region MR further includes insulator layers 20 to 25, conductor layers 30 to 36, and contacts V1 and V2.

The insulator layer 20 is provided, for example, in an uppermost layer of the memory chip MC. However, the present disclosure is not limited thereto. A wire layer, an insulator layer, or the like may be provided above the insulator layer 20. The conductor layer 30 is provided below the insulator layer 20. The conductor layer 30 is formed into, for example, a plate shape extending along an XY plane, and is used as a source line SL. The conductor layer 30 contains, for example, polysilicon doped with phosphorus.

The insulator layer 21 is provided below the conductor layer 30. The conductor layer 31 is provided below the insulator layer 21. The conductor layer 31 is formed into, for example, a plate shape extending along the XY plane, and is used as the select gate line SGS. The select gate line SGS may include a plurality of conductor layers 31. The conductor layer 31 contains, for example, polysilicon doped with phosphorus. When the select gate line SGS includes a plurality of conductor layers 31, the plurality of conductor layers 31 may be formed of conductors that are different from each other.

The insulator layer 22 is provided below the conductor layer 31. The conductor layer 32 and the insulator layer 23 are alternately provided below the insulator layer 22. Each of a plurality of conductor layers 32 is formed into, for example, a plate shape extending along the XY plane. The plurality of conductor layers 32 are used as the word lines WL0 to WL7 in order from a conductor layer 30 side. The conductor layer 32 contains, for example, tungsten.

The insulator layer 24 is provided below the lowermost conductor layer 32. The conductor layer 33 is provided below the insulator layer 24. The conductor layer 33 is formed into, for example, a plate shape extending along the XY plane, and is used as the select gate line SGD. The select gate line SGD may include a plurality of conductor layers 33. The conductor layer 33 contains, for example, tungsten.

The insulator layer 25 is provided below the conductor layer 33. The conductor layer 34 is provided below the insulator layer 25. The conductor layer 34 is formed into, for example, a line shape extending in the Y direction, and is used as a bit line BL. The conductor layer 34 is divided into two conductor layers corresponding to the bit lines BLa and BLb. A plurality of conductor layers 34 corresponding to the bit lines BLa and a plurality of conductor layers 34 corresponding to the bit lines BLb are separately arranged in the X direction in a region not shown. The conductor layer 34 contains, for example, copper. Hereinafter, a wire layer provided with the conductor layer 34 is referred to as M0.

Each of the memory pillars MP extends in the Z direction and passes through the insulator layers 21 to 24 and the conductor layers 31 to 33. An upper portion of each memory pillar MP is in contact with the conductor layer 30. Each of the memory pillars MP includes a semiconductor layer 40, a tunnel insulation film 41, an insulation film 42, a block insulation film 43, and the like.

The semiconductor layer 40 extends in the Z direction. For example, a lower end of the semiconductor layer 40 is provided in a layer including the insulator layer 25, and an upper end of the semiconductor layer 40 is in contact with the conductor layer 30. The tunnel insulation film 41 covers a side surface of the semiconductor layer 40. The insulation film 42 covers a side surface of the tunnel insulation film 41. The block insulation film 43 covers a side surface of the insulation film 42.

A portion where a memory pillar MP intersects with the conductor layer 31 (the select gate line SGS) functions as a select transistor ST2. A portion where a memory pillar MP intersects with the conductor layer 32 (a word line WL) functions as a memory cell transistor MT. A portion where a memory pillar MP intersects with the conductor layer 33 (the select gate line SGD) functions as a select transistor ST1. That is, the semiconductor layer 40 functions as a channel for each of the memory cell transistors MT0 to MT7 and the select transistors ST1 and ST2. The insulation film 42 functions as a charge storage layer of the memory cell transistor MT.

A columnar contact CV is provided below the semiconductor layer 40 in each memory pillar MP. A contact CV corresponding to one of two memory pillars MP is shown in a region shown in the figure. A contact CV in a region (not shown) is connected to a memory pillar MP that is not connected with the contact CV in the region shown in the figure. Below a contact CV, one conductor layer 34 (a bit line BL) is in contact with the contact CV.

At least a part of a slit SLT is formed into a plate shape extending along an XZ plane, and divides the insulator layers 21 to 24 and the conductor layers 31 to 33. A lower end of the slit SLT is provided in a layer including the insulator layer 25. An upper end of the slit SLT is in contact with, for example, the conductor layer 30. The slit SLT contains, for example, silicon oxide ($SiO_2$).

A columnar contact V1 is provided below the conductor layer 34. The conductor layer 35 is provided below the contact V1. The conductor layer 35 is a wire used to connect with a circuit in the semiconductor storage device 1. Hereinafter, a wire layer provided with the conductor layer 35 is referred to as M1.

The conductor layer 36 is provided below the conductor layer 35. The conductor layer 36 is in contact with an interface of the memory chip MC and is used as a bonding pad BP. The conductor layer 36 contains, for example, copper. Hereinafter, a wire layer provided with the conductor layer 36 is referred to as M2.

Figure 11:
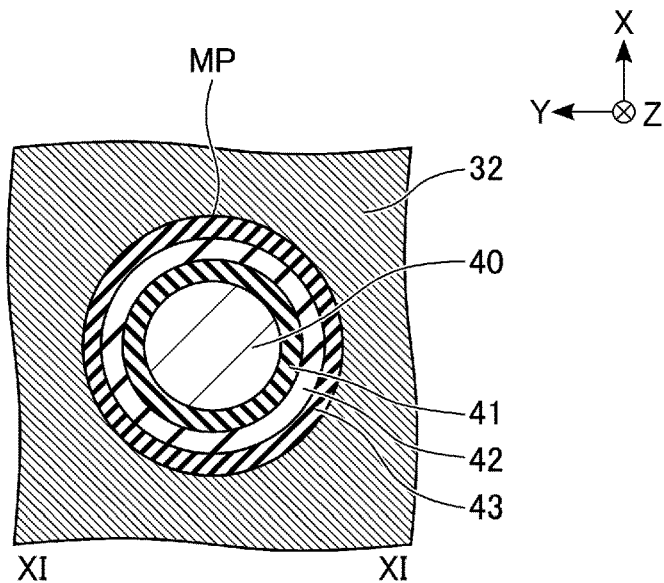
FIG. 11 is a cross-sectional view taken along a line XI-XI in FIG. 10 and showing an example of a cross-sectional structure of a memory pillar in the semiconductor storage device according to the first embodiment.

FIG. 11 is a cross-sectional view taken along a line XI-XI in FIG. 10, and shows an example of a cross-sectional structure of a memory pillar MP in the semiconductor storage device 1 according to the first embodiment. Specifically, FIG. 11 shows a cross section that includes a memory pillar MP and the conductor layer 32 and is parallel to a surface of the semiconductor substrate used for forming the semiconductor storage device 1.

As shown in FIG. 11, the semiconductor layer 40 is provided, for example, at a central portion of the memory pillar MP. The tunnel insulation film 41 surrounds the side surface of the semiconductor layer 40. The insulation film 42 surrounds the side surface of the tunnel insulation film 41. The block insulation film 43 surrounds the side surface of the insulation film 42. The conductor layer 32 surrounds a side surface of the block insulation film 43. Each of the tunnel insulation film 41 and the block insulation film contains, for example, silicon oxide ($SiO_2$). The insulation film 42 contains, for example, silicon nitride (SiN). Each memory pillar MP may further include an insulator layer inside the semiconductor layer 40, and the insulator layer may be located at a central portion of each memory pillar MP. That is, the semiconductor layer 40 may have a cylindrical portion.

Figure 12:
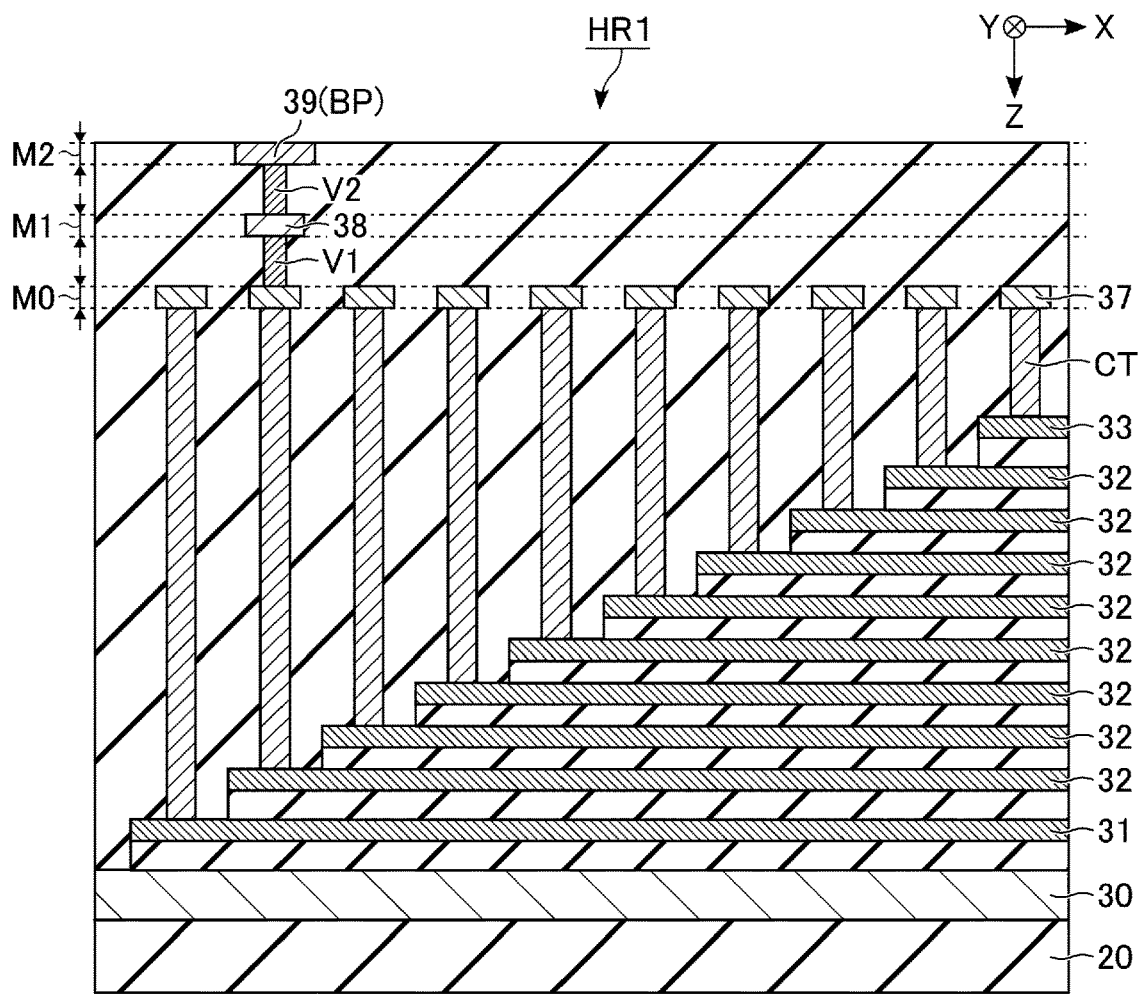
FIG. 12 is a cross-sectional view showing an example of a cross-sectional structure of a lead-out region in the memory chip provided in the semiconductor storage device according to the first embodiment.

FIG. 12 shows an example of a cross-sectional structure of the lead-out region HR1 of the CMOS chip CC provided in the semiconductor storage device 1 according to the first embodiment, and shows a cross section corresponding to even-numbered blocks BLK provided in the lead-out region HR1. The Z direction in FIG. 12 is the same as the Z direction in FIG. 10 and is inverted with respect to the Z direction in FIG. 7. As shown in FIG. 12, corresponding end portions of the select gate line SGS, the word lines WL0 to WL7, and the select gate line SGD are provided in a stepped manner in the lead-out region HR1. In the lead-out region HR, the memory chip MC further includes contacts V1 and V2 and conductor layers 37 to 39.

Specifically, the conductor layer 31 includes a terrace portion that does not overlap with the conductor layers 32 and 33 below. Each conductor layer 32 includes a terrace portion that does not overlap with the conductor layers 32 and 33 below. The conductor layer 33 includes a terrace portion in the lead-out region HR1. A plurality of contacts are respectively provided on terrace portions of the conductor layers 31 to 33. For example, lower portions of a plurality of contacts CT are aligned.

The conductor layer 37 is provided below each contact CT. The conductor layer 37 is provided in the wire layer M0. The contact V1 is provided below the conductor layer 37. The conductor layer 38 is provided below the contact V1. The conductor layer 38 is provided in the wire layer M1. The contact V2 is provided below the conductor layer 38. The conductor layer 39 is provided below the contact V2. The conductor layer 39 is provided in the wire layer M2. That is, the conductor layer 39 is in contact with an interface of the memory chip MC and is used as a bonding pad BP. The conductor layer 39 contains, for example, copper.

FIG. 12 shows only one set including the contacts V1 and V2 and the conductor layers 38 and 39 corresponding to the word line WL0. Other sets, each including the contacts V1 and V2 and the conductor layers 38 and 39, are connected to other conductor layers 37 in a region (not shown). A structure of a region corresponding to odd-numbered blocks BLK in the lead-out region HR1 has a similar structure in which the contacts CT in the structure shown in FIG. 12 are omitted. A structure of a region corresponding to odd-numbered blocks BLK in the lead-out region HR2 has a similar structure in which the structure shown in FIG. 12 is reversed with the Y direction serving as a symmetry axis.

1.3.3 Structure of CMOS Chip CC
(Planar Layout of CMOS Chip CC)

Figure 13:
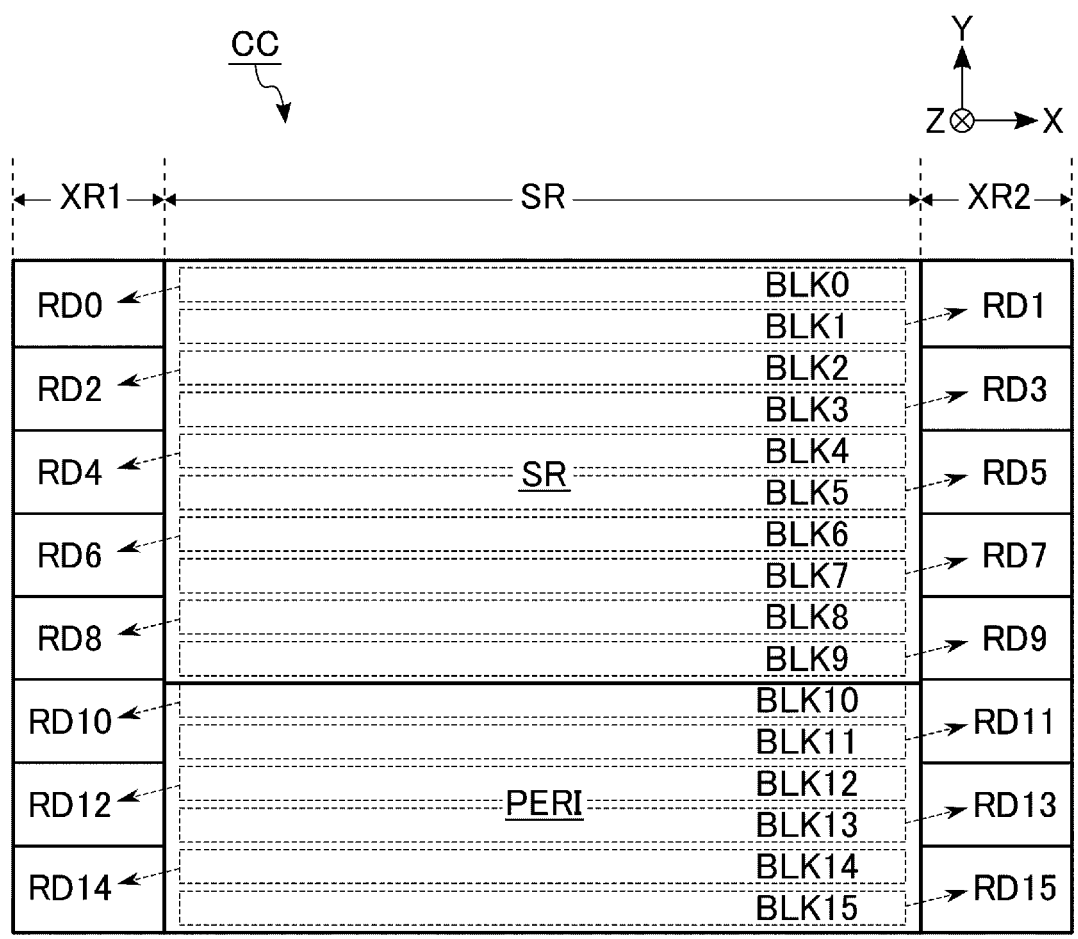
FIG. 13 is a plan view showing an example of a planar layout of a CMOS chip provided in the semiconductor storage device according to the first embodiment.

FIG. 13 shows an example of a planar layout of the CMOS chip CC provided in the semiconductor storage device 1 according to the first embodiment, and shows a connection relationship between blocks BLK and row decoders RD. As shown in FIG. 13, the transfer region XR1 includes even-numbered row decoders RD0, RD2, RD4, RD6, RD8, RD10, RD12, and RD14. The transfer region XR2 includes odd-numbered row decoders RD1, RD3, RD5, RD7, RD9, RD11, RD13, and RD15. The blocks BLK0 to BLK15 arranged in the Y direction include blocks BLK overlapping with the sense amplifier region SR as viewed from the Z direction and blocks BLK overlapping with the peripheral circuit region PERI as viewed from the Z direction.

For example, the row decoders RD0, RD2, RD4, RD6, RD8, RD10, RD12, and RD14 and the row decoders RD1, RD3, RD5, RD7, RD9, RD11, RD13, and RD 15 respectively face each other and sandwich the sense amplifier region SR in the X direction. A width of each block BLK in the Y direction is, for example, a half or less of a width of a row decoder RD in the Y direction. In the present example, two blocks BLK0 and BLK1 are provided between the row decoders RD0 and RD1. Two blocks BLK2 and BLK3 are provided between the row decoders RD2 and RD3. Subsequent two blocks BLK are provided between two row decoders RD facing each other in the X direction in the same manner.

The arrangement of the transfer regions XR1 and XR2, the sense amplifier region SR, and the peripheral circuit region PERI is merely an example. For example, a ratio of layout areas of the sense amplifier region SR and the peripheral circuit region PERI may be changed depending on the circuit configurations of the sense amplifier units SAU and the latch circuits XDL. In addition, the arrangement of the blocks BLK, the sense amplifier units SAU, and the row decoders RD described above is also merely an example. For example, an arrangement of the row decoders RD connected to the blocks BLK may be appropriately changed within the transfer regions XR1 and XR2. Each block BLK may be connected to both a row decoder RD provided in the transfer region XR1 and a row decoder RD provided in the transfer region XR2.

(Detailed Planar Layout of Sense Amplifier Region SR)

Figure 14:
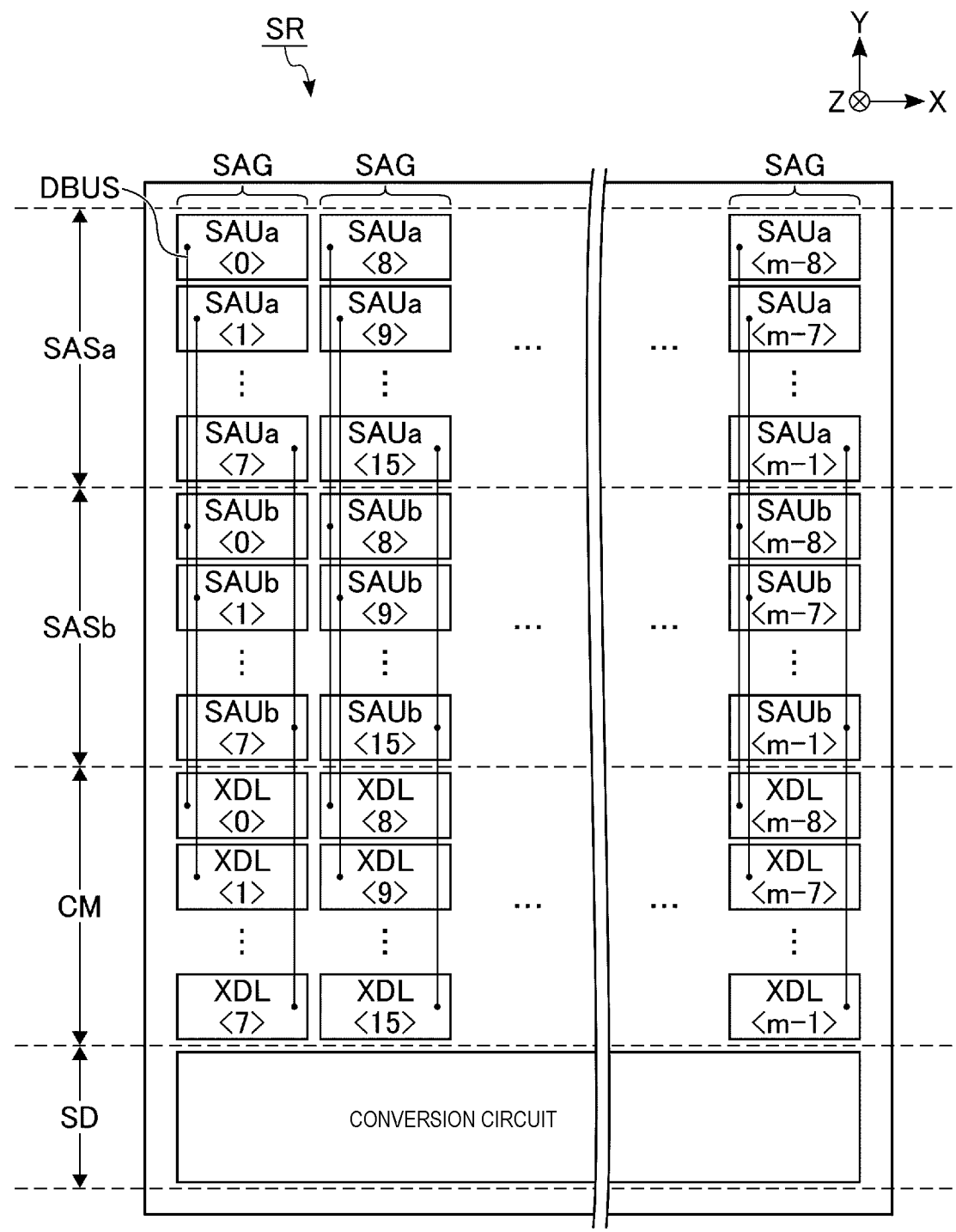
FIG. 14 is a plan view showing an example of a planar layout of a sense amplifier region in the CMOS chip provided in the semiconductor storage device according to the first embodiment.

FIG. 14 shows an example of a planar layout of the sense amplifier region SR in the CMOS chip CC provided in the semiconductor storage device 1 according to the first embodiment. As shown in FIG. 14, in the sense amplifier region SR, sense amplifier sets SASa and SASb, a cache memory CM, and a conversion circuit SD are separately provided in regions extending in the X direction, and are arranged in that order in the Y direction.

In a region of the sense amplifier set SASa, for example, multiple sets, each including eight sense amplifier units SAUa arranged in the Y direction, are arranged in the X direction. Specifically, sense amplifier units SAUa<0> to SAUa<7> are arranged in the Y direction in the vicinity of the transfer region XR1. Sense amplifier units SAUa<8> to SAUa<15> are respectively arranged adjacent to the sense amplifier units SAUa<0> to SAUa<7>. Sense amplifier units SAUa<16> to SAUa<23> . . . sense amplifier units SAUa<m−8> to SAUa<m−1> are arranged in the same manner.

In a region of the sense amplifier set SASb, for example, multiple sets, each including eight sense amplifier units SAUb arranged in the Y direction, are arranged in the X direction. Specifically, sense amplifier units SAUb<0> to SAUb<7> are arranged in the Y direction in the vicinity of the transfer region XR1. Sense amplifier units SAUb<8> to SAUb<15> are respectively arranged adjacent to the sense amplifier units SAUb<0> to SAUb<7>. Sense amplifier units SAUb<16> to SAUb<23> . . . sense amplifier units SAUb<m−8> to SAUb<m−1> are arranged in the same manner.

In a region of the cache memory CM, for example, multiple sets, each including eight latch circuits XDL arranged in the Y direction, are arranged in the X direction. Specifically, latch circuits XDL<0> to XDL<7> are arranged in the Y direction in the vicinity of the transfer region XR1. Latch circuits XDL<8> to XDL<15> are respectively arranged adjacent to the latch circuits XDL<0> to XDL<7>. Latch circuits XDL<16> to XDL<23> . . . latch circuits XDL<m−8> to XDL<m−1> are arranged in the same manner.

In the present specification, each set including the sense amplifier units SAUa and SAUb and latch circuits XDL that are arranged in the Y direction, is referred to as a sense amplifier group SAG. The number of sense amplifier units SAU provided in one sense amplifier group SAG is set based on a pitch of a bit line BL. For example, when a width in the Y direction of the sense amplifier group SAG is set according to a pitch of eight bit lines BL, the sense amplifier group SAG includes eight sense amplifier units SAUa and eight sense amplifier units SAUb.

In a region overlapping with the sense amplifier group SAG, a plurality of buses DBUS each having a portion extending in the Y direction are provided corresponding to the number of sets including the sense amplifier units SAUa and SAUb. The latch circuits XDL<0> to XDL<m−1> in the cache memory CM are connected to the conversion circuit SD via wires (not shown). The sense amplifier units SAU and the latch circuits XDL provided in a sense amplifier group SAG may be at least connected to each other.

(Cross-Sectional Structure of CMOS Chip CC)

Figure 15:
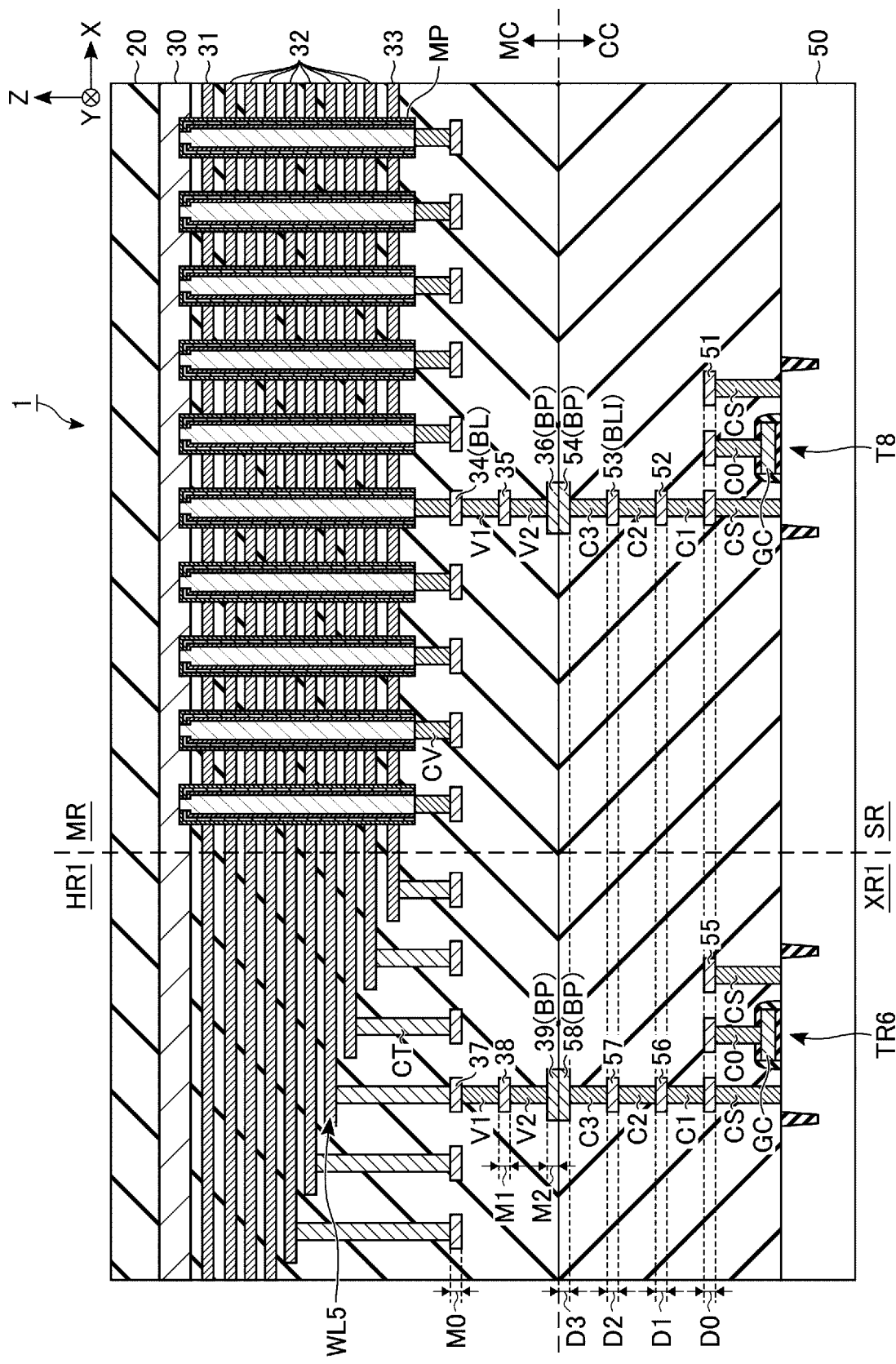
FIG. 15 is a cross-sectional view showing an example of a cross-sectional structure of the semiconductor storage device according to the first embodiment.

FIG. 15 shows an example of a cross-sectional structure of the semiconductor storage device 1 according to the first embodiment, and shows a structure in which the memory chip MC and the CMOS chip CC are bonded together. A configuration corresponding to the transistor T8 in the sense amplifier region SR and a configuration corresponding to the transistor TR6 in the transfer region XR1 are extracted and shown in FIG. 15. As shown in FIG. 15, the CMOS chip CC includes a semiconductor substrate 50, conductor layers GC, conductor layers 51 to 58, columnar contacts CS, columnar contacts C0 to C3, and the like.

The semiconductor substrate 50 is used to form the CMOS chip CC, and contains, for example, P-type impurities. The semiconductor substrate 50 includes a plurality of well regions (not shown). For example, a transistor is formed in each of the plurality of well regions. The plurality of well regions are separated by, for example, shallow trench isolation (STI).

In the sense amplifier region SR, a conductor layer GC is provided on the semiconductor substrate 50 via a gate insulation film. The conductor layer GC in the sense amplifier region SR is used as, for example, a gate electrode of the transistor T8 provided in a sense amplifier unit SAU. The contact C0 is provided on a conductor layer GC corresponding to a gate of the transistor T8, and two contacts CS are provided on the semiconductor substrate 50 corresponding to a source and a drain of the transistor T8. For example, an upper surface of the contact CS and an upper surface of the contact C0 are aligned.

In the sense amplifier region SR, one conductor layer 51 is provided on each of the contact CS and the contact C0. The contact C1 is provided on the conductor layer 51. The conductor layer 52 is provided on the contact C1. The contact C2 is provided on the conductor layer 52. The conductor layer 53 is provided on the contact C2. The contact C3 is provided on the conductor layer 53. The conductor layer 54 is provided on the contact C3.

The conductor layer 54 is in contact with an interface of the CMOS chip CC, and is used as a bonding pad BP. The conductor layer 54 in the sense amplifier region SR is bonded to the conductor layer 36 in the memory region MR that faces the conductor layer 54, and is electrically connected to one bit line BL. The conductor layer 54 contains, for example, copper. Although not shown, the sense amplifier region SR includes a plurality of transistors having the same structure as the transistor T8.

In the transfer region XR1, a conductor layer GC is provided on the semiconductor substrate 50 via a gate insulation film. The conductor layer GC in the transfer region XR1 is used, for example, as a gate electrode of the transistor TR6 provided in a row decoder RD. The contact C0 is provided on the conductor layer GC and is corresponding to a gate of the transistor TR6, and two contacts CS are provided on the semiconductor substrate 50 and are corresponding to a source and a drain of the transistor TR6.

In the transfer region XR1, one conductor layer 55 is provided on each of the contact CS and the contact C0. The contact C1 is provided on the conductor layer 55. The conductor layer 56 is provided on the contact C1. The contact C2 is provided on the conductor layer 56. The conductor layer 57 is provided on the contact C2. The contact C3 is provided on the conductor layer 57. The conductor layer 58 is provided on the contact C3.

The conductor layer 58 is in contact with an interface of the CMOS chip CC, and is used as a bonding pad BP. The conductor layer 58 in the transfer region XR1 is bonded to the conductor layer 39 in the lead-out region HR1 that faces the conductor layer 58, and is electrically connected to, for example, the word line WL5. The conductor layer 58 contains, for example, copper. Although not shown, the transfer region XR1 includes a plurality of transistors having the same structure as the transistor TR6. A structure of the transfer region XR2 is the same as a structure of the transfer region XR1.

Hereinafter, a wire layer provided with the conductor layers 51 and 55 is referred to as D0. A wire layer provided with the conductor layers 52 and 56 is referred to as D1. A wire layer provided with the conductor layers 53 and 57 is referred to as D2. A wire layer provided with the conductor layers 54 and 58 is referred to as D3. A node including the conductor layer 53 is also referred to as BLI. The number of wire layers provided in the CMOS chip CC may be any number. Contacts connected to corresponding conductor layers 51 to 53 and 55 to 57 may be omitted in accordance with a design of a circuit.

1.3 Operation of Semiconductor Storage Device 1

Figure 16:
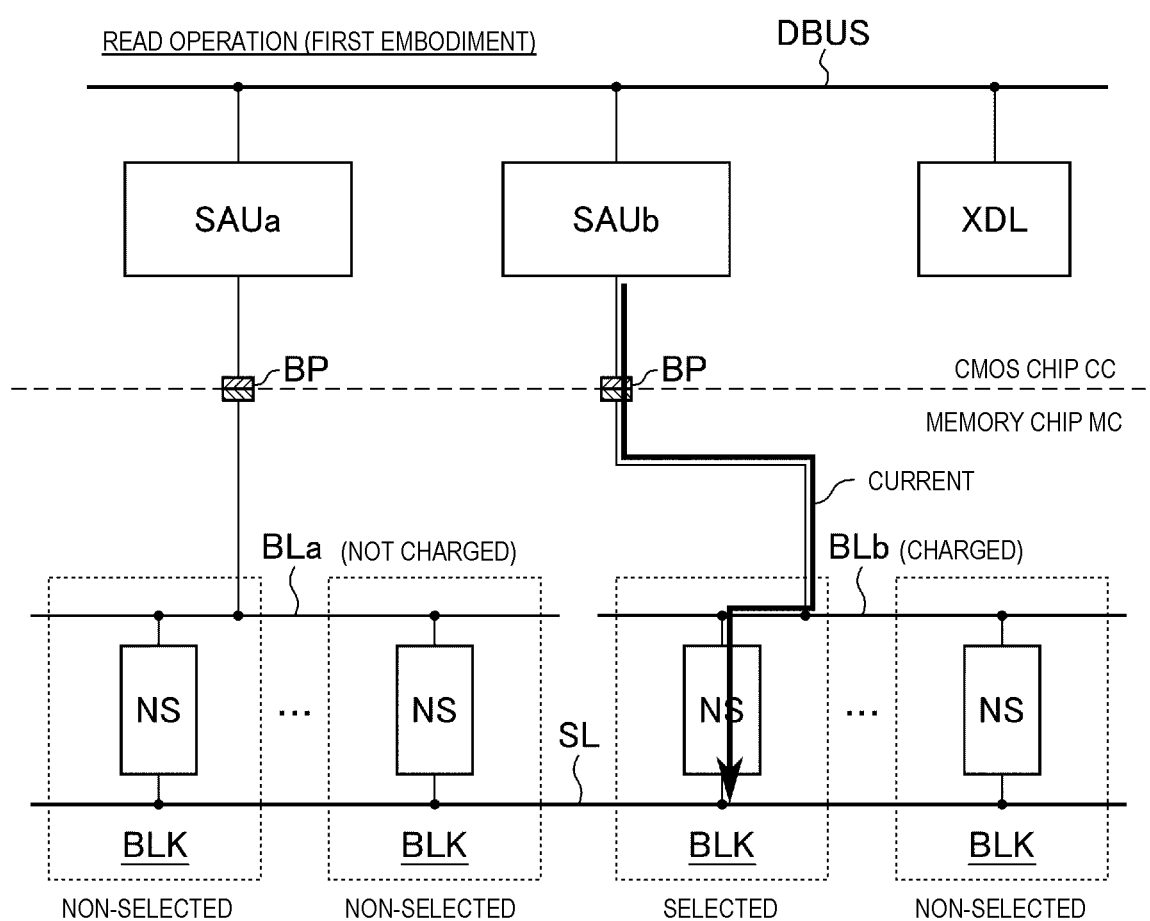
FIG. 16 is a circuit diagram schematically showing a read operation of the semiconductor storage device according to the first embodiment.

FIG. 16 shows a configuration related to the sense amplifier units SAUa and SAUb connected to a common bus DBUS and an example of a current path during a read operation in the semiconductor storage device 1 according to the first embodiment. As shown in FIG. 16, in the read operation of the semiconductor storage device 1 according to the first embodiment, the sequencer 13 charges a bit line BL connected to a NAND string NS provided in a selected block BLK, and does not charge a bit line BL connected only to a NAND string NS provided in a non-selected block BLK.

Specifically, when a block BLK including a NAND string NS connected to a bit line BLb is selected, the sequencer 13 charges the bit line BLb using the sense amplifier unit SAUb. Accordingly, a current can flow from the sense amplifier unit SAUb toward a source line SL through the NAND string NS and the bit line BLb provided in the selected block BLK. On the other hand, the sequencer 13 does not charge the bit line BLa to which only a NAND string NS provided in a non-selected block BLK is connected. Similarly, when a block BLK including a NAND string NS connected to the bit line BLa is selected, the bit line BLa is charged, and the bit line BLb is not charged.

The sequencer 13 can execute a write operation by appropriately charging either the bit line BLa or the bit line BLb in the same manner as the read operation. In various operations, the sequencer 13 may set a bit line BL connected to a NAND string NS provided in a non-selected block BLK to a floating state, or may apply a ground voltage VSS to the bit line BL using a sense amplifier unit SAU.

1.4 Effect of First Embodiment

According to the semiconductor storage device 1 according to the first embodiment described above, power consumption can be reduced and an operation speed can be increased. Detailed effects of the semiconductor storage device 1 according to the first embodiment will be described below with reference to a comparative example.

In a semiconductor storage device, a pitch of a wire for driving a memory cell tends to be smaller as a storage density increases. For example, a wire capacitance and wire resistance are increased for a bit line BL having a small pitch. As a result, an RC time constant of the bit line BL increases. Therefore, power consumption of the semiconductor storage device may increase, and an operation speed of the semiconductor storage device (for example, a processing speed of a read operation, a write operation, or the like) may decrease.

A method for reducing the RC time constant of the bit line BL having a small pitch is to shorten a wire length of the bit line BL. For example, the wire length of the bit line BL controlled by the sense amplifier module 14 can be shortened by dividing the memory cell array 10 into a plurality of portions. The sense amplifier module 14 may be provided for each of the divided memory cell array 10, or the sense amplifier module 14 may be shared by the divided memory cell array 10. When priority is given to reduction in manufacturing costs of the semiconductor storage device, it is preferable to divide the bit line BL and share the sense amplifier module 14 within a possible range.

Figure 17:
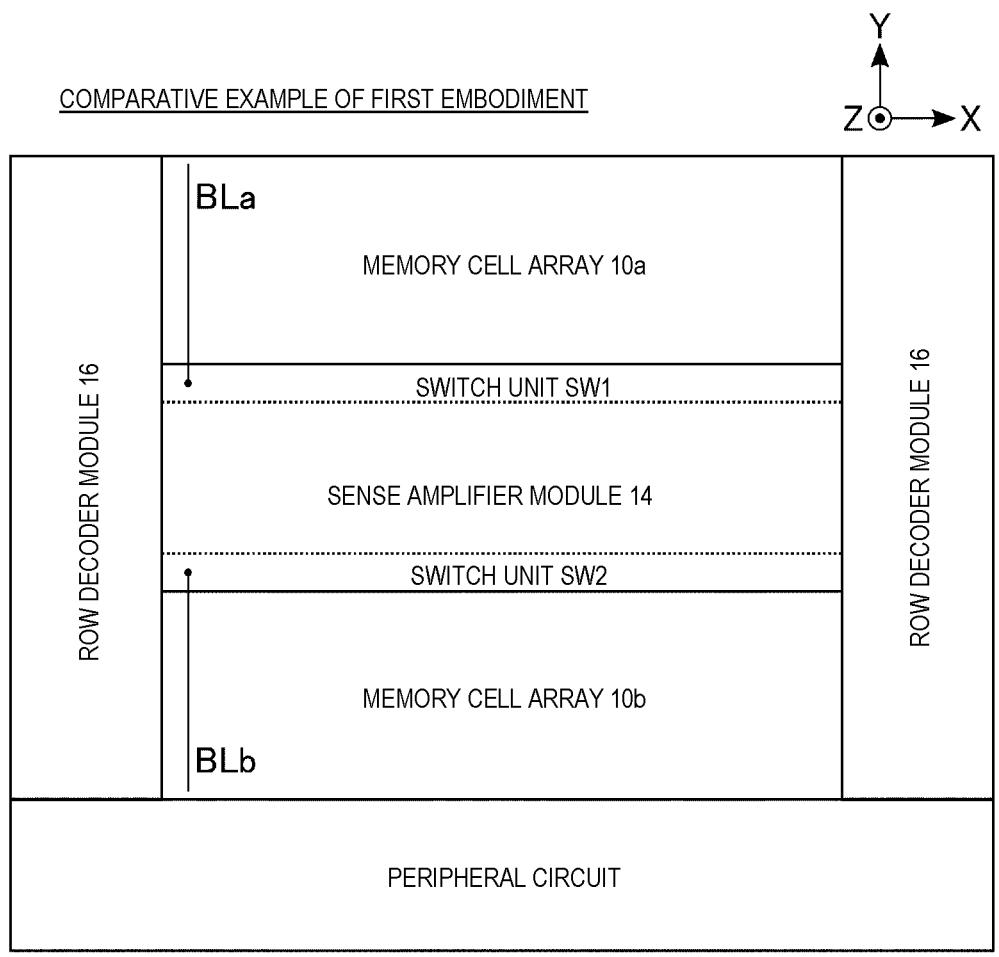
FIG. 17 is a plan view showing an example of a planar layout of a semiconductor storage device according to a comparative example.

Hereinafter, an example in which the sense amplifier module 14 is shared and the bit line BL is divided into two portions will be described. FIG. 17 shows an example of a planar layout of a semiconductor storage device according to a comparative example. As shown in FIG. 17, the semiconductor storage device according to the comparative example includes the memory cell arrays 10a and 10b and the sense amplifier module 14 on a semiconductor substrate. In the comparative example, the sense amplifier module 14 is interposed between the memory cell arrays 10a and 10b.

In the comparative example, the sense amplifier module 14 includes a switch unit SW1 provided in a portion adjacent to the memory cell array 10a, and a switch unit SW2 provided in a portion adjacent to the memory cell array 10b. The sense amplifier module 14 can selectively control the bit line BLa connected to the memory cell array 10a and the bit line BLb connected to the memory cell array 10b by activating either the switch unit SW1 or the switch unit SW2.

As a result, an RC time constant of the bit line BL can be reduced approximately to a half, power consumption can be reduced, and an operation speed can be increased in the semiconductor storage device according to the comparative example. Specifically, for example, an amount of current required for charging a bit line BL can be reduced in half in the semiconductor storage device according to the comparative example. However, a region of the sense amplifier module 14 may be increased due to a region where the switch units SW1 and SW2 are formed, and a chip area of the semiconductor storage device may be increased in the semiconductor storage device according to the comparative example.

On the other hand, the semiconductor storage device 1 according to the first embodiment has a structure in which the divided bit lines BLa and BLb are controlled by the sense amplifier module 14 and the memory chip MC and the CMOS chip CC are bonded together. Therefore, a peripheral circuit such as the sense amplifier module 14 overlaps with the memory cell array 10 in the semiconductor storage device 1 according to the first embodiment. In other words, the sense amplifier region SR can be covered by the memory region MR in the semiconductor storage device 1 according to the first embodiment.

Accordingly, a cell occupation ratio, which is equal to a ratio of an area of a region corresponding to the memory cell array to a chip area of the semiconductor storage device, can be increased to be larger in the semiconductor storage device 1 according to the first embodiment, than in the comparative example. In addition, an influence on the chip area by the sense amplifier region SR can be reduced. Since the degree of freedom in the layout of the sense amplifier region SR is increased in the semiconductor storage device 1 according to the first embodiment, constraints in the wire layout caused by dividing the bit line BL, are smaller in the semiconductor storage device 1 according to the first embodiment than in the comparative example.

As described above, in the semiconductor storage device 1 according to the first embodiment, the RC time constant of the bit line BL can be reduced approximately in half, and the chip area can be further reduced. Therefore, similarly to the comparative example, power consumption can be reduced and an operation speed can be increased in the semiconductor storage device 1 according to the first embodiment. In addition, manufacturing costs can be reduced as compared with the comparative example.

Reduction in the RC time constant of the bit line BL is also effective when a current flowing through a memory cell (cell current) is small and reading or the like is difficult. For example, when the number of stacked word lines WL is increased in a semiconductor storage device in which memory cells are three-dimensionally stacked, the cell current tends to be reduced. The structure of the semiconductor storage device 1 according to the first embodiment is not limited thereto and may cover other structures where the cell current can be reduced.

In the first embodiment, although a structure in which the memory chip MC and the CMOS chip CC are bonded together is described as a structure in which the memory cell array 10 is divided in the Y direction (an extending direction of the bit lines BL) and the memory region MR and the sense amplifier region SR overlap with each other as viewed from the Z direction, the present disclosure is not limited thereto. For example, a structure in which the memory cell array 10 is divided and the memory region MR and the sense amplifier region SR overlap with each other can be formed using one semiconductor substrate. However, such a structure further requires a region including a contact passing through the memory region MR. Therefore, it is preferable to use a structure in which the memory chip MC and the CMOS chip CC are bonded together according to the first embodiment as a structure in which the memory cell array 10 is divided and the memory region MR and the sense amplifier region SR overlap with each other.

In the first embodiment, the semiconductor storage device 1 has been explained as including one plane (a combination of the memory cell array 10, the sense amplifier module 14, and the row decoder module 16). However, the number of planes (the number of sets of the memory cell arrays 10, the sense amplifier modules 14, and the row decoder modules 16) provided in the semiconductor storage device 1 is not limited to one, and the semiconductor storage device 1 may include two or more planes. In such a case, the bit lines BL are divided in each of the memory cell arrays belonging to the different planes, and each of the sense amplifier modules 14 of the respective planes includes the sense amplifier sets correspondingly with the divided groups of bit lines BL.

2. Second Embodiment

The semiconductor storage device 1 according to the second embodiment has a configuration in which the number of divisions of the bit line BL is changed as compared with the semiconductor storage device 1 according to the first embodiment. Hereinafter, differences of the semiconductor storage device 1 according to the second embodiment from the semiconductor storage device 1 according to the first embodiment will be described.

2.1 Overall Configuration of Semiconductor Storage Device 1

Figure 18:
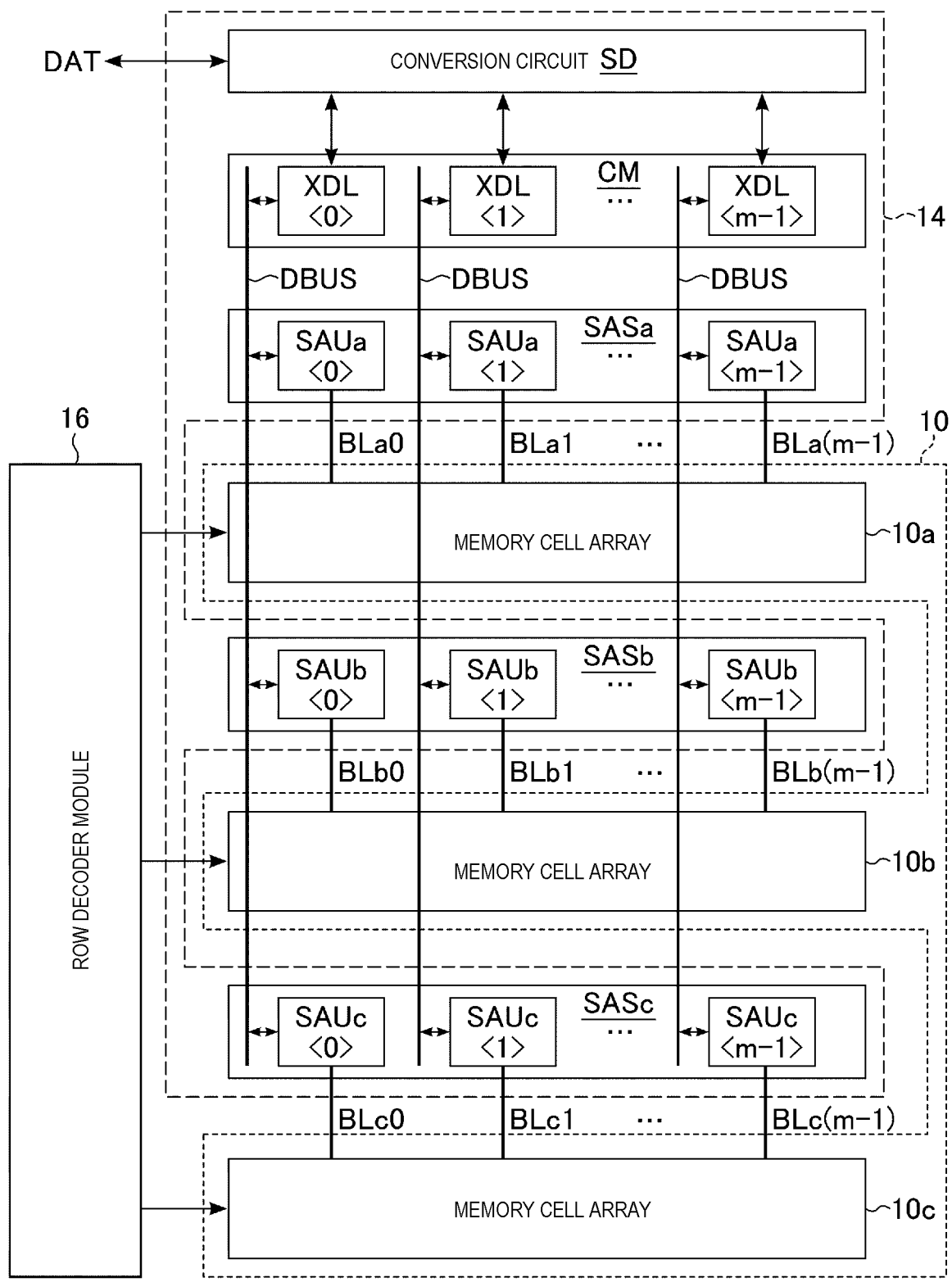
FIG. 18 is a detailed block diagram showing a memory cell array, a sense amplifier module, and a row decoder module provided in a semiconductor storage device according to the second embodiment.

FIG. 18 shows a configuration example of the memory cell array 10, the sense amplifier module 14, and the row decoder module 16 that are provided in the semiconductor storage device 1 according to the second embodiment. As shown in FIG. 18, the memory cell array 10 is divided into memory cell arrays 10a, 10b, and 10c, and the sense amplifier module 14 includes sense amplifier sets SASa, SASb, and SASc in the semiconductor storage device 1 according to the second embodiment.

The number of blocks BLK provided in each of the memory cell arrays 10a, 10b, and 10c is any number. The number of blocks BLK provided in the memory cell array 10a, the number of blocks BLK provided in the memory cell array 10b, and the number of blocks BLK provided in the memory cell array 10c may be the same, or may be different.

Bit lines BLc0 to BLc(m−1) are connected to the memory cell array 10c. The same number of bit lines BL may be connected to each of the memory cell arrays 10a, 10b, and 10c. The bit lines BLa, BLb, and BLc denoted by the same reference numerals may be one bit line BL that is a wire divided into three portions corresponding to the memory cell arrays 10a, 10b, and 10c. The bit lines BLa, BLb, and BLc denoted by the same reference numerals are associated with, for example, the same column address CAd.

The sense amplifier sets SASa, SASb, SASc are respectively associated with the memory cell arrays 10a, 10b, and 10c. The sense amplifier set SASc includes sense amplifier units SAUc<0> to SAUc<m−1>. Each sense amplifier unit SAUc is connected to at least one bit line BL. For example, the sense amplifier units SAUc<0> to SAUc<m−1> are respectively connected to bit lines Blc0 to Blc(m−1).

Latch circuits XDL<0> to XDL<m−1> in a cache memory CM are connected to sets including the sense amplifier units SAUa, SAUb, and SAUc via different buses DBUS. Specifically, the latch circuit XDL<0> is connected to the sense amplifier units SAUa<0>, SAUb<0>, and SAUc<0>. The latch circuit XDL<1> is connected to the sense amplifier units SAUa<1>, SAUb<1>, and SAUc<1>. Similarly, the latch circuit XDL<m−1> is connected to the sense amplifier units SAUa<m−1>, SAUb<m−1>, and SAUc<m−1>.

2.2 Planar Layout of Sense Amplifier Region SR

Figure 19:
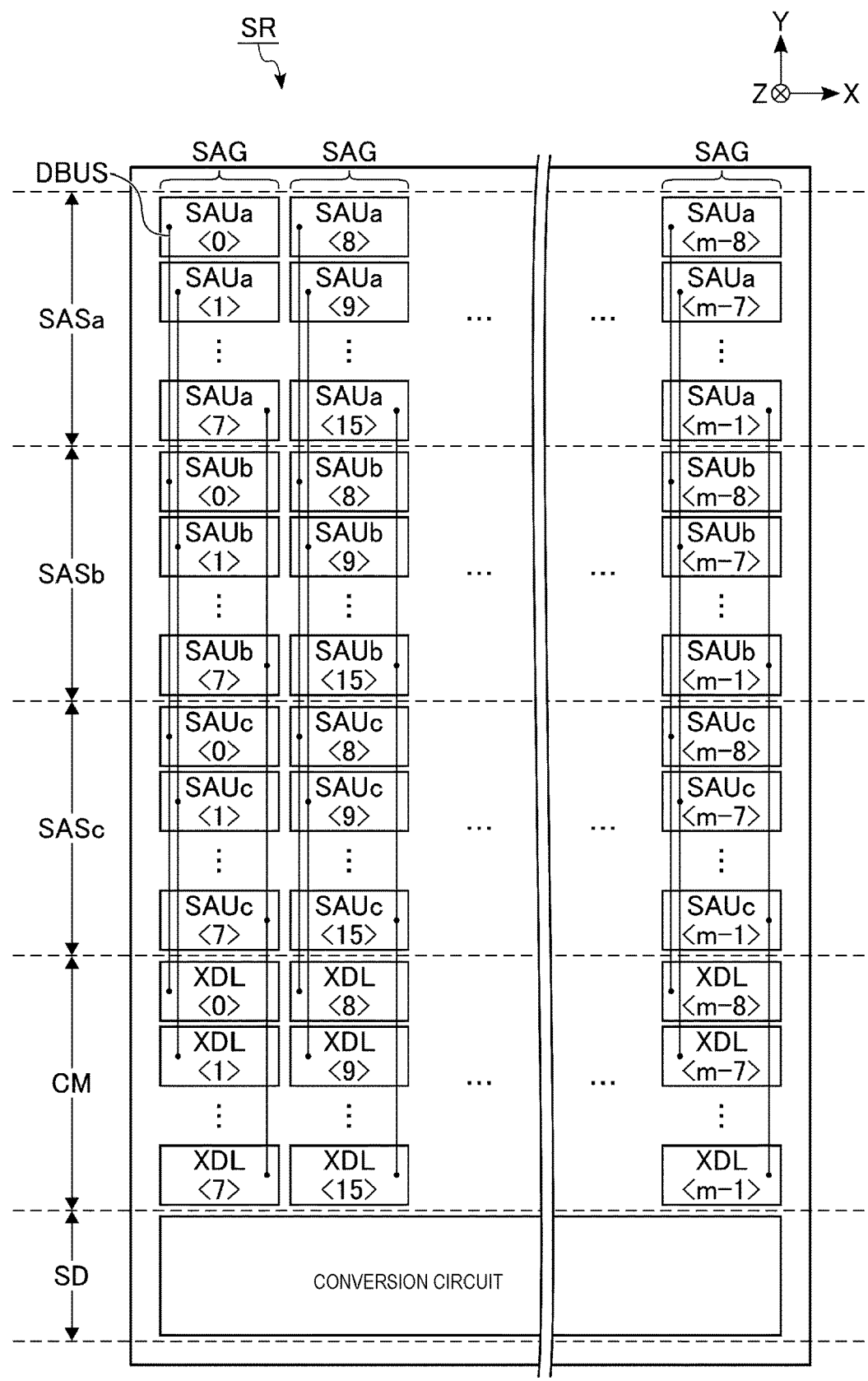
FIG. 19 is a plan view showing an example of a planar layout of a sense amplifier region in a CMOS chip provided in the semiconductor storage device according to the second embodiment.

FIG. 19 shows an example of a planar layout of the sense amplifier region SR in a CMOS chip CC provided in the semiconductor storage device 1 according to the second embodiment. As shown in FIG. 19, in the sense amplifier region SR, the sense amplifier sets SASa, SASb, and SASc, a cache memory CM, and a conversion circuit SD are separately provided in regions extending in the X direction, and are arranged in order in the Y direction. In a region of the sense amplifier set SASc, for example, multiple sets, each including eight sense amplifier units SAUc arranged in the Y direction, are arranged in the X direction.

Specifically, the sense amplifier units SAUc<0> to SAUc<7> are arranged in the Y direction in the vicinity of the transfer region XR1. The sense amplifier units SAUc<8> to SAUc<15> are respectively provided adjacent to the sense amplifier units SAUc<0> to SAUc<7>. The sense amplifier units SAUc<16> to SAUc<23> . . . sense amplifier units SAUc<m−8> to SAUc<m−1> are provided in the same manner. In the semiconductor storage device 1 according to the second embodiment, the sense amplifier group SAG includes the sense amplifier units SAUa, SAUb, and SAUc, and the latch circuits XDL. Other configurations of the semiconductor storage device 1 according to the second embodiment are the same as those in the first embodiment.

2.3 Operation of Semiconductor Storage Device 1

Figure 20:
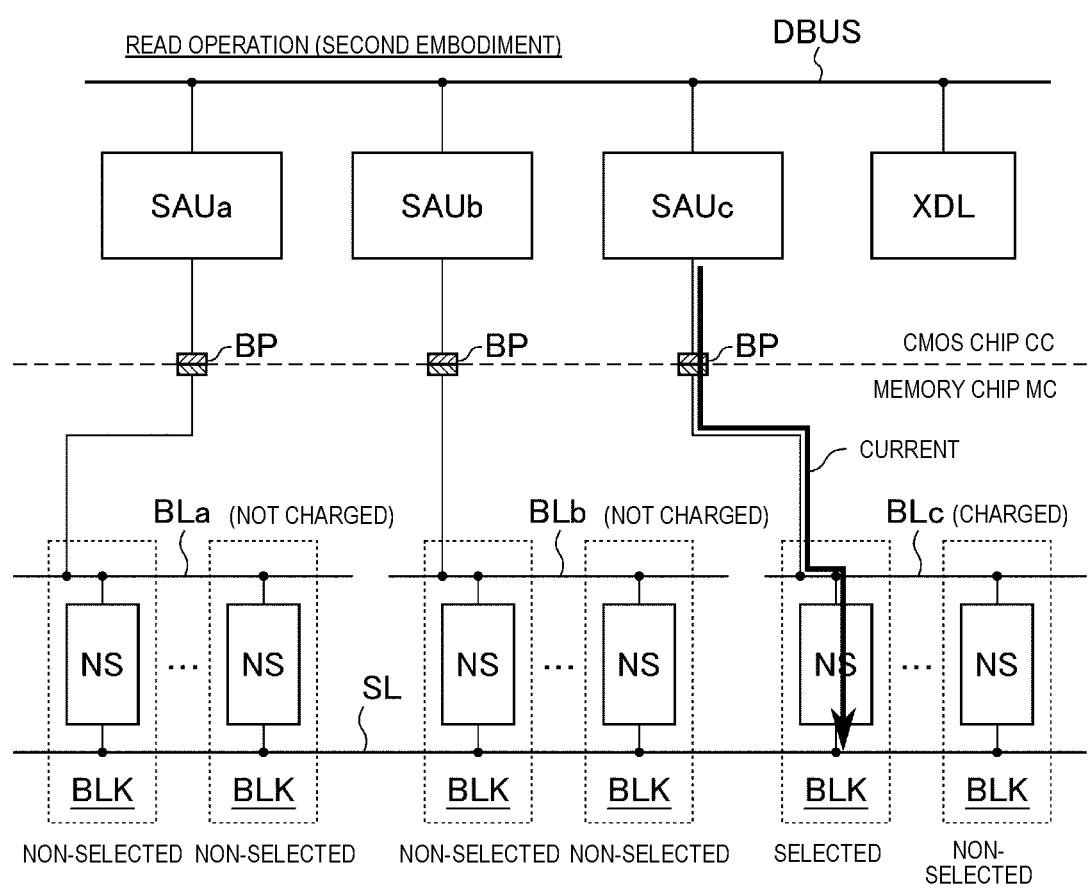
FIG. 20 is a circuit diagram schematically showing a read operation of the semiconductor storage device according to the second embodiment.

FIG. 20 shows a configuration related to the sense amplifier units SAUa, SAUb, and SAUc connected to a common bus DBUS and an example of a current path during a read operation in the semiconductor storage device 1 according to the second embodiment. As shown in FIG. 20, in the read operation of the semiconductor storage device 1 according to the second embodiment, the sequencer 13 charges a bit line BL connected to a NAND string NS provided in a selected block BLK, and does not charge a bit line BL connected only to a NAND string NS provided in a non-selected block BLK in the same manner as in the first embodiment.

Specifically, when a block BLK including a NAND string NS connected to a bit line BLc is selected, the sequencer 13 charges the bit line BLc using the sense amplifier unit SAUc. Accordingly, a current can flow from the sense amplifier unit SAUc toward a source line SL through the NAND string NS and the bit line BLc provided in the selected block BLK. On the other hand, the sequencer 13 does not charge the bit lines BLa and BLb to which only NAND strings NS provided in non-selected blocks BLK are connected. An operation when a block BLK corresponding to another bit line BL is selected is the same as the operation when the block BLK corresponding to the bit line BLc is selected.

The sequencer 13 can execute a write operation by appropriately charging any one of the bit lines BLa, BLb, and BLc in the same manner as the read operation. In various operations, the sequencer 13 may set a bit line BL connected to a NAND string NS provided in a non-selected block BLK to a floating state, or may apply a ground voltage VSS to the bit line BL using a sense amplifier unit SAU.

2.4 Effect of Second Embodiment

As described above, the semiconductor storage device 1 according to the second embodiment independently controls the bit line BL that is more finely divided in the same plane as compared with the first embodiment. Accordingly, wire resistance and a wire capacitance of the bit line BL in the semiconductor storage device 1 according to the second embodiment are smaller than those in the first embodiment. Therefore, power consumption can be reduced and an operation speed can be increased in the semiconductor storage device 1 according to the second embodiment as compared with the first embodiment.

In the second embodiment, although the bit line BL is divided into three portions, the bit line BL may be divided into four or more portions. In this case, four sense amplifier units SAU are provided corresponding to, for example, four divided bit lines BL. As described above, the semiconductor storage device 1 may be provided with a circuit that independently controls each of the divided bit lines BL even when the number of divided bit lines BL is four or more. As the number of divisions of the bit line BL increases, power consumption is reduced and an operation speed is increased.

The bit line BL may be divided into three or more portions in a structure in which the memory cell array 10 and the sense amplifier module 14 are provided on a semiconductor substrate. However, when the bit line BL is divided into three or more portions in such a structure, it is difficult to lay out wires or the like. Therefore, when three or more divided bit lines BL are provided in the same plane, it is preferable to use a structure in which the memory chip MC and the CMOS chip CC are bonded together as in the semiconductor storage device 1 according to the second embodiment.

3. Third Embodiment

The semiconductor storage device 1 according to the third embodiment has a configuration in which a part of latch circuits other than the latch circuits XDL is shared by the sense amplifier units SAUa and SAUb as compared with the semiconductor storage device 1 according to the first embodiment. Hereinafter, differences of the semiconductor storage device 1 according to the third embodiment from the semiconductor storage device 1 according to the first and the second embodiments will be described.

3.1 Circuit Configuration of Sense Amplifier Module 14

Figure 21:
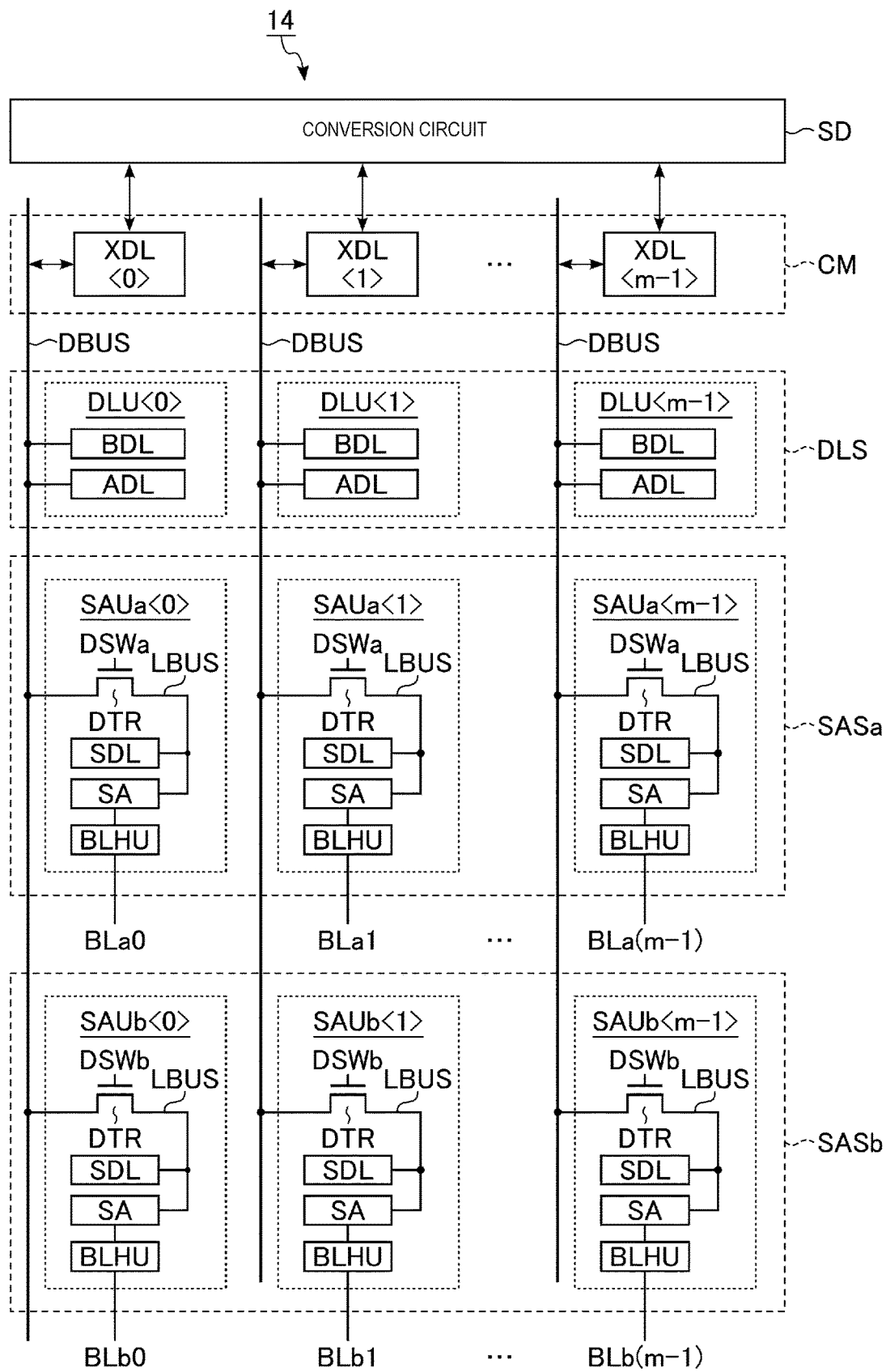
FIG. 21 is a circuit diagram showing an example of a circuit configuration of a sense amplifier module provided in a semiconductor storage device according to a third embodiment.

FIG. 21 shows an example of a circuit configuration of the sense amplifier module 14 provided in the semiconductor storage device 1 according to the third embodiment, and shows a detailed circuit configuration of the sense amplifier units SAUa and SAUb. As shown in FIG. 21, each sense amplifier unit SAU according to the third embodiment has a configuration in which the latch circuits ADL and BDL are omitted as compared with the sense amplifier unit SAU according to the first embodiment. Specifically, each sense amplifier unit SAU includes a bit line connection unit BLHU, a sense amplifier SA, a latch circuit SDL, and a transistor DTR.

The sense amplifier module 14 provided in the semiconductor storage device 1 according to the third embodiment further includes a data latch set DLS. The data latch set DLS includes data latch units DLU<0> to DLU<m−1>. For example, each data latch unit DLU includes latch circuits ADL and BDL. Each of the latch circuits ADL and BDL provided in each data latch unit DLU is connected to an associated bus DBUS. The data latch units DLU<0> to DLU<m−1> are respectively associated with the latch circuits XDL<0> to XDL<m−1>.

The data latch unit DLU<0> can transmit and receive data to and from each of the sense amplifier unit SAUa<0> and the sense amplifier unit SAUb<0> via an associated bus DBUS. Similarly, other data latch units DLU can transmit and receive data to and from each of the sense amplifier units SAUa and SAUb via associated buses DBUS. For example, when a block BLK in the memory cell array 10a executes a selected operation, the sequencer 13 respectively controls signals DSWa and DSWb to an "H" level and an "L" level. Similarly, when a block BLK in the memory cell array 10b executes a selected operation, the sequencer 13 respectively controls the control signals DSWa and DSWb to an "L" level and an "H" level.

3.2 Planar Layout of Sense Amplifier Region SR

Figure 22:
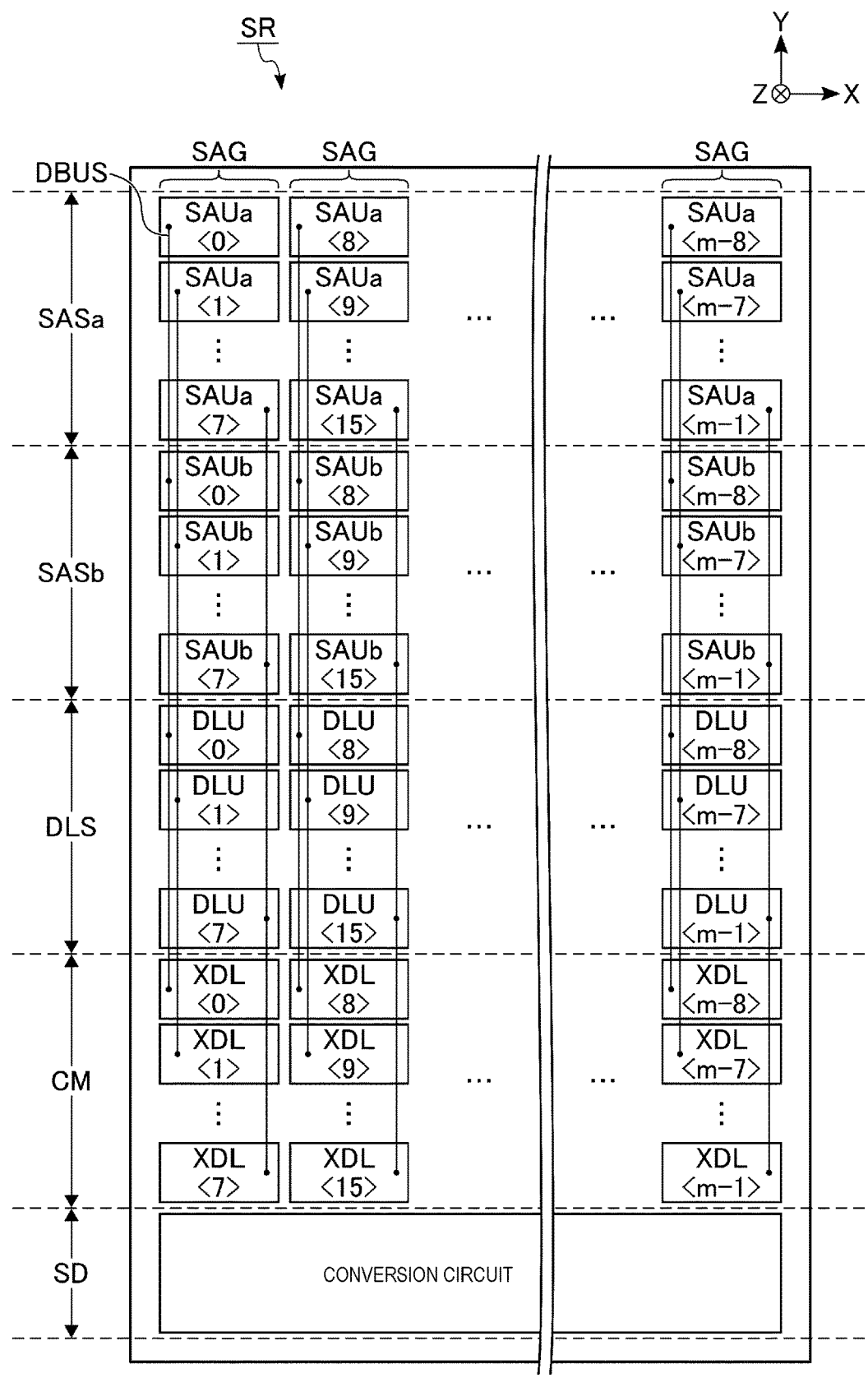
FIG. 22 is a plan view showing an example of a planar layout of a sense amplifier region in a CMOS chip provided in the semiconductor storage device according to the third embodiment.

FIG. 22 shows an example of a planar layout of the sense amplifier region SR in a CMOS chip CC provided in the semiconductor storage device 1 according to the third embodiment. As shown in FIG. 22, in the sense amplifier region SR, sense amplifier sets SASa and SASb, a data latch set DLS, a cache memory CM, and a conversion circuit SD are separately provided in regions extending in the X direction, and are arranged in order in the Y direction. In a region of the data latch set DLS, for example, multiple sets, each including eight data latch units DLU arranged in the Y direction, are arranged in the X direction.

Specifically, the data latch units DLU<0> to DLU<7> are arranged in the Y direction in the vicinity of the transfer region XR1. The data latch units DLU<8> to DLU<15> are respectively provided adjacent to the data latch units DLU<0> to DLU<7>. The data latch units DLU<16> to DLU<23> . . . data latch units DLU <m−8> to DLU<m−1> are provided in the same manner. In the semiconductor storage device 1 according to the third embodiment, a sense amplifier group SAG includes sense amplifier units SAUa and SAUb, data latch units DLU, and latch circuits XDL.

Figure 23:
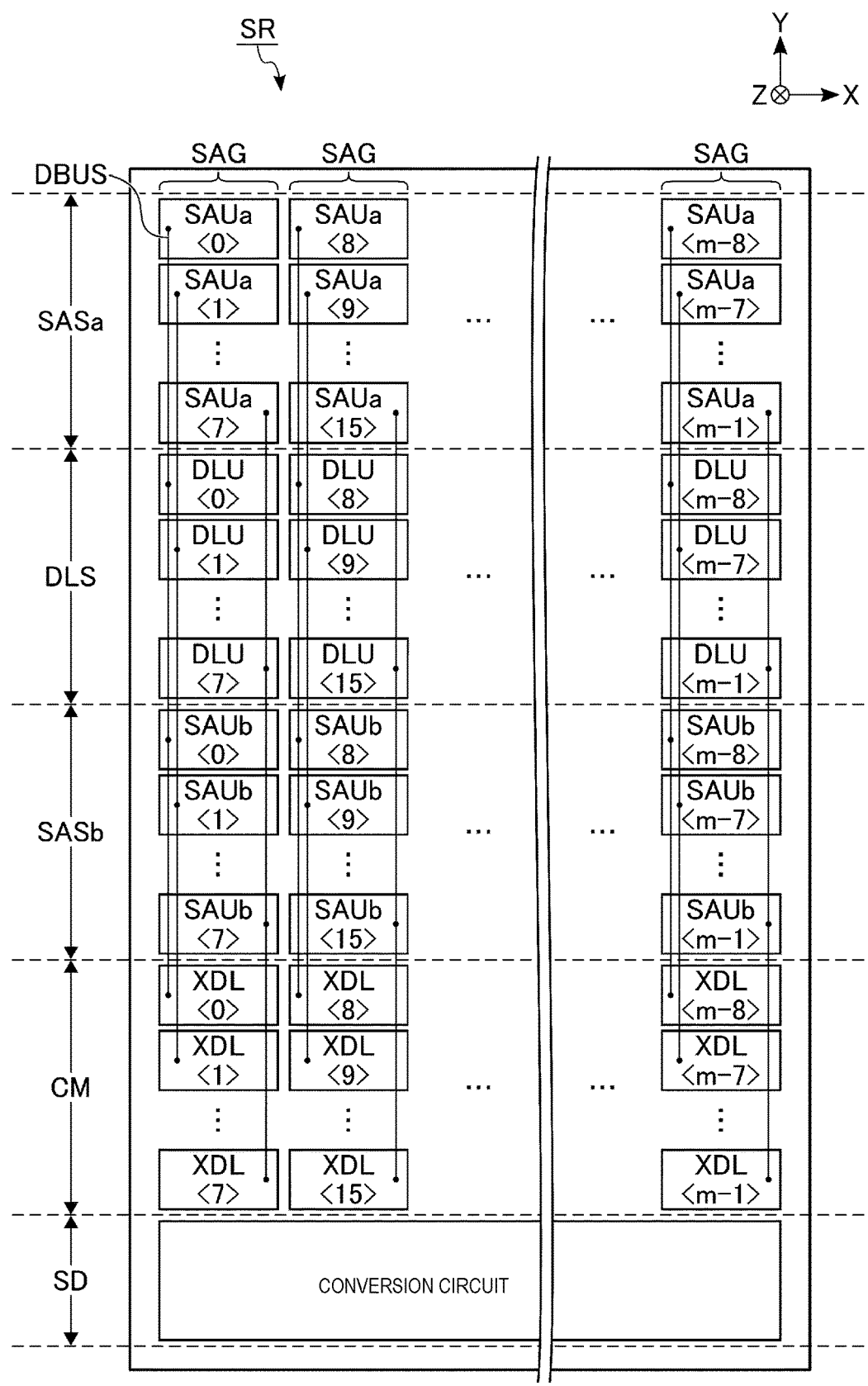
FIG. 23 is a plan view showing an example of a planar layout of a sense amplifier region in a CMOS chip provided in a semiconductor storage device according to a modification of the third embodiment.

The data latch set DLS may be provided between the sense amplifier units SAUa and SAUb. FIG. 23 shows an example of a planar layout of a sense amplifier region SR in a CMOS chip CC provided in the semiconductor storage device 1 according to a modification of the third embodiment. As shown in FIG. 23, in the sense amplifier region SR, the sense amplifier set SASa, the data latch set DLS, the sense amplifier set SASb, a cache memory CM, and a conversion circuit SD are separately provided in regions extending in the X direction, and are arranged in order in the Y direction. As described above, the sense amplifier units SAU, the data latch units DLU, and the latch circuits XDL that are provided in the sense amplifier group SAG may be at least communicably connected to each other. Other configurations of the semiconductor storage device 1 according to the third embodiment are the same as those in the first embodiment.

3.3 Effect of Third Embodiment

As described above, the sense amplifier units SAU that share a bus DBUS share a part of the latch circuits ADL and BDL in the semiconductor storage device 1 according to the third embodiment. Accordingly, an area occupied by the latch circuits in the sense amplifier region SR can be reduced in the semiconductor storage device 1 according to the third embodiment. Therefore, a chip area in the semiconductor storage device 1 according to the third embodiment can be reduced as compared with the first embodiment, and manufacturing costs of the semiconductor storage device 1 can be reduced.

4. Fourth Embodiment

The semiconductor storage device 1 according to the fourth embodiment has a configuration in which an amplifier circuit different from the sense amplifier SA is added to the semiconductor storage device 1 according to the third embodiment. Hereinafter, differences of the semiconductor storage device 1 according to the fourth embodiment from the semiconductor storage device 1 according to the first to third embodiments will be described.

4.1 Circuit Configuration of Sense Amplifier Module 14

Figure 24:
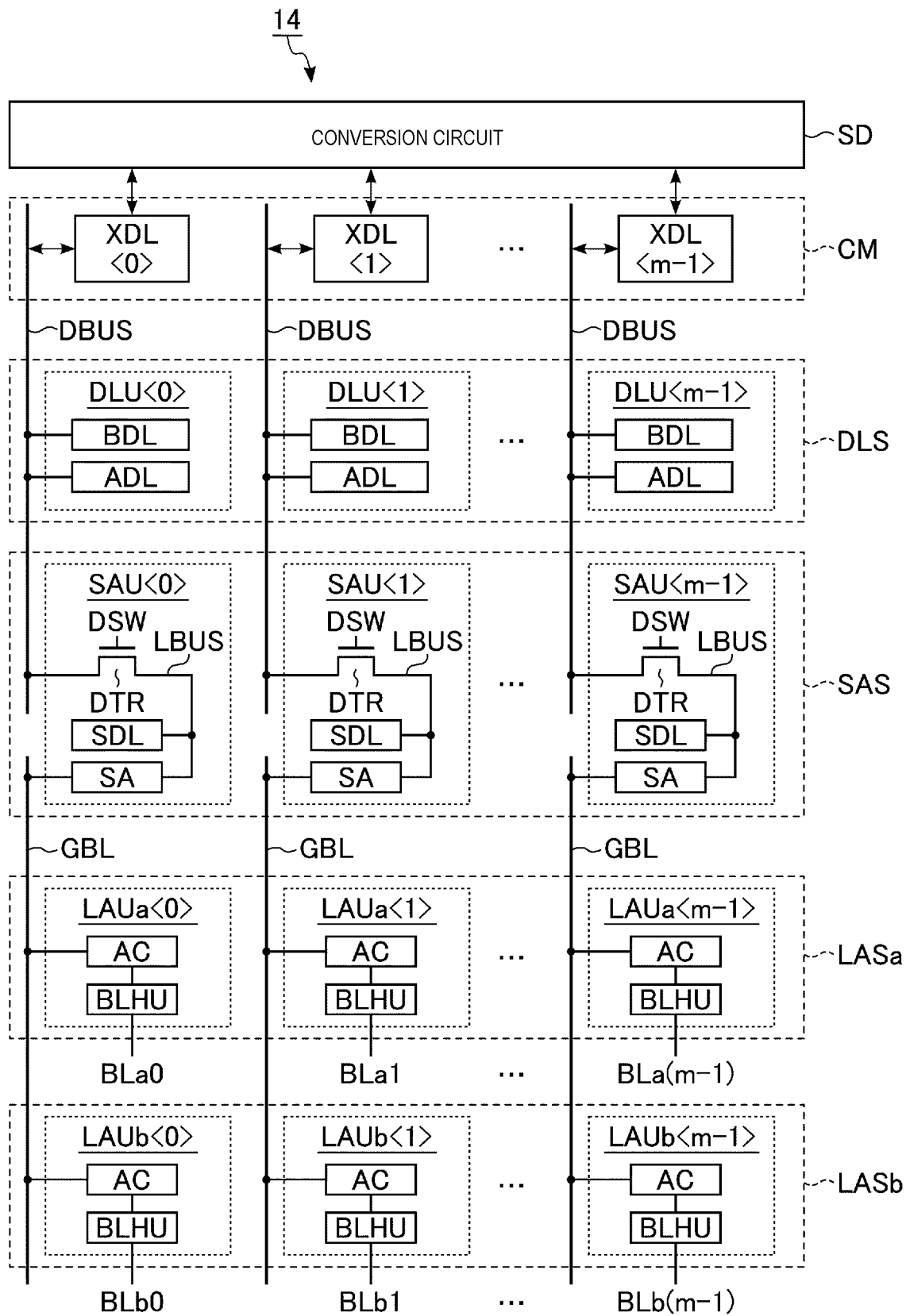
FIG. 24 is a circuit diagram showing an example of a circuit configuration of a sense amplifier module provided in a semiconductor storage device according to a fourth embodiment.

FIG. 24 shows an example of a circuit configuration of the sense amplifier module 14 provided in the semiconductor storage device 1 according to the fourth embodiment. As shown in FIG. 24, the sense amplifier module according to the fourth embodiment includes a sense amplifier set SAS, a data latch set DLS, a cache memory CM, a conversion circuit SD, and local amplifier sets LASa and LASb. In the sense amplifier module 14 according to the fourth embodiment, a plurality of global bit lines GBL are provided corresponding to a plurality of buses DBUS, respectively. Configurations of the data latch set DLS, the cache memory CM, and the conversion circuit SD are the same as those in the third embodiment or the like.

In the semiconductor storage device 1 according to the fourth embodiment, each sense amplifier unit SAU has a configuration in which a bit line connection unit BLHU is omitted as compared with the sense amplifier unit SAU according to the third embodiment. Sense amplifier units SAU<0> to SAU<m−1> are respectively connected to latch circuits XDL<0> to XDL<m−1> via buses DBUS. In the semiconductor storage device 1 according to the fourth embodiment, a sense amplifier SA in a sense amplifier unit SAU is connected to a global bit line GBL instead of a bit line connection unit BLHU.

The local amplifier sets LASa and LASb are respectively associated with the memory cell arrays 10a and 10b. The local amplifier set LASa includes local amplifier units LAUa<0> to LAUa<m−1>. The local amplifier set LASb includes local amplifier units LAUb<0> to LAUb<m−1>. Each local amplifier module LAU includes an amplifier circuit AC and a bit line connection unit BLHU.

The amplifier circuit AC in each local amplifier unit LAU is connected to an associated global bit line GBL. Each amplifier circuit AC is connected to an associated bit line BL via the bit line connection unit BLHU. Specifically, respective bit line connection units BLHU of the local amplifier modules LAUa<0> to LAUa<m−1> are respectively connected to bit lines BLa0 to BLa(m−1). Respective bit line connection units BLHU of the local amplifier units LAUb<0> to LAUb<m−1> are respectively connected to bit lines BLb0 to BLb(m−1). In this manner, a plurality of local amplifier units LAU are connected to each global bit line GBL.

Figure 25:
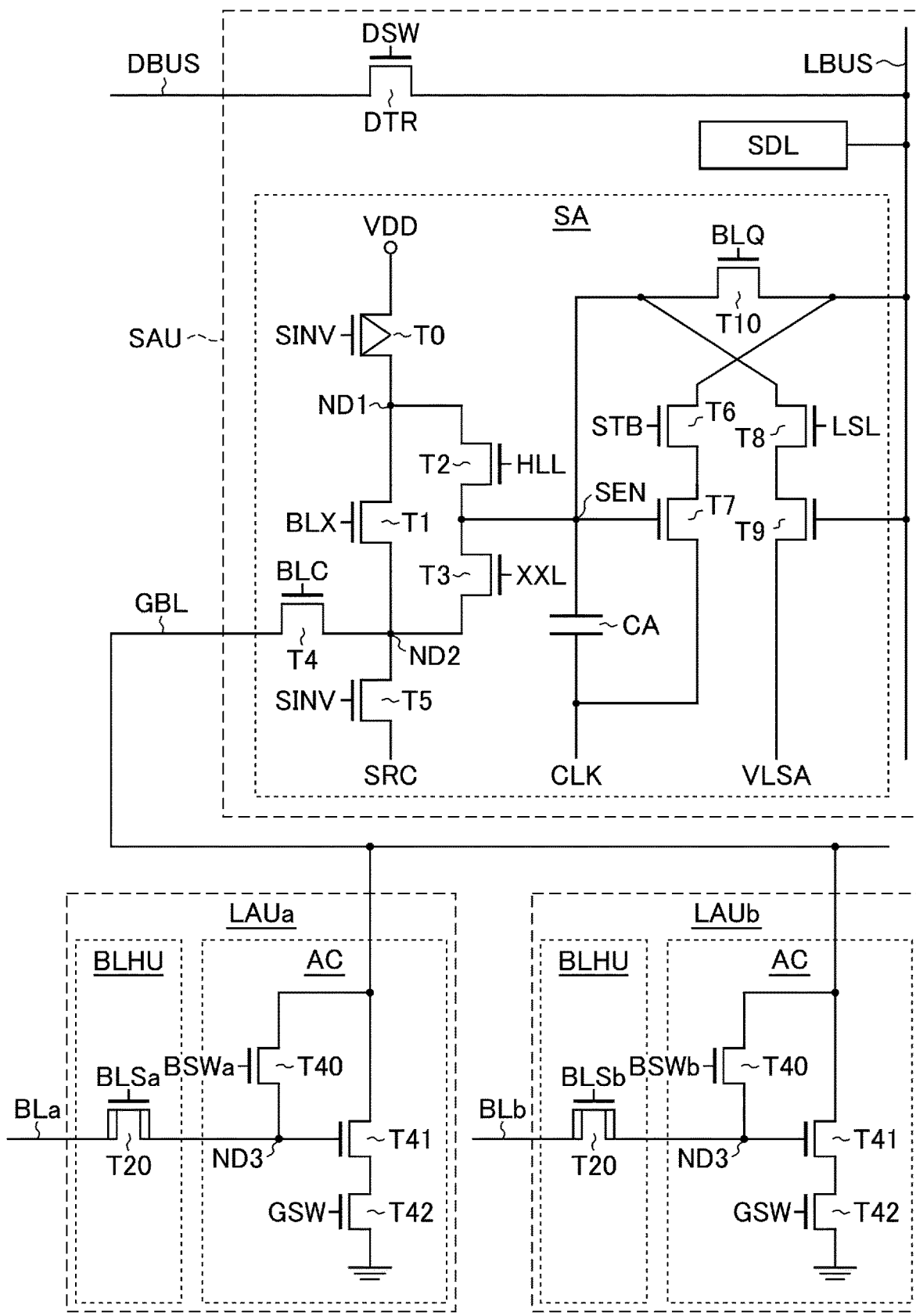
FIG. 25 is a circuit diagram showing an example of a circuit configuration of a sense amplifier unit and a local amplifier unit in the semiconductor storage device according to the fourth embodiment.

FIG. 25 shows an example of a detailed circuit configuration of the sense amplifier SA and the local amplifier unit LAU in the semiconductor storage device 1 according to the fourth embodiment. The transistor T21 in the bit line connection unit BLHU is omitted in FIG. 25. As shown in FIG. 25, the circuit configuration of the sense amplifier SA is similar to the circuit configuration of the sense amplifier SA according to the first embodiment except that the global bit line GBL is connected to the transistor T4. The local amplifier units LAUa and LAUb have a similar configuration. For example, each local amplifier unit LAU includes transistors T40 to T42. The transistors T40 to T42 are, for example, n-type MOS transistors.

In each local amplifier unit LAU, a drain of the transistor T40 is connected to the global bit line GBL. A source of the transistor T40 is connected to a node ND3. A drain of the transistor T41 is connected to the global bit line GBL. A gate of the transistor T41 is connected to the node ND3. A drain of the transistor T42 is connected to a source of the transistor T41. A source of the transistor T42 is grounded. A control signal GSW is input into a gate of the transistor T42.

A control signal BSWa is input into a gate of the transistor T40 in the local amplifier unit LAUa. The node ND3 in the local amplifier unit LAUa is connected to the bit line BLa via the transistor T20 to which a control signal BLSa is input. Similarly, a control signal BSWb is input into a gate of the transistor T40 in the local amplifier unit LAUb. The node ND3 in the local amplifier unit LAUb is connected to the bit line BLb via the transistor T20 to which a control signal BLSb is input.

In the circuit configuration of the sense amplifier unit SAU described above, the control signals BSWa, BSWb, GSW, BLSa, and BLSb are generated by, for example, the sequencer 13. Control signals in the local amplifier units LAUa and LAUb may be appropriately shared as long as operations to be described later can be executed.

4.2 Planar Layout of Sense Amplifier Region SR

Figure 26:
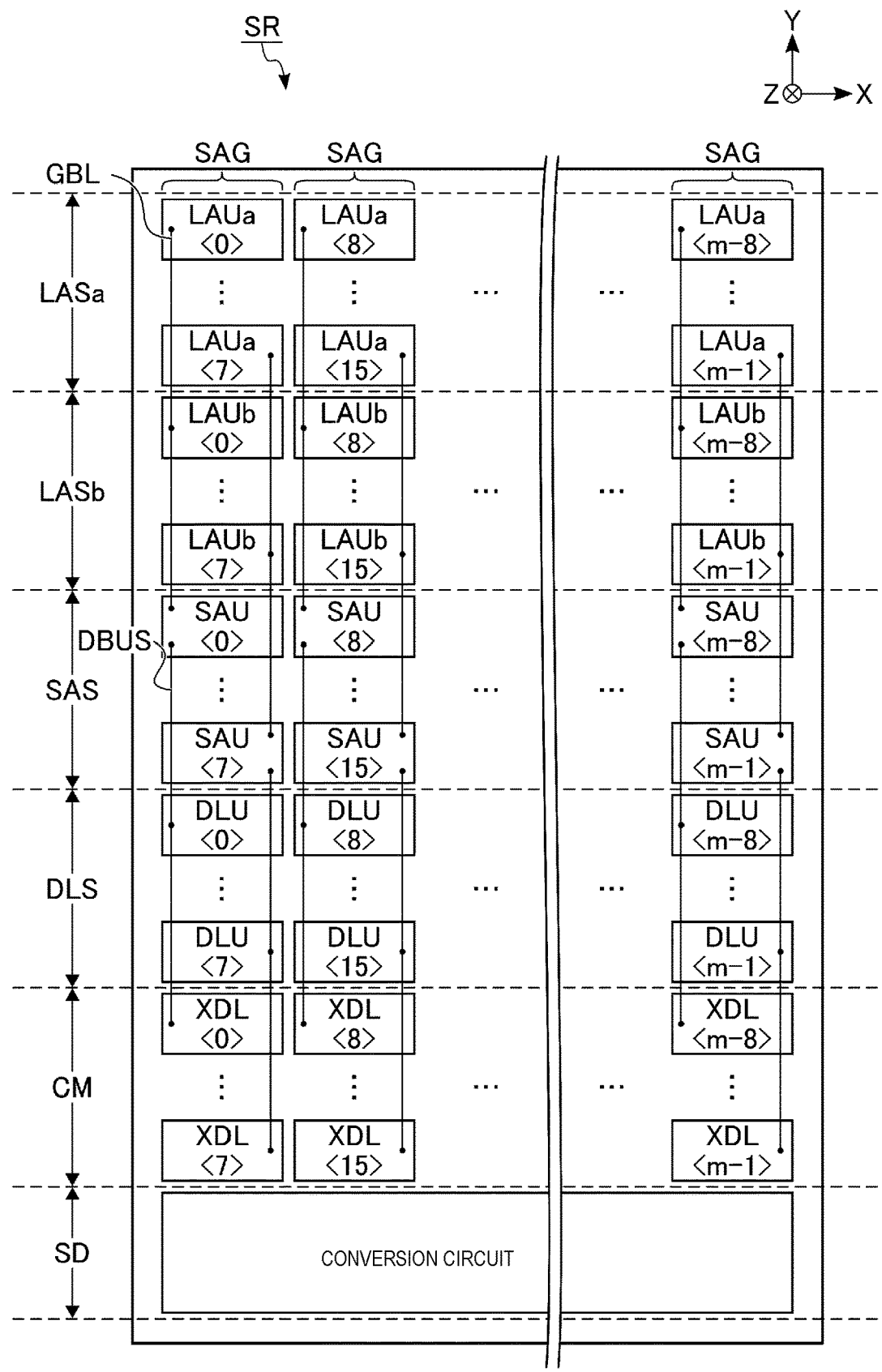
FIG. 26 is a plan view showing an example of a planar layout of a sense amplifier region in a CMOS chip provided in the semiconductor storage device according to the fourth embodiment.

FIG. 26 shows an example of a planar layout of a sense amplifier region SR in a CMOS chip CC provided in the semiconductor storage device 1 according to the fourth embodiment. As shown in FIG. 26, in the sense amplifier region SR, local amplifier sets LASa and LASb, a sense amplifier set SAS, a data latch set DLS, a cache memory CM, and a conversion circuit SD are separately provided in regions extending in the X direction, and are arranged in order in the Y direction.

In a region of the local amplifier set LASa, for example, multiple sets, each including eight local amplifier units LAUa arranged in the Y direction, are arranged in the X direction. Specifically, the local amplifier units LAUa<0> to LAUa<7> are arranged in the Y direction in the vicinity of the transfer region XR1. The local amplifier units LAUa<8> to LAUa<15> bare respectively provided adjacent to the local amplifier units LAUa<0> to LAUa<7>. The local amplifier units LAUa<16> to LAUa<23> . . . local amplifier units LAUa<m-8> to LAUa<m-1> are arranged in the same manner.

In a region of the local amplifier set LASb, for example, multiple sets, each including eight local amplifier units LAUb arranged in the Y direction, are arranged in the X direction. Specifically, the local amplifier units LAUb<0> to LAUb<7> are arranged in the Y direction in the vicinity of the transfer region XR1. The local amplifier units LAUb<8> to LAUb<15> are respectively provided adjacent to the local amplifier units LAUb<0> to LAUb<7>. The local amplifier units LAUb<16> to LAUb<23> . . . local amplifier units LAUb<m-8> to LAUb<m-1> are arranged in the same manner.

Arrangements of sense amplifier units SAU in the sense amplifier set SAS, data latch units DLU in the data latch set DLS, and latch circuits XDL in the cache memory CM are the same as those in the third embodiment. In the semiconductor storage device 1 according to the fourth embodiment, a sense amplifier group SAG includes local amplifier units LAUa and LAUb, sense amplifier units SAU, data latch units DLU, and latch circuits XDL.

In a region overlapping each sense amplifier group SAG, a plurality of global bit lines GBL each having a portion extending in the Y direction are provided corresponding to the number of the local amplifier units LAUa and LAUb. In the semiconductor storage device 1 according to the fourth embodiment, a pitch of a global bit line GBL is, for example, the same as a pitch of a bit line BL. The sense amplifier units SAU, the data latch units DLU, and the latch circuits XDL provided in a sense amplifier group SAG may at least communicably connected with each other. Other configurations of the semiconductor storage device 1 according to the fourth embodiment are the same as those in the first embodiment.

4.3 Operation of Semiconductor Storage Device 1

Figure 27:
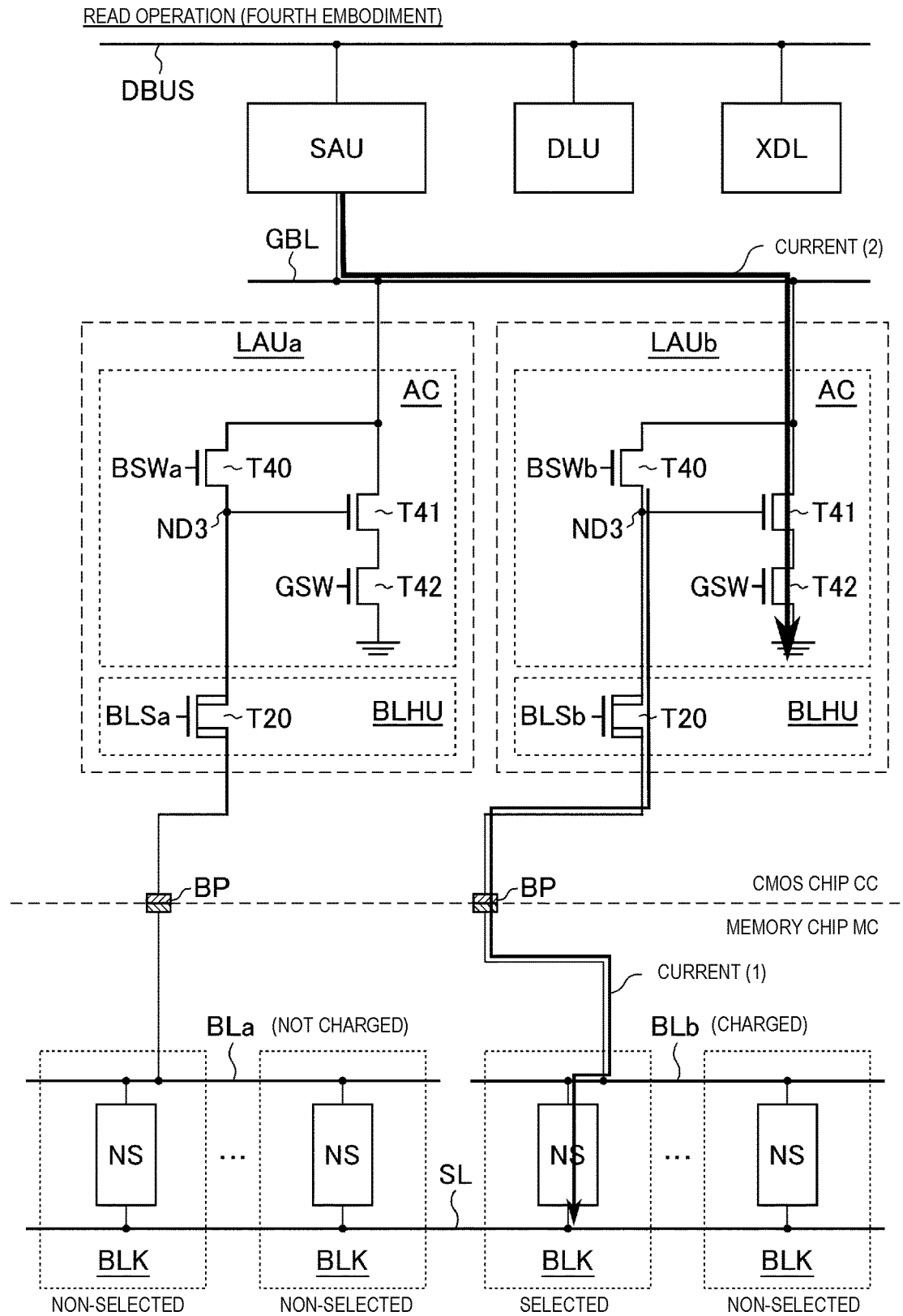
FIG. 27 is a circuit diagram schematically showing a read operation of the semiconductor storage device according to the fourth embodiment.

FIG. 27 shows a configuration related to the local amplifier units LAUa and LAUb connected to a common global bit line GBL and an example of a current path during a read operation in the semiconductor storage device 1 according to the fourth embodiment. As shown in FIG. 27, in the read operation of the semiconductor storage device 1 according to the fourth embodiment, the sequencer 13 charges a bit line BL connected to a NAND string NS provided in a selected block BLK, and does not charge a bit line BL connected only to a NAND string NS provided in a non-selected block BLK in the same manner as in the first embodiment. Then, the sequencer 13 amplifies a read current using a local amplifier unit LAU.

Specifically, when a block BLK including a NAND string NS connected to the bit line BLb is selected, first, the sequencer 13 controls the transistors T20 and T40 in the local amplifier unit LAUb to an ON state. Then, the sense amplifier unit SAU charges the bit line BLb via the local amplifier unit LAUb. Thereafter, the sequencer 13 controls the transistor T40 in the local amplifier unit LAUb to an OFF state, and applies a read voltage to a selected word line WL.

Then, a voltage of the node ND3 in the local amplifier unit LAUb is changed based on a state of a selected memory cell transistor MT. Specifically, when the selected memory cell transistor MT is in an ON state, a current (1) flows from the node ND3 toward a source line SL through the memory cell transistor MT. As a result, the voltage at the node ND3 is decreased to an "L" level. On the other hand, when the selected memory cell transistor MT is in an OFF state, the voltage of the node ND3 is maintained at an "H" level.

Thereafter, the sequencer 13 sets the control signal GSW to an "H" level. When a voltage of an "H" level is applied to a gate of the transistor T42, the transistor T41 in the local amplifier unit LAUb is in an ON state or in an OFF state based on the voltage of the node ND3. When the voltage of the node ND3 is at an "H" level, a current (2) flows from the sense amplifier unit SAU toward a ground line through the transistors T41 and T42 in the local amplifier unit LAUb, and a voltage of the global bit line GBL is decreased. On the other hand, when the voltage of the node ND3 is at an "L" level, the global bit line GBL is maintained at a high voltage.

Accordingly, the sense amplifier unit SAU can determine read data of a selected memory cell transistor MT based on a voltage of the global bit line GBL. An operation when a block BLK corresponding to another bit line BL is selected is the same as the operation when the block BLK corresponding to the bit line BLb is selected.

Hereinafter, a read operation of the semiconductor storage device 1 according to the fourth embodiment will be described in detail. Hereinafter, a selected word line WL is referred to as WLsel. A selected bit line BL and a non-selected bit line BL are respectively referred to as BLsel and BLusel. A control signal BSW input into the transistor T40 in a local amplifier unit LAU connected to a bit line BLsel is referred to as BSWsel. A control signal BSW input into the transistor T40 in a local amplifier unit LAU connected to a bit line BLusel is referred to as BSWusel. A voltage applied to a word line WL is controlled by the driver module 15 and the row decoder module 16.

Figure 28:
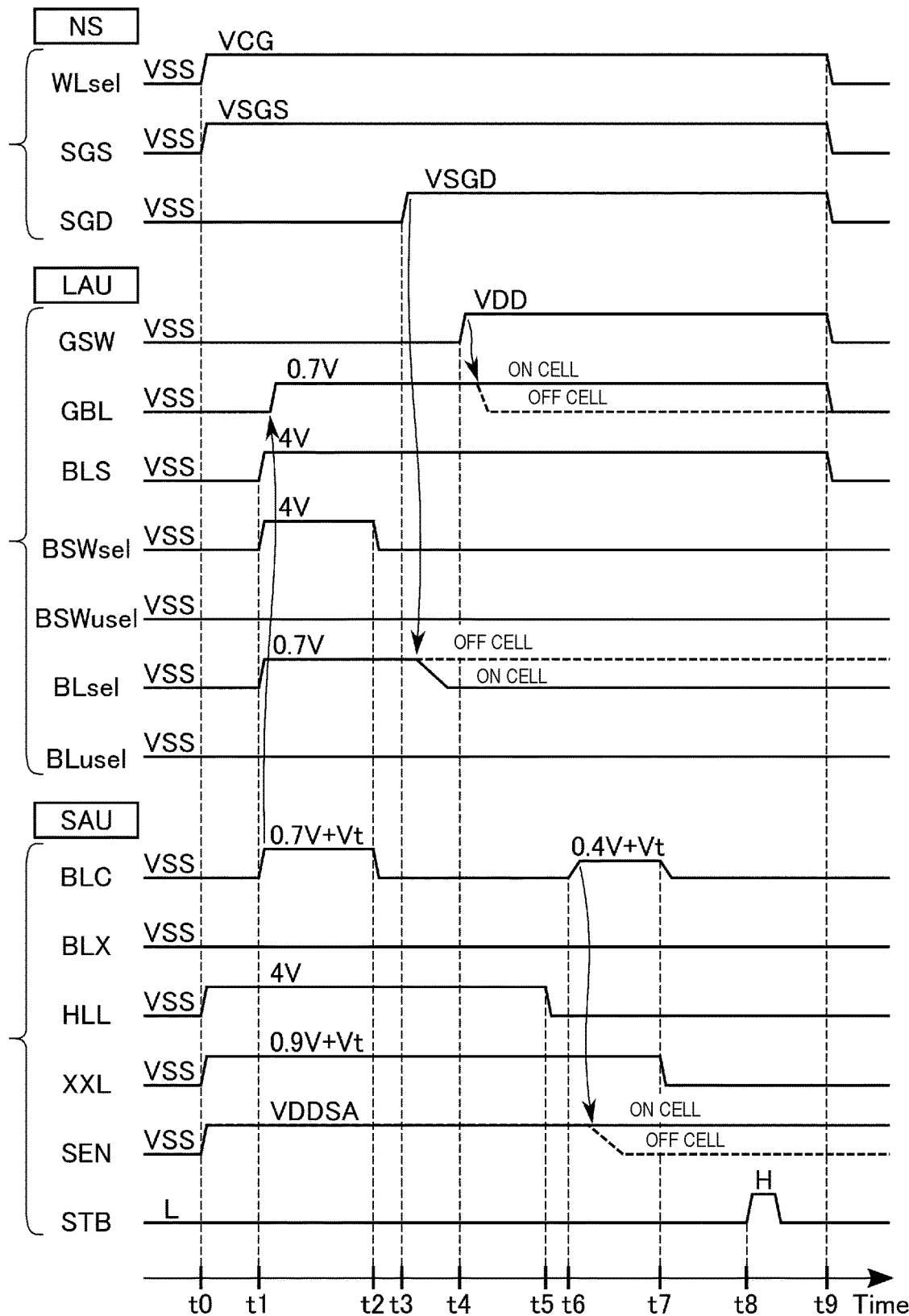
FIG. 28 is a timing chart showing an example of the read operation of the semiconductor storage device according to the fourth embodiment.

FIG. 28 shows an example of a timing chart of the read operation of the semiconductor storage device 1 according to the fourth embodiment, and shows changes of control signals and the like corresponding to a NAND string NS, a local amplifier unit LAU, and a sense amplifier unit SAU. As shown in FIG. 28, the sequencer 13 sequentially executes processes at time points t0 to t9 in the read operation. Voltages of control signals and wires before executing the read operation are, for example, VSS.

At the time point t0, VCG is applied to a word line WLsel and VSGS is applied to a select gate line SGS. VCG is a read voltage. VSGS is a voltage at which the select transistor ST2 can be turned on in the read operation. The sequencer 13 increases a voltage of a control signal HLL to, for example, 4 V, and increases a voltage of a control signal XXL to, for example, 0.9 V+Vt (where Vt corresponds to a threshold voltage of the transistor T3). Then, a node SEN is charged and a voltage of the node SEN is increased to VDDSA.

At the time point t1, the sequencer 13 increases a voltage of a control signal BLS to, for example, 4 V, increases a voltage of a control signal BSWsel to, for example, 4 V, and increases a voltage of a control signal BLC to, for example, 0.7 V+Vt (where Vt corresponds to a threshold voltage of the transistor T4). Then, the sequencer 13 increases a voltage of each of a bit line BLsel and a global bit line GBL to, for example, 0.7 V. On the other hand, a voltage of a control signal BSWusel is, for example, VSS in a local amplifier unit LAU connected to a bit line BLusel. Therefore, the transistor T40 connected to the bit line BLusel is maintained in an OFF state and a voltage of the bit line BLusel is maintained at VSS. In this manner, the bit line BLsel is charged and the bit line BLusel is not charged in an operation at the time point t1.

At the time point t2, the sequencer 13 reduces a voltage of the control signal BSWsel to VSS and reduces a voltage of the control signal BLC to VSS. Accordingly, a voltage of a node SEN in a sense amplifier unit SAU connected to the bit line BLsel is constant at VDDSA.

At the time point t3, VSGD is applied to a select gate line SGD. VSGD is a voltage at which the select transistor ST1 can be turned on in a read operation. When the select transistor ST1 is in an ON state, a voltage of a bit line BLsel is changed based on data stored in a selected memory cell transistor MT. Specifically, a voltage of a bit line BLsel connected to a memory cell transistor MT (an ON cell) that is turned on by VCG is decreased, and a voltage of a bit line BLsel connected to a memory cell transistor MT (an OFF cell) that is turned off by VCG is maintained at, for example, 0.7 V.

At the time point t4, the sequencer 13 increases a voltage of a control signal GSW to VDD. Then, in a local amplifier unit LAU connected to a bit line BLsel, the transistors T41 and T42 are in an ON state and a voltage of a global bit line GBL is decreased when a voltage of the bit line BLsel is, for example, 0.7 V. On the other hand, when the voltage of the bit line BLsel is, for example, VSS, the transistor T41 is maintained in an OFF state and the voltage of the global bit line GBL is maintained. In this manner, a voltage of a global bit line GBL connected to an ON cell is maintained and a voltage of a global bit line GBL connected to an OFF cell is decreased in an operation at the time point t4.

At the time point t5, the sequencer 13 reduces a voltage of a control signal HLL to VSS. Accordingly, charging of the node SEN via the transistors T0 and T2 is stopped.

At the time point t6, the sequencer 13 increases a voltage of a control signal BLC to 0.4 V+Vt (where Vt corresponds to a threshold voltage of the transistor T4). Then, a voltage of the node SEN is changed based on a voltage of a global bit line GBL. Specifically, since a global bit line GBL connected to an ON cell is maintained at a high voltage, a voltage of the node SEN is maintained at a high voltage. On the other hand, since a global bit line GBL connected to an OFF cell has a low voltage, a voltage of the node SEN is decreased.

At the time point t7, the sequencer 13 reduces a voltage of a control signal BLC to VSS, and reduces a voltage of a control signal XXL to VSS. Then, the transistors T3 and T4 are in an OFF state and a voltage of the node SEN is constant.

At the time point t8, the sequencer 13 asserts a control signal STB. That is, the sequencer temporarily increases a voltage of the control signal STB to an "H" level. Then, a voltage of a bus LBUS is changed based on a voltage of the node SEN. Specifically, since the node SEN connected to an ON cell is maintained at a high voltage, the transistor T7 is in an ON state and a voltage of the bus LBUS is decreased. Since the node SEN connected to an OFF cell has a low voltage, the transistor T7 is maintained in an OFF state and a voltage of the bus LBUS is maintained high. Then, the sequencer 13 stores data in any one of latch circuits in the sense amplifier module 14 based on a voltage value of the bus LBUS.

At the time point t9, voltages of a word line WLsel and select gate lines SGS and SGD are decreased to VSS. The sequencer 13 reduces voltages of control signals GSW and BLS to VSS.

The semiconductor storage device 1 according to the fourth embodiment can execute a read operation as described above. The sequencer 13 can also execute a write operation by appropriately charging either the bit line BLa or the bit line BLb in a similar manner to the read operation. In a write operation, the transistor T40 in a local amplifier unit LAU corresponding to a selected block BLK is controlled to an ON state. In various operations, the sequencer 13 may set a bit line BL connected to a NAND string NS provided in a non-selected block BLK to a floating state, or may apply a ground voltage VSS to the bit line BL using a sense amplifier unit SAU.

4.4 Effect of Fourth Embodiment

As described above, the semiconductor storage device 1 according to the fourth embodiment includes a plurality of local amplifier units LAU each including an amplifier circuit AC, and executes a two-stage read operation respectively using the local amplifier unit LAU and the sense amplifier unit SAU. Accordingly, the semiconductor storage device 1 according to the fourth embodiment can amplify a cell current in a read operation and improve accuracy of the read operation. Therefore, the semiconductor storage device 1 according to the fourth embodiment can obtain the same effect as the first embodiment, and can further reduce a read error.

5. Fifth Embodiment

The semiconductor storage device 1 according to the fifth embodiment has a configuration in which the number of local amplifier units LAU connected to a global bit line GBL is increased as compared with the semiconductor storage device 1 according to the fourth embodiment. Hereinafter, differences of the semiconductor storage device 1 according to the fifth embodiment from the semiconductor storage device 1 according to the first to fourth embodiments will be described.

5.1 Circuit Configuration of Sense Amplifier Module 14

Figure 29:
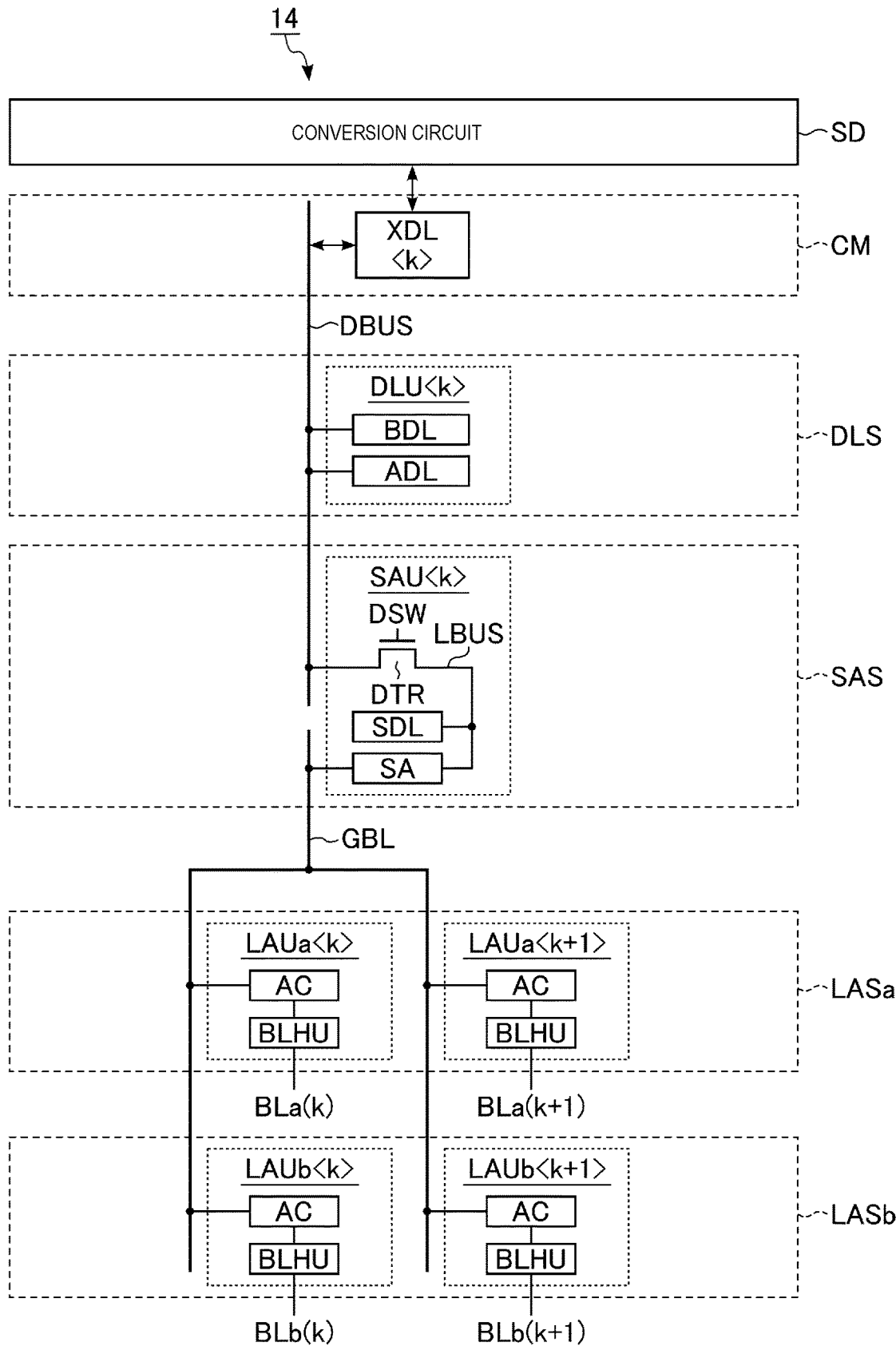
FIG. 29 is a circuit diagram showing an example of a circuit configuration of a sense amplifier module provided in a semiconductor storage device according to a fifth embodiment.

FIG. 29 shows an example of a circuit configuration of the sense amplifier module 14 provided in the semiconductor storage device 1 according to the fifth embodiment, and shows a configuration associated with one global bit line GBL. As shown in FIG. 29, the sense amplifier module 14 includes a latch circuit XDL<k> (k is an even number), a data latch unit DLU<k>, a sense amplifier unit SAU<k>, local amplifier units LAUa<k> and LAUa<k+1>, and local amplifier units LAUb<k> and LAUb<k+1>.

The latch circuit XDL<k> is connected to the data latch unit DLU<k> and the sense amplifier unit SAU<k> via a bus DBUS. A sense amplifier SA in the sense amplifier unit SAU<k> is connected to a global bit line GBL. The global bit line GBL is connected to corresponding amplifier circuits AC in the local amplifier units LAUa<k>, LAUa<k+1>, LAUb<k>, and LAUb<k+1>. That is, four local amplifier units LAU are connected to one global bit line GBL in the fifth embodiment. In the semiconductor storage device 1 according to the fifth embodiment, a pitch of the global bit line GBL may be larger than a pitch of a bit line BL.

Figure 30:
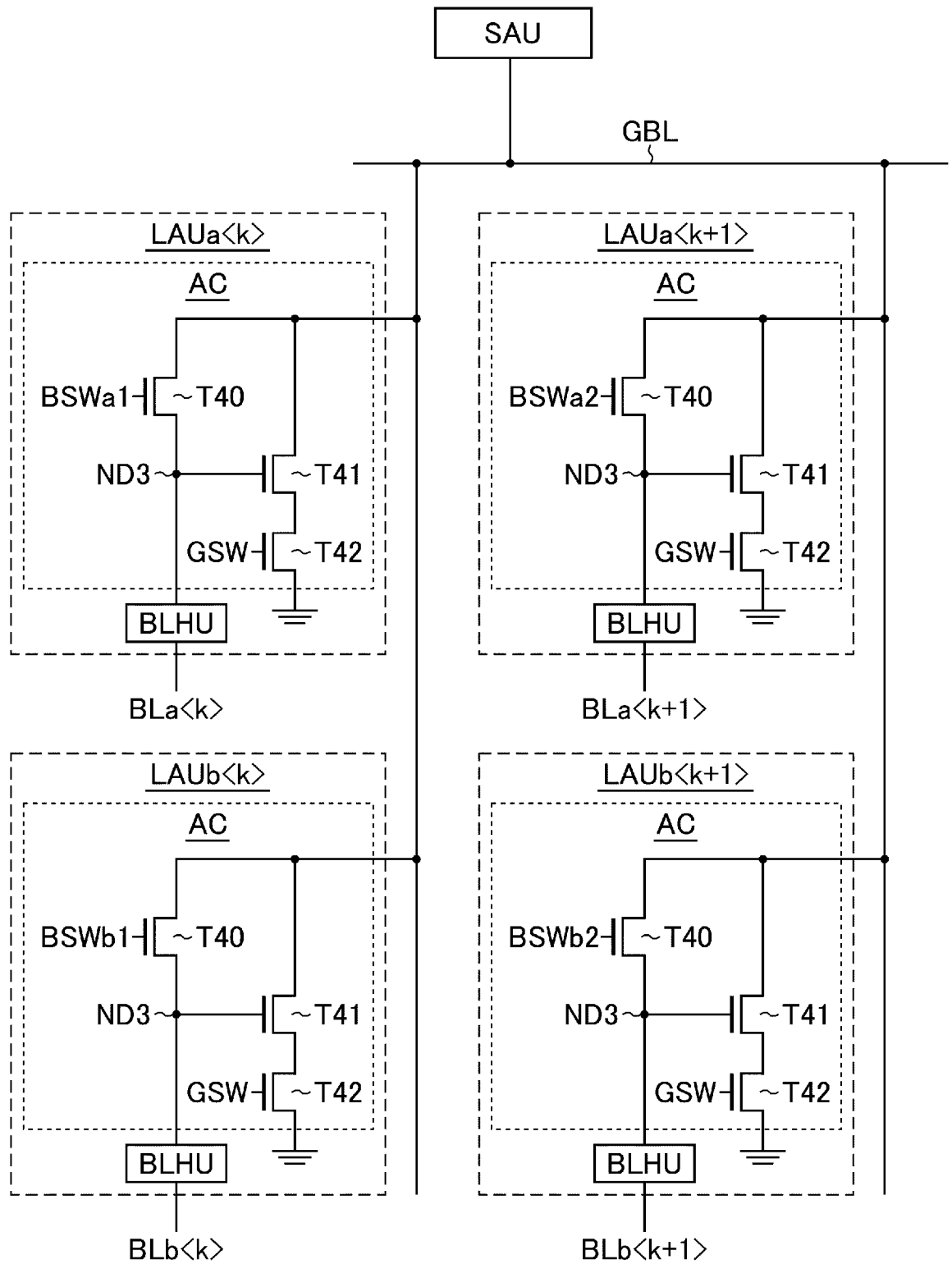
FIG. 30 is a circuit diagram showing an example of a circuit configuration of a local amplifier unit in the semiconductor storage device according to the fifth embodiment.

FIG. 30 shows an example of a detailed circuit configuration of the local amplifier units LAU in the semiconductor storage device 1 according to the fifth embodiment. As shown in FIG. 30, the circuit configuration of the local amplifier units LAU is the same as the circuit configuration of the local amplifier units LAU in the fourth embodiment. In the semiconductor storage device 1 according to the fifth embodiment, a control signal BSWa1 is input into a gate of the transistor T40 in the local amplifier unit LAUa<k>. A control signal BSWa2 is input into a gate of the transistor T40 in the local amplifier unit LAUa<k+1>. A control signal BSWb1 is input into a gate of the transistor T40 in the local amplifier unit LAUb<k>. A control signal BSWb2 is input into a gate of the transistor T40 in the local amplifier unit LAUb<k+1>. Other configurations of the semiconductor storage device 1 according to the fifth embodiment are the same as those in the fourth embodiment.

5.2 Effect of Fifth Embodiment

As described above, the semiconductor storage device 1 according to the fifth embodiment has a configuration in which more local amplifier units LAU are connected to a global bit line GBL as compared with the fourth embodiment. In such a case, the semiconductor storage device 1 according to the fifth embodiment can execute a read operation in a series manner for a plurality of bit lines BL sharing a global bit line GBL by, for example, independently controlling the local amplifier units LAU that shares the global bit line GBL. A pitch of a global bit line GBL in the semiconductor storage device 1 according to the fifth embodiment is larger than a pitch in the fourth embodiment. That is, a wire capacitance and wire resistance of the global bit lines GBL in the semiconductor storage device 1 according to the fifth embodiment can be reduced as compared with the fourth embodiment.

6. Sixth Embodiment

The semiconductor storage device 1 according to the sixth embodiment executes a read operation in a state in which a part of bit lines BL are shielded as compared with the semiconductor storage device 1 according to the fifth embodiment. Hereinafter, differences of the semiconductor storage device 1 according to the sixth embodiment from the semiconductor storage device 1 according to the first to fifth embodiments will be described.

6.1 Circuit Configuration of Sense Amplifier Module 14

Figure 31:
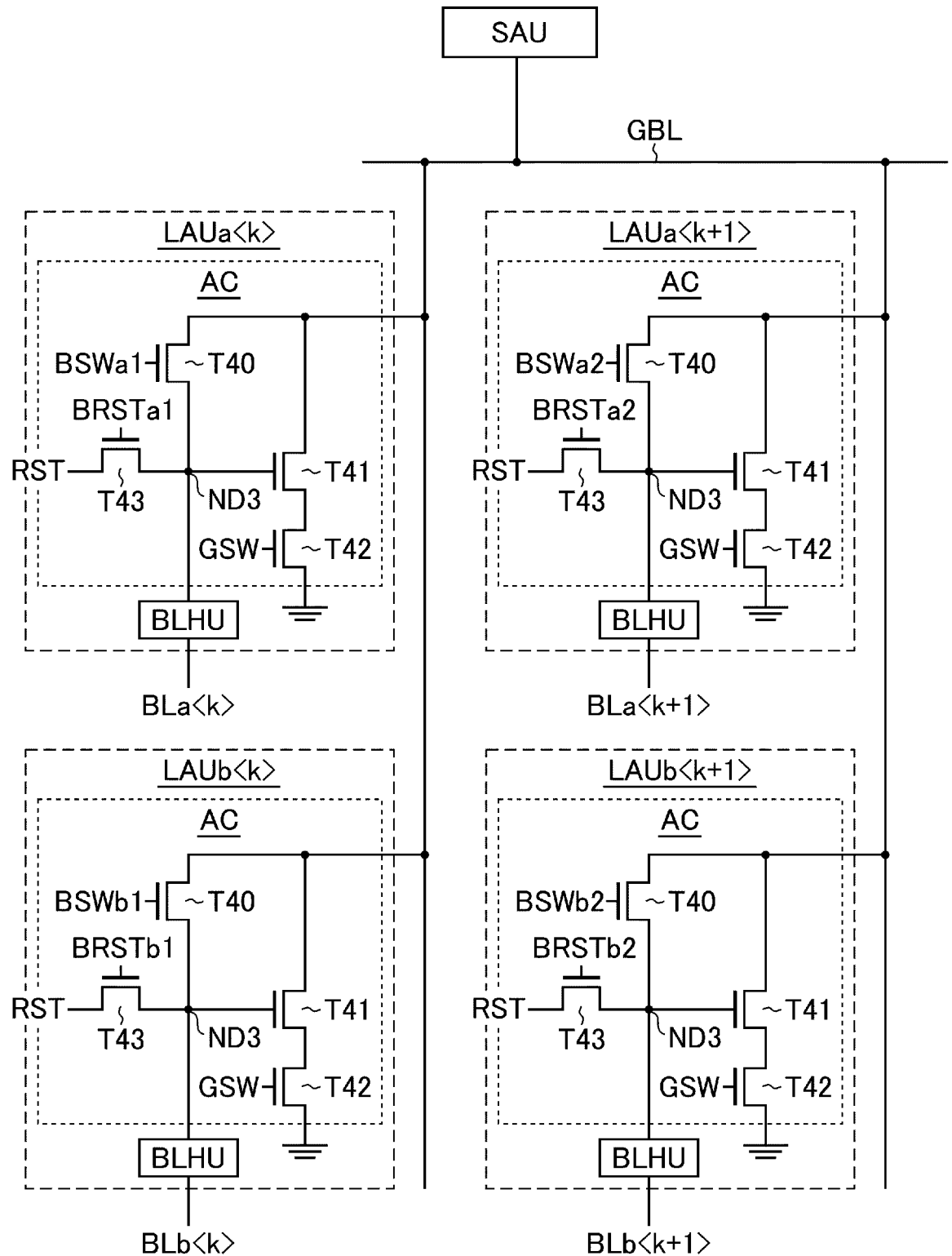
FIG. 31 is a circuit diagram showing an example of a detailed circuit configuration of a local amplifier unit in a semiconductor storage device according to a sixth embodiment.

FIG. 31 shows an example of a detailed circuit configuration of local amplifier units LAU in the semiconductor storage device 1 according to the sixth embodiment. As shown in FIG. 31, transistors 43 are added in the local amplifier units LAU according to the sixth embodiment as compared with the local amplifier units LAU according to the fifth embodiment.

Specifically, a drain of the transistor T43 is connected to a node ND3 in each local amplifier unit LAU. A source of the transistor T43 is connected to a node RST. A control signal BRSTa1 is input into a gate of the transistor T43 in a local amplifier unit LAUa<k>. A control signal BRSTa2 is input into a gate of the transistor T43 in a local amplifier unit LAUa<k+1>. A control signal BRSTb1 is input into a gate of the transistor T43 in a local amplifier unit LAUb<k>. A control signal BRSTb2 is input into a gate of the transistor T43 in a local amplifier unit LAUb<k+1>. Other configurations of the semiconductor storage device 1 according to the sixth embodiment are the same as those in the fifth embodiment.

6.2 Operation of Semiconductor Storage Device 1

Hereinafter, an operation of the semiconductor storage device 1 according to the sixth embodiment will be described. Hereinafter, a local amplifier unit LAU connected to an odd-numbered bit line BL is referred to as a local amplifier unit LAUo, and a local amplifier unit LAU connected to an even-numbered bit line BL is referred to as a local amplifier unit LAUe.

An operation of the semiconductor storage device 1 according to the sixth embodiment for a non-selected block BLK is the same as an operation in the fourth and fifth embodiments or the like. On the other hand, operations for a bit line BL connected to a selected block BLK are different between the local amplifier units LAUo and LAUe in the semiconductor storage device 1 according to the sixth embodiment. For example, in FIG. 31, when a block BLK to which a bit line BLa is connected is selected, a bit line BLa<k> is set to an active state (for example, a bit line BL to be read) and a bit line BLa<k+1> is set to a shielded state. On the other hand, a non-selected block BLK to which a bit line BLb is connected is set to a non-active state (for example, a state the same as the shielded state). The following description focuses on an operation for a bit line BL in an active state.

(Read Operation)

In a read operation of the semiconductor storage device 1 according to the sixth embodiment, the sequencer charges a bit line BL connected to a NAND string NS provided in a selected block BLK, and does not charge a bit line BL connected only to a NAND string NS provided in a non-selected block BLK in the same manner as in the fourth embodiment. In the semiconductor storage device 1 according to the sixth embodiment, the bit lines BL are divided into a group including odd-numbered bit lines BL and a group including even-numbered bit lines BL, and the sequencer 13 executes the read operation for each group of the bit lines BL.

Figure 32:
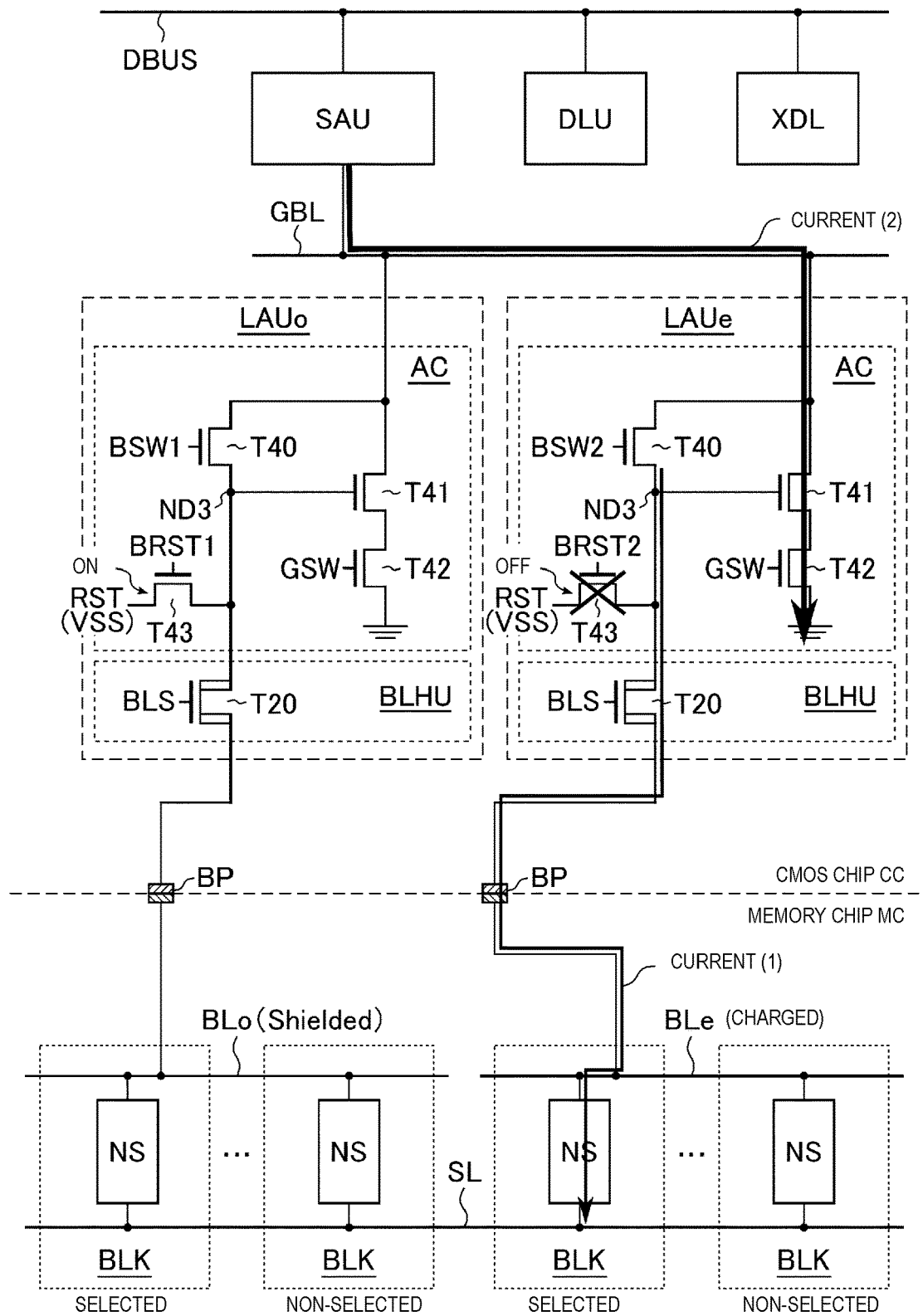
FIG. 32 is a circuit diagram schematically showing a read operation of the semiconductor storage device according to the sixth embodiment.

FIG. 32 shows a configuration related to the local amplifier units LAUo and LAUe connected to a common global bit line GBL and shows an example of a current path during a read operation in the semiconductor storage device 1 according to the sixth embodiment. In the read operation, the sequencer 13 shields an even-numbered bit line BL when a memory cell transistor MT connected to an odd-numbered bit line BL is selected, and shields an odd-numbered bit line BL when a memory cell transistor MT connected to an even-numbered bit line BL is selected as shown in FIG. 32.

Specifically, the sequencer 13 sets a voltage of a node RST to VSS. Then, the sequencer 13 controls the transistor T43 in a local amplifier unit LAU corresponding to a shielded bit line BL to an ON state, and controls the transistor T43 in a local amplifier unit LAU corresponding to a bit line BL connected to a selected memory cell transistor MT to an OFF state. Thereafter, the sequencer 13 maintains the states and proceeds the read operation. Other steps in the read operation of the semiconductor storage device 1 according to the sixth embodiment are the same as those in the fourth and fifth embodiments.

(Write Operation)

In a write operation of the semiconductor storage device 1 according to the sixth embodiment, the sequencer charges a bit line BL connected to a NAND string NS provided in a selected block BLK, and does not charge a bit line BL connected only to a NAND string NS provided in a non-selected block BLK in the same manner as in the fourth embodiment. In the semiconductor storage device 1 according to the sixth embodiment, the bit lines BL are divided into a group including odd-numbered bit lines BL and a group including even-numbered bit lines BL, and the sequencer 13 executes the write operation for each group of the bit lines BL.

Figure 33:
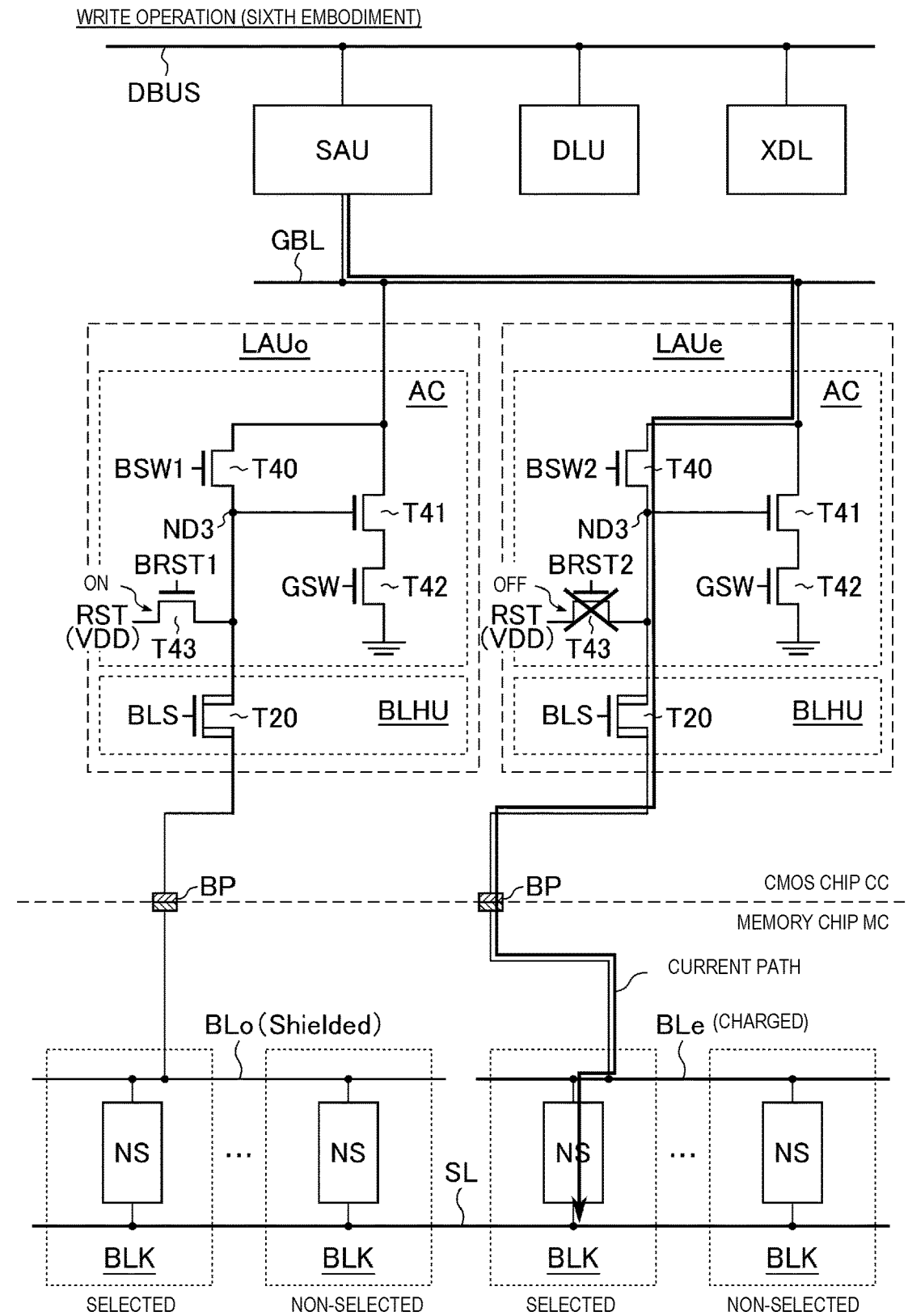
FIG. 33 is a circuit diagram schematically showing a write operation of the semiconductor storage device according to the sixth embodiment.

FIG. 33 shows a configuration related to the local amplifier units LAUo and LAUe connected to a common global bit line GBL and an example of a current path during a write operation in the semiconductor storage device 1 according to the sixth embodiment. As shown in FIG. 33, the sequencer sets a voltage of the node RST to VDD in the write operation. Then, the sequencer 13 controls the transistor T43 in a local amplifier unit LAU corresponding to a shielded bit line BL to an ON state, and controls the transistor T43 in a local amplifier unit LAU corresponding to a bit line BL connected to a selected memory cell transistor MT to an OFF state.

Accordingly, the select transistor ST1 connected to the shielded bit line BL provided in the selected block BLK is in an OFF state, and a channel in a NAND string NS is in a floating state. On the other hand, the select transistor ST1 provided in the selected block BLK and connected to a bit line BL to be written is in an ON state when a voltage corresponding to write data (for example, "0" data) is applied to the bit line BL, and the select transistor ST1 is in an OFF state when a voltage corresponding to non-write data (for example, "1" data) is applied to the bit line BL. Thereafter, the sequencer 13 appropriately maintains these states and proceeds the write operation. Other steps in the write operation of the semiconductor storage device 1 according to the sixth embodiment are the same as those in the fourth and fifth embodiments.

6.3 Effect of Sixth Embodiment

As described above, the semiconductor storage device according to the sixth embodiment can execute a read operation in which a part of the bit lines BL are shielded. Accordingly, the semiconductor storage device 1 according to the sixth embodiment can reduce noise generated in the bit lines BL in the read operation. Therefore, the semiconductor storage device 1 according to the sixth embodiment can obtain the same effect as the fifth embodiment, and can further reduce a read error.

7. Seventh Embodiment

The semiconductor storage device 1 according to the seventh embodiment has a configuration in which an amplifier circuit AC is replaced with a local sense amplifier as compared with the semiconductor storage device 1 according to the fourth embodiment. Hereinafter, differences of the semiconductor storage device 1 according to the seventh embodiment from the semiconductor storage device 1 according to the first to sixth embodiments will be described.

7.1 Circuit Configuration of Sense Amplifier Module 14

Figure 34:
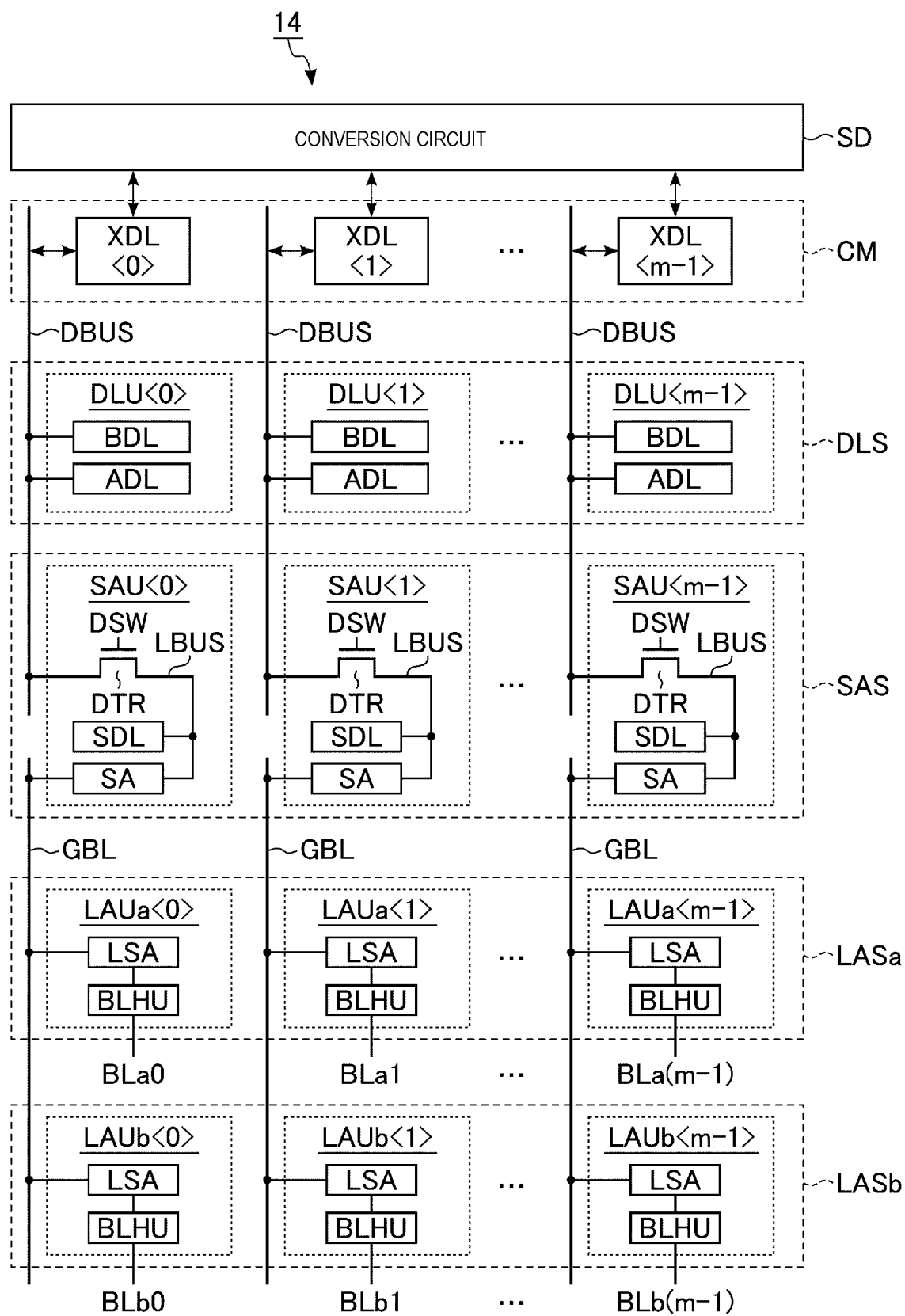
FIG. 34 is a circuit diagram showing an example of a circuit configuration of a sense amplifier module provided in a semiconductor storage device according to a seventh embodiment.

FIG. 34 shows an example of a circuit configuration of the sense amplifier module 14 provided in the semiconductor storage device 1 according to the seventh embodiment. As shown in FIG. 34, the sense amplifier module 14 according to the seventh embodiment has the same circuit configuration as the sense amplifier module 14 shown in FIG. 24 according to the fourth embodiment. A local amplifier unit LAU according to the seventh embodiment has a configuration in which the amplifier circuit AC according to the fourth embodiment is replaced with a local sense amplifier LSA. Similar to the fourth embodiment, the local sense amplifier LSA is connected between a global bit line GBL and a bit line connection unit BLHU. In the semiconductor storage device 1 according to the seventh embodiment, a pitch of a global bit line GBL is the same as, for example, a pitch of a bit line BL.

Figure 35:
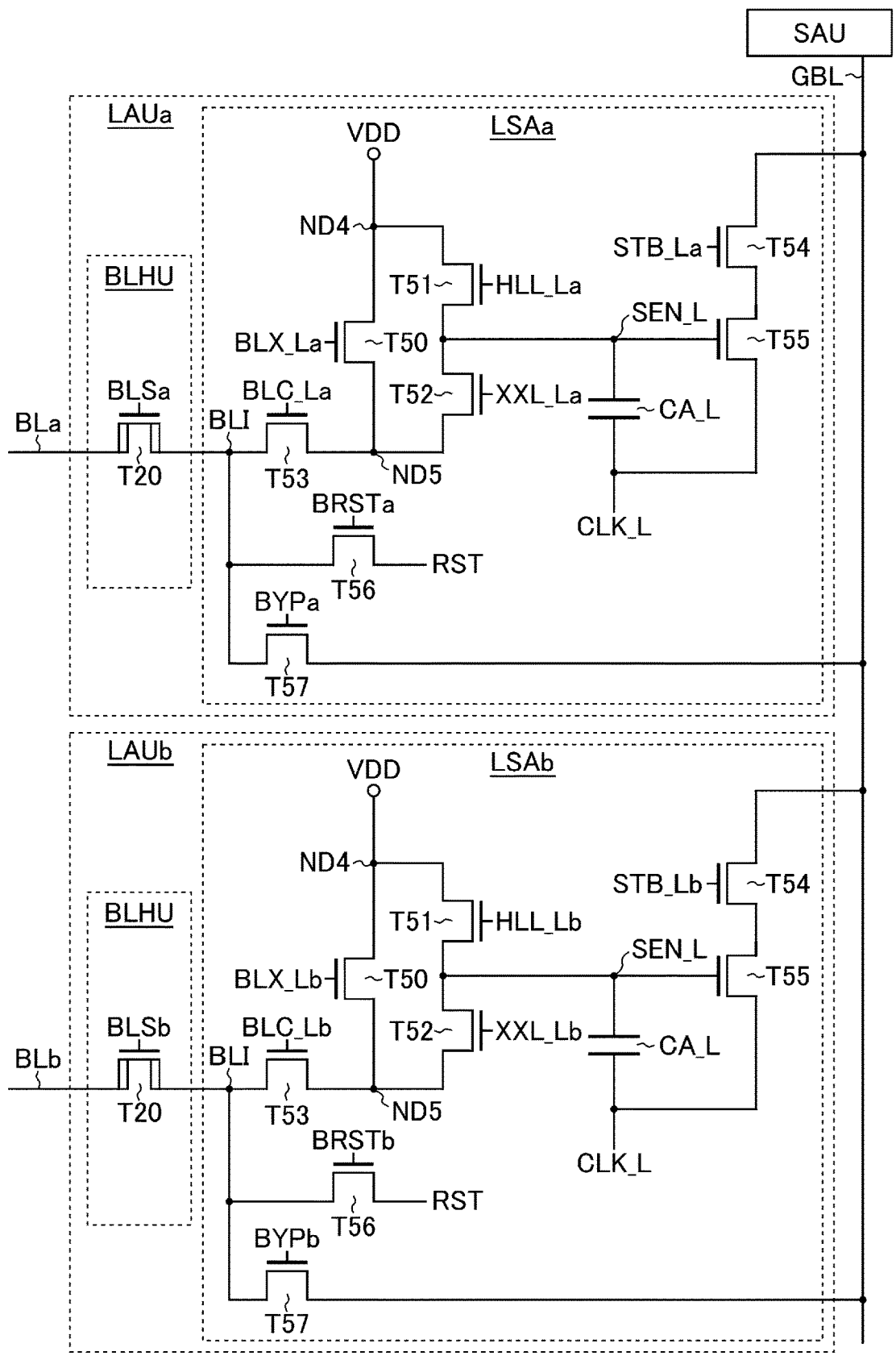
FIG. 35 is a circuit diagram showing an example of a circuit configuration of a local amplifier unit in the semiconductor storage device according to the seventh embodiment.

FIG. 35 shows an example of a circuit configuration of the local sense amplifier LSA provided in the semiconductor storage device 1 according to the seventh embodiment, and shows a configuration associated with one global bit line GBL. As shown in FIG. 35, local sense amplifiers LSAa and LSAb have a similar circuit configuration. For example, each local sense amplifier LSA includes transistors T50 to T57 and a capacitor CA_L. The transistors T50 to T57 are N-type MOS transistors.

In each local sense amplifier LSA, a drain of the transistor T50 is connected to a node ND4 connected to a power supply line. A drain of the transistor T50 is connected to a node ND5. A drain of the transistor T51 is connected to the node ND4. A source of the transistor T51 is connected to a node SEN_L. A drain of the transistor T52 is connected to the node SEN_L. A source of the transistor T52 is connected to the node ND5. A drain of the transistor T53 is connected to the node ND5. A source of the transistor T53 is connected to a node BLI.

A drain of the transistor T54 is connected to a global bit line GBL. A drain of the transistor T55 is connected to a source of the transistor T54. A source of the transistor T55 is connected to a node CLK_L. A gate of the transistor T55 is connected to the node SEN_L. One electrode of the capacitor CA_L is connected to the node SEN_L. The other electrode of the capacitor CA_L is connected to the node CLK_L. A drain of the transistor T56 is connected to a node RST. A source of the transistor T56 is connected to the node BLI. A drain of the transistor T57 is connected to the global bit line GBL. A source of the transistor T57 is connected to the node BLI.

Control signals BLX_La, HLL_La, XXL_La, BLC_La, STB_La, BRSta, and BYPa are respectively input into gates of the transistors T50 to T54, T56, and T57 in the local sense amplifier LSAa. Similarly, control signals BLX_Lb, HLL_Lb, XXL_Lb, BLC_Lb, STB_Lb, BRStb, and BYPb are respectively input into gates of the transistors T50 to T54, T56, and T57 in the local sense amplifier LSAb. Control signals in the local sense amplifiers LSAa and LSAb may be appropriately shared as long as operations to be described later can be executed. Other configurations of the semiconductor storage device 1 according to the seventh embodiment are the same as those in the fourth embodiment.

7.2 Operation of Semiconductor Storage Device 1 (Read Operation)

Figure 36:
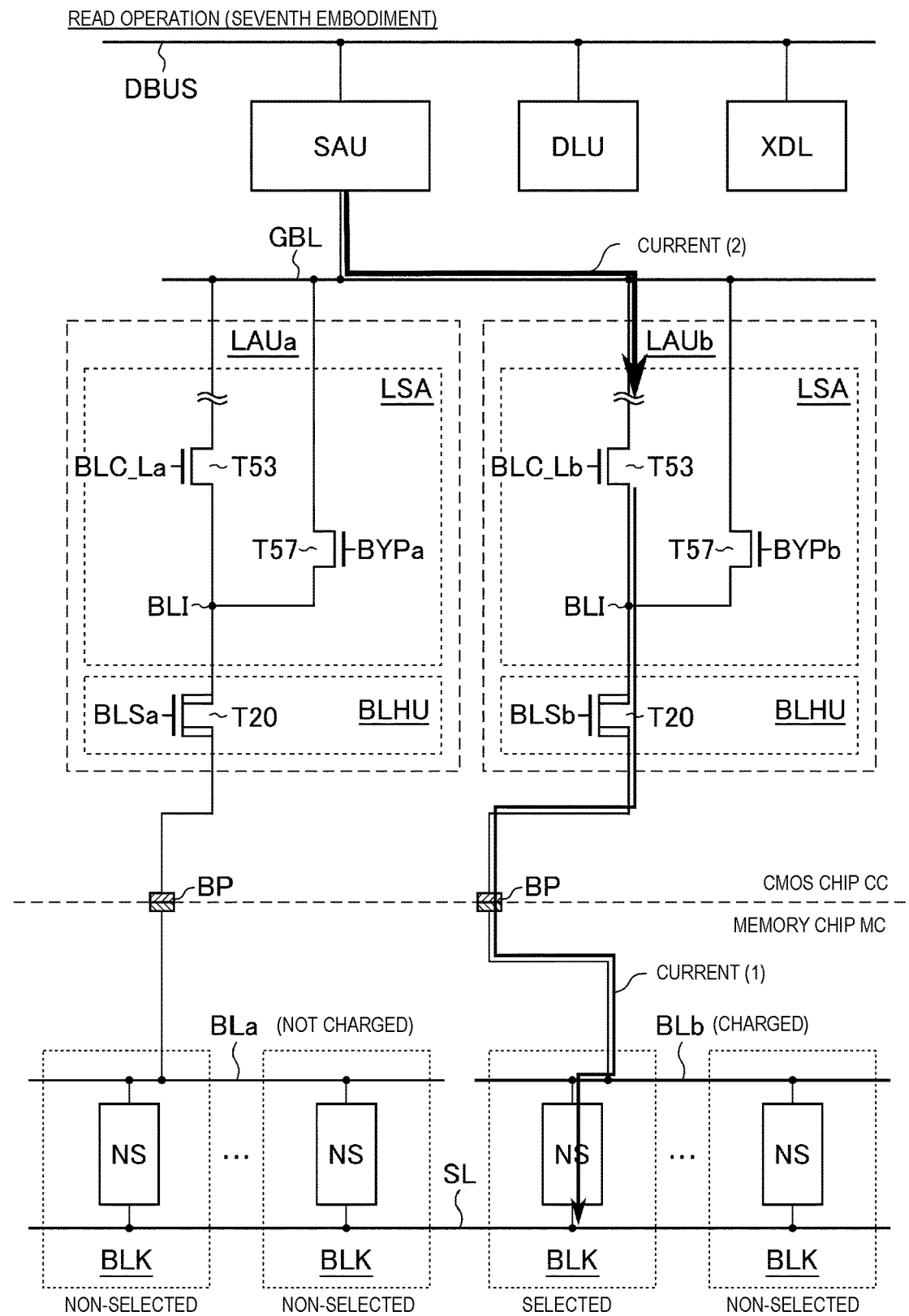
FIG. 36 is a circuit diagram schematically showing a read operation of the semiconductor storage device according to the seventh embodiment.

FIG. 36 shows a configuration related to local amplifier units LAUa and LAUb connected to a common global bit line GBL and an example of a current path during a read operation in the semiconductor storage device 1 according to the seventh embodiment. As shown in FIG. 36, in the read operation of the semiconductor storage device 1 according to the seventh embodiment, the sequencer 13 charges a bit line BL connected to a NAND string NS provided in a selected block BLK, and does not charge a bit line BL connected only to a NAND string NS provided in a non-selected block BLK. Then, the sequencer 13 amplifies a read current using a local amplifier unit LAU.

Specifically, when a block BLK including a NAND string NS connected to the bit line BLb is selected, the sequencer first charges the bit line BLb using the local sense amplifier LSAb. Thereafter, a read voltage is applied to a selected word line WL, and a voltage of the node SEN_L in the local amplifier unit LAUb is changed based on a state of a selected memory cell transistor MT. Specifically, when the selected memory cell transistor MT is in an ON state, a current (1) flows from the node SEN_L to a source line SL through the memory cell transistor MT. As a result, a voltage of the node SEN_L is decreased to an "L" level. On the other hand, when the selected memory cell transistor MT is in an OFF state, a voltage of the node SEN_L is maintained at an "H" level.

Then, the sequencer 13 sets a voltage of the control signal STB_Lb to an "H" level. When a voltage of an "H" level is applied to a gate of the transistor T54, the transistor T54 in the local amplifier unit LAUb is in an ON state or an OFF state based on a voltage of the node SEN_L. When a voltage of the node SEN_L is at an "H" level, a current (2) flows from a sense amplifier unit SAU toward a ground line through the transistors T54 and T55 in the local amplifier unit LAUb, and a voltage of the global bit line GBL is decreased. On the other hand, when a voltage of the node SEN_L is at an "L" level, the global bit line GBL is maintained at a high voltage.

Accordingly, the sense amplifier unit SAU can determine read data of a selected memory cell transistor MT based on a voltage of a global bit line GBL. An operation when a block BLK corresponding to another bit line BL is selected is the same as the operation when the block BLK corresponding to the bit line BLb is selected.

Hereinafter, a read operation of the semiconductor storage device 1 according to the seventh embodiment will be described in detail. Similar to the fourth embodiment, a selected bit line BL is charged and a non-selected bit line BL is not charged in the read operation of the semiconductor storage device 1 according to the seventh embodiment. Therefore, the following description focuses on an operation corresponding to a local amplifier unit LAU connected to a selected bit line BL.

Figure 37:
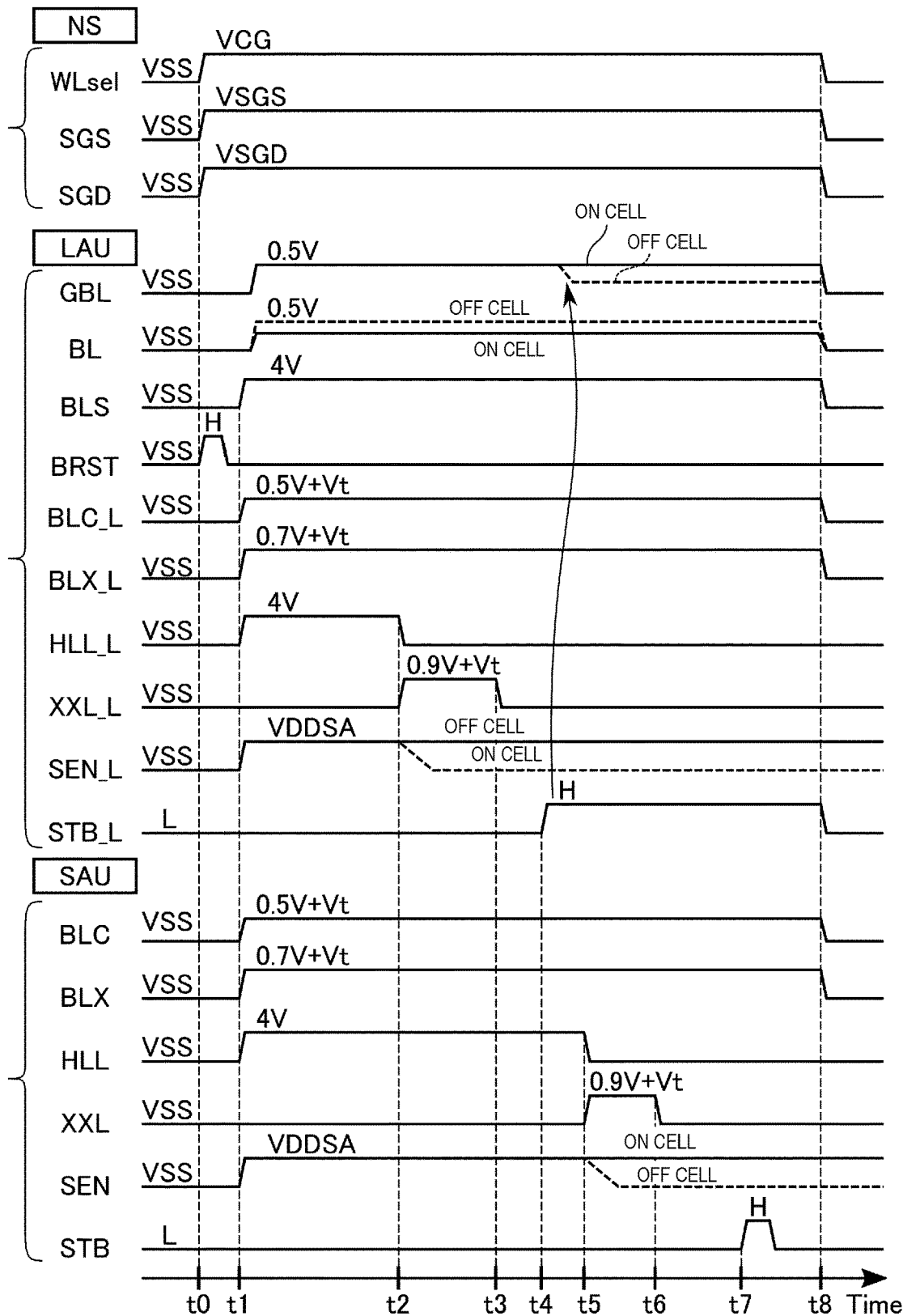
FIG. 37 is a timing chart showing an example of the read operation of the semiconductor storage device according to the seventh embodiment.

FIG. 37 shows an example of a timing chart of a read operation of the semiconductor storage device 1 according to the seventh embodiment, and shows changes of control signals and the like corresponding to a NAND string NS, a local amplifier unit LAU, and a sense amplifier unit SAU. As shown in FIG. 37, the sequencer 13 sequentially executes processes at time points t0 to t8 in the read operation. Voltages of control signals and wires before executing the read operation are, for example, VSS.

At the time point t0, VCG is applied to a word line WLsel, VCGS is applied to a select gate line SGS, and VSGD is applied to a select gate line SGD. The sequencer 13 temporarily increases a voltage of a control signal BRST to an "H" level. For example, since VSS is applied to the node RST in the read operation, a voltage of the node BLI is decreased to VSS by the operation.

At the time point t1, the sequencer 13 increases a voltage of a control signal BLS to, for example, 4 V, increases a voltage of a control signal BSWsel to, for example, 4 V, increases a voltage of a control signal BLC_L to, for example, 0.5 V+Vt (where Vt corresponds to a threshold voltage of the transistor T53), increases a voltage of a control signal BLX_L to, for example, 0.7 V+Vt (where Vt corresponds to a threshold voltage of the transistor T50), increases a voltage of a control signal HLL_L to, for example, 4 V, increases a voltage of a control signal BLC to, for example, 0.5 V+Vt (where Vt corresponds to a threshold voltage of the transistor T4), increases a voltage of a control signal BLX to, for example, 0.7 V+Vt (where Vt corresponds to a threshold voltage of the transistor T1), and increases a voltage of a control signal HLL to, for example, 4 V.

Then, the nodes SEN and SEN_L are charged, and voltages of the nodes SEN and SEN_L are increased to VDDSA. A voltage of a global bit line GBL is increased to, for example, 0.5 V, and a voltage of a bit line BL is changed based on data stored in a selected memory cell transistor MT. Specifically, a voltage of a bit line BL connected to an OFF cell is increased to, for example, 0.5 V, that is, a voltage the same as the voltage of the global bit line GBL. On the other hand, a voltage of a bit line BL connected to an OFF cell is increased to a voltage lower than a voltage of a bit line BL connected to an ON cell.

At the time point t2, the sequencer 13 reduces a voltage of a control signal HLL_L to VSS, and increases a voltage of XXL_L to, for example, 0.9 V+Vt (where Vt corresponds to a threshold voltage of the transistor T52). Then, a voltage of the node SEN_L is changed based on data stored in a selected memory cell transistor MT. Specifically, a voltage of a node SEN_L connected to an ON cell is decreased, and a voltage of a node SEN_L connected to an OFF cell is maintained at a high voltage.

At the time point t3, the sequencer 13 decreases a voltage of a control signal XXL_L to VSS. Then, the transistor T52 is in an OFF state and a voltage of the node SEN_L is constant.

At the time point t4, the sequencer 13 increases a voltage of a control signal STB_L to an "H" level. Then, a voltage of a global bit line GBL is changed based on a voltage of the node SEN_L. Specifically, since the transistor T55 is maintained in an OFF state by a low voltage of the node SEN_L, a voltage of a global bit line GBL connected to an ON cell is maintained at a high voltage. On the other hand, since the transistor T55 is turned on by a high voltage of the node SEN_L, a voltage of a global bit line GBL connected to an OFF cell is decreased. Accordingly, a voltage of a global bit line GBL connected to an OFF cell is lower than a voltage of a global bit line GBL connected to an ON cell.

At the time point t5, the sequencer 13 decreases a voltage of a control signal HLL to VSS, and increases a voltage of a control signal XXL to 0.9 V+Vt (where Vt corresponds to a threshold voltage of the transistor T3). Then, charging of the node SEN via the transistors T0 and T2 is stopped, and a voltage of the node SEN is changed based on a voltage of a global bit line GBL. Specifically, since a global bit line GBL connected to an ON cell is maintained at a high voltage, the voltage of the node SEN is maintained at a high voltage. On the other hand, since a global bit line GBL connected to an OFF cell has a low voltage, the voltage of the node SEN is decreased.

At the time point t6, the sequencer 13 decreases a voltage of a control signal XXL to VSS. Then, the transistor T3 is in an OFF state and a voltage of the node SEN is constant.

At the time point t7, the sequencer 13 asserts a control signal STB. That is, the sequencer temporarily increases a voltage of the control signal STB to an "H" level. Then, a voltage of a bus LBUS is changed based on a voltage of the node SEN. Specifically, since the node SEN connected to an ON cell is maintained at a high voltage, the transistor T7 is in an ON state and a voltage of the bus LBUS is decreased. Since the node SEN connected to an OFF cell has a low voltage, the transistor T7 is maintained in an OFF state and a voltage of the bus LBUS is maintained high. Then, the sequencer 13 stores data in any one of latch circuits in the sense amplifier module 14 based on a voltage value of a bus LBUS.

At the time point t8, voltages of a word line WLsel and select gate lines SGS and SGD are decreased to VSS. The sequencer 13 decreases voltages of control signals BLS, BLC_L, BLX_L, STB_L, BLC_L, and BLX to VSS (an "L" level). The semiconductor storage device 1 according to the seventh embodiment can execute a read operation as described above.

(Write Operation)

Figure 38:
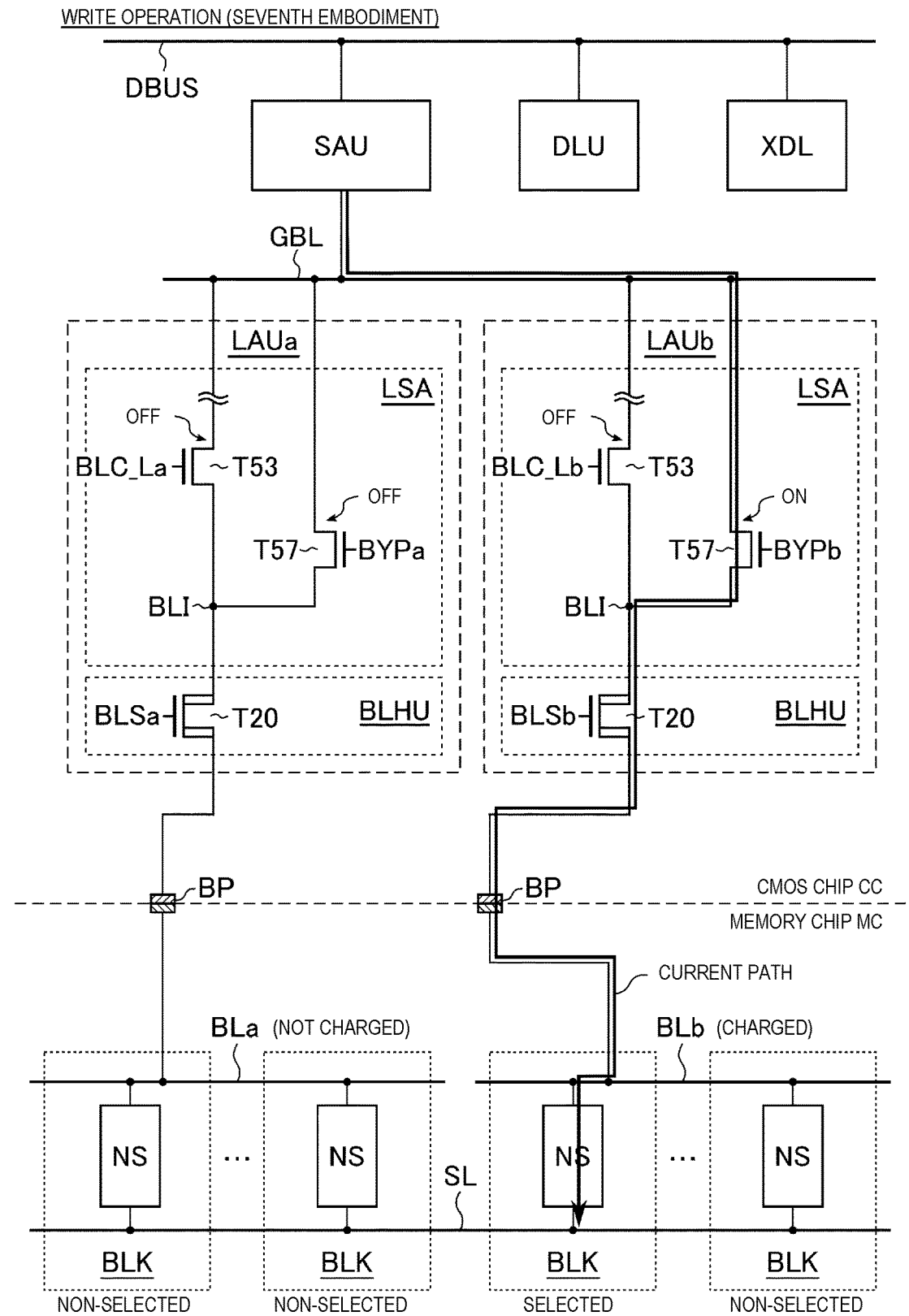
FIG. 38 is a circuit diagram schematically showing a write operation of the semiconductor storage device according to the seventh embodiment.

FIG. 38 shows a configuration related to local amplifier units LAUa and LAUb connected to a common global bit line GBL and an example of a current path during a write operation in the semiconductor storage device 1 according to the seventh embodiment. In the write operation of the semiconductor storage device 1 according to the seventh embodiment, the sequencer 13 electrically connects a global bit line GBL and a bit line BL by turning on the transistor T57 in a local amplifier unit LAU as shown in FIG. 38. Then, a bit line BL connected to a NAND strings NS provided in a selected block BLK is appropriately charged, and a bit line BL connected only to a NAND strings NS provided in a non-selected block BLK is not charged.

Specifically, when a block BLK including a NAND string NS connected to the bit line BLb is selected, the sequencer 13 first controls the transistor T57 provided in a local sense amplifier LSA of the local amplifier unit LAUb to an ON state. Thereafter, the sequencer 13 executes a program loop including a program operation and a verification operation. Accordingly, the sequencer 13 can write data to a memory cell transistor MT. An operation when a block BLK corresponding to another bit line BL is selected is the same as the operation when the block BLK corresponding to the bit line BLb is selected.

7.3 Effect of Seventh Embodiment

As described above, the semiconductor storage device 1 according to the seventh embodiment includes a plurality of local amplifier units LAU each including a local sense amplifier LSA, and executes a two-stage read operation using a local sense amplifier LSA and a sense amplifier unit SAU. Accordingly, the semiconductor storage device 1 according to the seventh embodiment can amplify a cell current in a read operation and improve accuracy of the read operation. Therefore, the semiconductor storage device 1 according to the seventh embodiment can obtain the same effect as the first embodiment, and can further reduce a read error.

The seventh embodiment is different from the fourth embodiment mainly in that circuit configurations of local amplifier units LAU are different. Specifically, different from the amplifier circuit AC according to the fourth embodiment, the local sense amplifier LSA according to the seventh embodiment has a configuration for applying a voltage to a bit line BL. Therefore, it is preferable to provide a local sense amplifier LSA as in the seventh embodiment in order to shorten time for charging the bit line BL. On the other hand, the number of elements in a circuit of an amplifier circuit AC is smaller than the number of elements in a circuit of a local sense amplifier LSA. Therefore, it is preferable to use an amplifier circuit AC as in the fourth embodiment in the semiconductor storage device 1 when it is desired to reduce an area of a sense amplifier region SR.

8. Eighth Embodiment

The semiconductor storage device 1 according to the eighth embodiment has a configuration in which the number of local sense amplifiers LSA connected to a global bit line GBL is added as compared with the semiconductor storage device 1 according to the seventh embodiment. Hereinafter, differences of the semiconductor storage device 1 according to the eighth embodiment from the semiconductor storage device 1 according to the first to seventh embodiments will be described.

8.1 Circuit Configuration of Sense Amplifier Module 14

Figure 39:
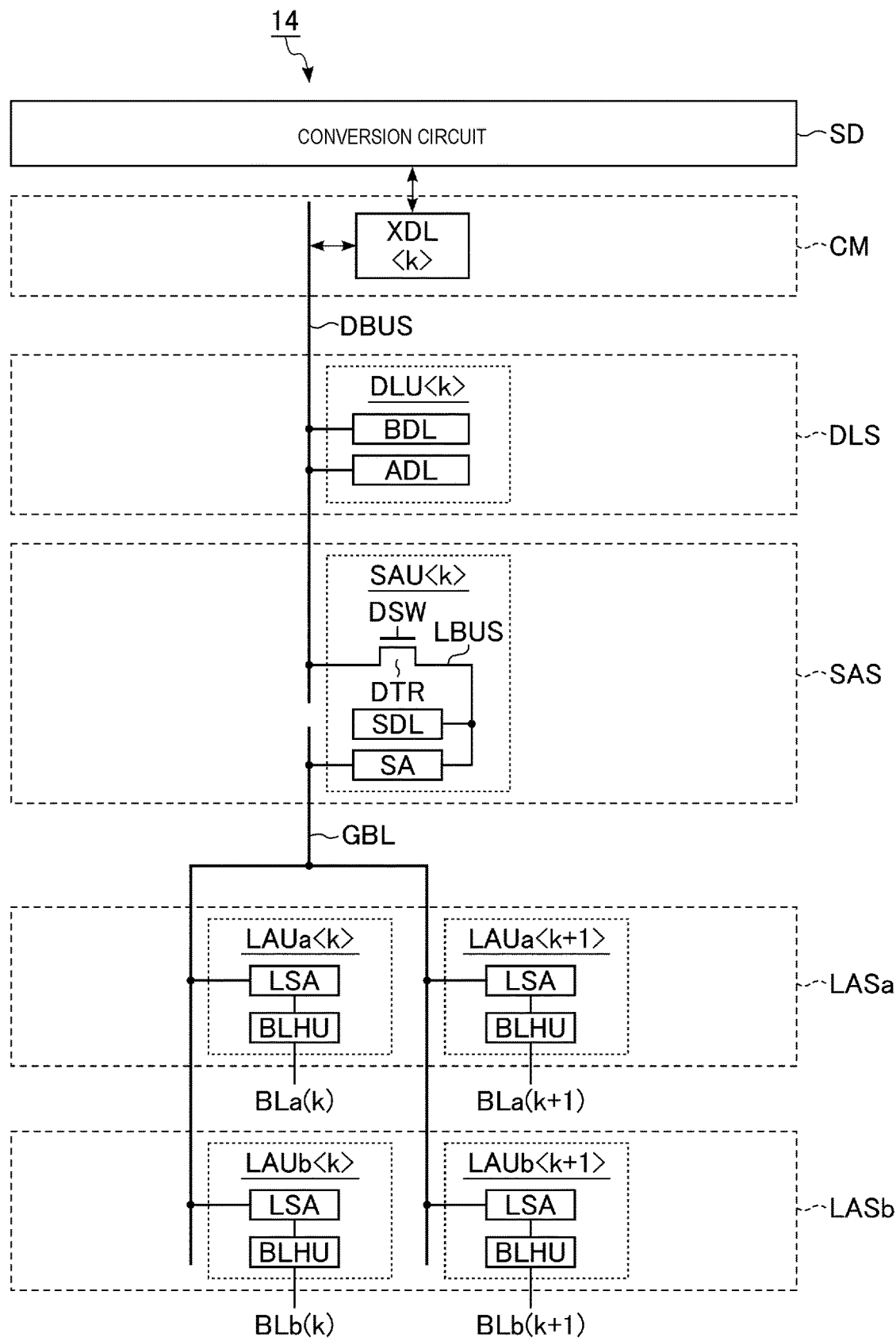
FIG. 39 is a circuit diagram showing an example of a circuit configuration of a sense amplifier module provided in a semiconductor storage device according to an eighth embodiment.

FIG. 39 shows an example of a circuit configuration of the sense amplifier module 14 provided in the semiconductor storage device 1 according to the eighth embodiment, and shows a configuration associated with one global bit line GBL. As shown in FIG. 39, the sense amplifier module 14 according to the eighth embodiment has the same circuit configuration as the sense amplifier module 14 shown in FIG. 29 according to the fifth embodiment. A local amplifier unit LAU according to the eighth embodiment has a configuration in which the amplifier circuit AC according to the fifth embodiment is replaced with the local sense amplifier LSA. That is, four local sense amplifiers LSA are connected to one global bit line GBL in the eighth embodiment. A pitch of a global bit line GBL in the semiconductor storage device 1 according to the eighth embodiment is larger than a pitch of a bit line BL. Other configurations of the semiconductor storage device 1 according to the eighth embodiment are the same as those in the seventh embodiment.

8.2 Effect of Eighth Embodiment

As described above, the semiconductor storage device 1 according to the eighth embodiment has a configuration in which more local amplifier units LAU are connected to a global bit line GBL as compared with the seventh embodiment. In such a case, the semiconductor storage device 1 according to the eighth embodiment can execute a read operation in a series manner for a plurality of bit lines BL sharing a global bit line GBL by, for example, independently controlling local amplifier units LAU that share the global bit line GBL. In the semiconductor storage device 1 according to the eighth embodiment, a pitch of a global bit line GBL is larger than a pitch in the seventh embodiment. That is, a wire capacitance and wire resistance of the global bit line GBL in the semiconductor storage device 1 according to the eighth embodiment can be reduced as compared with the seventh embodiment.

9. Other Modification

A semiconductor storage device according to an embodiment includes a memory unit and a circuit unit. The memory unit includes first and second memory cells, first and second bit lines respectively connected to the first and second memory cells, and first and second bonding metals respectively connected to the first and second bit lines. The circuit unit includes a sense amplifier unit including a first wire, and third and fourth bonding metals that are connected with the first wire and respectively face the first and second bonding metals. The circuit unit is connected with the memory unit. Accordingly, the semiconductor storage device according to the embodiment can reduce power consumption and increase an operation speed.

Figure 40:
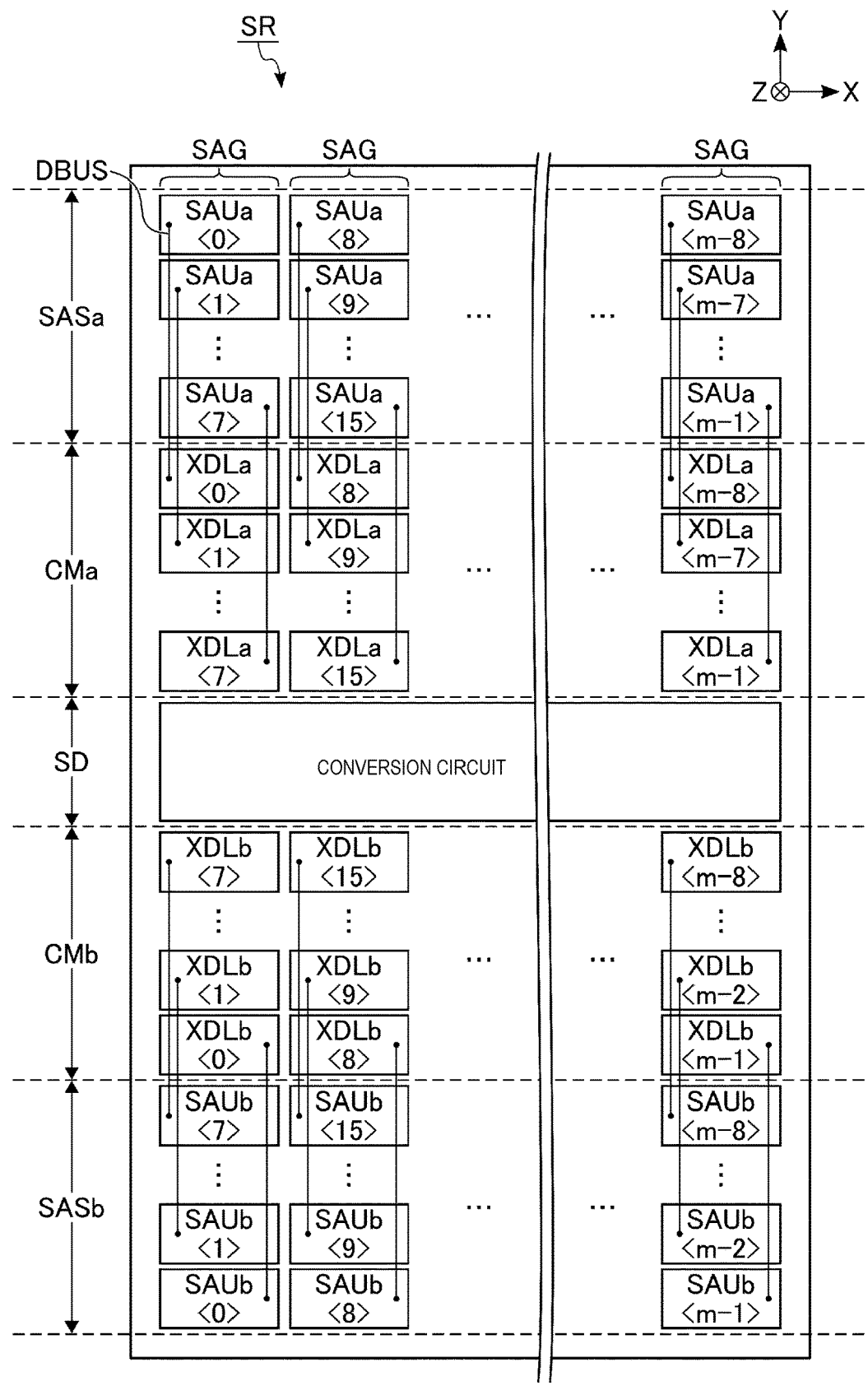
FIG. 40 is a plan view showing an example of a planar layout of a sense amplifier region in a CMOS chip provided in a semiconductor storage device according to a modification of the first embodiment.

Although a conversion circuit SD is provided at an end portion of a sense amplifier region SR in the embodiments described above, the present disclosure is not limited thereto. FIG. 40 shows an example of a planar layout of a sense amplifier region SR in a CMOS chip CC provided in the semiconductor storage device 1 according to a modification of the first embodiment. As shown in FIG. 40, a conversion circuit SD may be provided between an intermediate portion of the sense amplifier region SR, that is, between sense amplifier sets SASa and SASb. In such a case, the sense amplifier module 14 may include a cache memory CMa provided at a side close to the sense amplifier set SASa and a cache memory CMb provided at a side close to the sense amplifier set SASb. For example, latch circuits XDLa<0> to XDLa<m−1> in the cache memory CMa are connected to the conversion circuit SD from the side close to the sense amplifier set SASa, and latch circuits XDLb<0> to XDLb<m−1> in the cache memory CMb are connected to the conversion circuit SD from the side close to the sense amplifier set SASb.

Although a plurality of data latch units DLU and a plurality of latch circuits XDL provided in the same sense amplifier group SAG are arranged in the Y direction in the embodiments described above, the present disclosure is not limited thereto. The plurality of data latch units DLU provided in the same sense amplifier group SAG may be arranged in the X direction. Similarly, the plurality of latch circuits XDL provided in the same sense amplifier group SAG may be arranged in the X direction. A calculation circuit may be inserted between the sense amplifier units SAU and the latch circuits XDL. Such a calculation circuit may be shared by a plurality of sense amplifier groups SAG. The number of sense amplifier units SAU, latch circuits XDL, and the like provided in each sense amplifier group SAG may be any number.

The embodiments described above can be combined in any technically feasible manner. For example, the second embodiment may be combined with other embodiments, and bit lines BL extending in the Y direction in each of the third to eighth embodiments may be divided into three or more portions. Although the sense amplifier module 14 includes a data latch set DLS in the fourth to eighth embodiments, similar to the first embodiment, a sense amplifier unit SAU may include latch circuits ABL and BDL in each of the fourth to eighth embodiments.

In the embodiments described above, a voltage value used in an operation of the semiconductor storage device 1 is merely an example. A used voltage value may be other voltage values if the same operation as an operation described in each embodiment can be executed. Processing timing of a read operation described in each of the fourth embodiment and the seventh embodiment is merely an example. A processing at each time point may not be necessarily executed at the same timing, or may be executed at a shifted timing.

In the embodiments described above, a memory pillar MP may have a structure in which two or more of a plurality of pillars may be coupled in the Z direction. The memory pillar MP may have a structure in which a pillar corresponding to a select gate line SGD and a pillar corresponding to a word line WL are coupled. Each of contacts CV, CP, CS, C0 to C3, V1, and V2 may have a structure in which a plurality of contacts are coupled. In such a case, a wire layer may be inserted between coupled contacts. Each of the memory pillar MP and the contacts CV, CP, CS, C0 to C3, V1, and V2 may have a tapered shape or an inverted tapered shape, or may have a shape in which an intermediate portion bulges. Similarly, a slit SLT may have a tapered shape or an inverse tapered shape, or may have a shape in which an intermediate portion bulges. Although a case in which a cross-sectional structure of the memory pillar MP is circular is described, the cross-sectional structure of the memory pillar MP may be elliptical, or may be any shape.

In the embodiments described above, although a case is described in which stacked wires such as word lines WL forms a step structure having steps in the Y direction in a lead-out region HR, the present disclosure is not limited thereto. For example, a step may be formed in the X direction at the end portions of stacked word lines WL and select gate lines SGD and SGS. The end portions of the word lines WL and the select gate lines SGD and SGS stacked in the lead-out region HR may have a step structure in which the number of columns may be any number. A formed step structure may be different among the select gate lines SGS, the word lines WL, and the select gate lines SGD.

Although the semiconductor storage device 1 is a NAND flash memory in the embodiments described above, a structure of the semiconductor storage device 1 according to embodiments described above may be applied to other storage devices. For example, the semiconductor storage device 1 may be a resistance change memory in which a resistance change element is used as a memory cell. The same structure as the structure of the semiconductor storage device 1 according to the embodiments described above may be applied to a storage device including at least a circuit for driving wires in a vertical direction (for example, the Y direction) and a circuit for driving wires in a lateral direction (for example, the X direction), and can obtain the same effect.

A term "connection" in the present specification refers to electrical connection, and does not exclude connection via another element, or the like. A term "electrically connected" may be connection via an insulator if an operation can be executed in the same manner as an operation in which elements are electrically connected. A term "columnar" refers to a structure provided in a hole formed in a manufacturing processing of the semiconductor storage device 1. An "H" level corresponds to a voltage level at which an N-type transistor is in an ON state and a P-type transistor is in an OFF state. An "L" level corresponds to a voltage level at which an N-type transistor is in an OFF state and a P-type transistor is in an ON state.

While certain embodiments have been described, these embodiments have been presented by way of example only, and are not intended to limit the scope of the disclosures. Indeed, the novel embodiments described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor storage device comprising:
a memory unit that includes first and second memory cells, first and second bit lines respectively connected to the first and second memory cells, and first and second bonding metals respectively connected to the first and second bit lines; and
a circuit unit bonded to the memory unit, the circuit unit including a sense amplifier module including a first wire, a third bonding metal connected to the first wire and opposed to the first bonding metal, and a fourth bonding metal connected to the first wire and opposed to the second bonding metal, wherein
the first and second bit lines each extend in a first direction, are aligned along the first direction, and are separated in the first direction.

2. The semiconductor storage device according to claim 1, wherein
the sense amplifier module includes a first sense amplifier connected between the third bonding metal and the first wire, a second sense amplifier connected between the fourth bonding metal and the first wire, and a latch circuit that is connected to the first wire and shared by the first sense amplifier and the second sense amplifier.

3. The semiconductor storage device according to claim 1, wherein
the memory unit further includes a third memory cell, a third bit line connected to the third memory cell, and a fifth bonding metal connected to the third bit line, and
the circuit unit further includes a sixth bonding metal that is connected to the first wire and faces the fifth bonding metal.

4. A semiconductor storage device comprising:
a memory unit that includes first and second memory cells, first and second bit lines respectively connected to the first and second memory cells, and first and second bonding metals respectively connected to the first and second bit lines; and
a circuit unit bonded to the memory unit, the circuit unit including a sense amplifier unit including a first wire, a third bonding metal connected to the first wire and opposed to the first bonding metal, and a fourth bonding metal connected to the first wire and opposed to the second bonding metal, wherein
the circuit unit further includes a first local amplifier unit connected to the first bit line, a second local amplifier unit connected to the second bit line, and a global bit line connected to the first local amplifier unit and the second local amplifier unit, and
the sense amplifier unit is connected between the first wire and the global bit line.

5. The semiconductor storage device according to claim 4, wherein
the first local amplifier unit includes a first transistor connected between the first bit line and the global bit line, and a second transistor that is connected between the global bit line and a ground line and whose gate is connected to a first node between the first bit line and the first transistor, and
the second local amplifier unit includes a third transistor connected between the second bit line and the global bit line, and a fourth transistor that is connected between the global bit line and a ground line and whose gate is connected to a second node between the second bit line and the third transistor.

6. The semiconductor storage device according to claim 5, wherein
the circuit unit further includes a controller that executes a read operation,
the first local amplifier unit further includes a fifth transistor connected to the first node,
the second local amplifier unit further includes a sixth transistor connected to the second node,
the controller applies a ground voltage to the second bit line via the sixth transistor in a read operation in which the first memory cell is selected, and
the controller applies the ground voltage to the first bit line via the fifth transistor in a read operation in which the second memory cell is selected.

7. The semiconductor storage device according to claim 4, wherein
the first local amplifier unit includes a seventh transistor connected between the first bit line and the global bit line, an eighth transistor connected between the first bit line and a power supply line, a ninth transistor connected between the first bit line and a first sense node, a tenth transistor whose gate is connected to the first sense node, and an eleventh transistor connected between the tenth transistor and the global bit line, and
the second local amplifier unit includes a twelfth transistor connected between the second bit line and the global bit line, a thirteenth transistor connected between the second bit line and the power supply line, a fourteenth transistor connected between the first bit line and a second sense node, a fifteenth transistor whose gate is connected to the second sense node, and a sixteenth transistor connected between the fifteenth transistor and the global bit line.

8. The semiconductor storage device according to claim 7, wherein
the circuit unit further includes a controller that executes a write operation, and
the controller
controls the seventh transistor to an ON state and the twelfth transistor to an OFF state in a write operation in which the first memory cell is selected, and
controls the seventh transistor to an OFF state and the twelfth transistor to an ON state in a write operation in which the second memory cell is selected.

9. The semiconductor storage device according to claim 1, wherein
the memory unit includes a plurality of first conductor layers that are separated from each other, first pillars that pass through the plurality of first conductor layers, a plurality of second conductor layers that are separated from each other, second pillars that pass through the plurality of second conductor layers, and third conductor layers and fourth conductor layers that are respectively connected to the first pillars and second pillars,
the first memory cell is located at an intersection portion between one of the first pillars and one of the first conductor layers,
the second memory cell is located at an intersection portion between one of the second pillars and one of the second conductor layers,
the first bit line is one of the third conductor layers and the second bit line is one of the fourth conductor layers, and
each of the first bonding metal, the second bonding metal, the third bonding metal, and the fourth bonding metal contains copper.

10. A semiconductor storage device comprising:
a memory unit including
a first memory cell,
a first word line extending in a first direction and connected to a gate of the first memory cell,
a first bit line extending in a second direction different from the first direction and connected to the first memory cell,
a second memory cell,
a second word line extending in the first direction and connected to a gate of the second memory cell,
a second bit line extending in the second direction and connected to the second memory cell,
a first bonding metal provided at one side of the first bit line in a third direction different from the first direction and the second direction and connected to the first bit line, and
a second bonding metal provided at the one side of the second bit line in the third direction and connected to the second bit line; and
a circuit unit including
a first sense amplifier,
a second sense amplifier, a first latch circuit,
a first wire connected to the first sense amplifier, the second sense amplifier, and the first latch circuit,
a third bonding metal provided at the other side of the first sense amplifier in the third direction, connected to the first sense amplifier, and opposed to the first bonding metal for bonding thereto, and
a fourth bonding metal provided at the other side of the second sense amplifier in the third direction, connected to the second sense amplifier, and opposed to the second bonding metal for bonding thereto, wherein
the first and second bit lines are aligned along the second direction and are separated in the second direction.

11. The semiconductor storage device according to claim 10, wherein
the first latch circuit is shared by the first sense amplifier and the second sense amplifier.

12. The semiconductor storage device according to claim 10, wherein
the memory unit further includes
a third memory cell,
a third word line extending in the first direction and connected to a gate of the third memory cell,
a third bit line extending in the second direction and connected to the third memory cell,
a fifth bonding metal provided at one side of the third bit line in the third direction and connected to the third bit line, and
the circuit unit further includes
a third sense amplifier, and
a sixth bonding metal provided at the other side of the third sense amplifier in the third direction, connected to the third sense amplifier, and opposed to the fifth bonding metal for bonding thereto.

13. A semiconductor storage device comprising:
a memory unit including
a first memory cell,
a first word line extending in a first direction and connected to a gate of the first memory cell,
a first bit line extending in a second direction different from the first direction and connected to the first memory cell,
a second memory cell,
a second word line extending in the first direction and connected to a gate of the second memory cell,
a second bit line extending in the second direction and connected to the second memory cell,
a first bonding metal provided at one side of the first bit line in a third direction different from the first direction and the second direction and connected to the first bit line, and
a second bonding metal provided at the one side of the second bit line in the third direction and connected to the second bit line; and
a circuit unit including
a first sense amplifier,
a second sense amplifier,
a first latch circuit,
a first wire connected to the first sense amplifier, the second sense amplifier, and the first latch circuit,
a third bonding metal provided at the other side of the first sense amplifier in the third direction, connected to the first sense amplifier, and opposed to the first bonding metal for bonding thereto, and
a fourth bonding metal provided at the other side of the second sense amplifier in the third direction, connected to the second sense amplifier, and opposed to the second bonding metal for bonding thereto, wherein
the circuit unit further includes a first local amplifier unit connected to the first bit line, a second local amplifier unit connected to the second bit line, and a global bit line connected to the first local amplifier unit and the second local amplifier unit, and
the sense amplifier unit is connected between the first wire and the global bit line.

14. The semiconductor storage device according to claim 13, wherein
the first local amplifier unit includes a first transistor connected between the first bit line and the global bit line, and a second transistor that is connected between the global bit line and a ground line and whose gate is connected to a first node between the first bit line and the first transistor, and
the second local amplifier unit includes a third transistor connected between the second bit line and the global bit line, and a fourth transistor that is connected between the global bit line and a ground line and whose gate is connected to a second node between the second bit line and the third transistor.

15. The semiconductor storage device according to claim 14, wherein
the circuit unit further includes a controller that executes a read operation,
the first local amplifier unit further includes a fifth transistor connected to the first node,
the second local amplifier unit further includes a sixth transistor connected to the second node,
the controller applies a ground voltage to the second bit line via the sixth transistor in a read operation in which the first memory cell is selected, and
the controller applies the ground voltage to the first bit line via the fifth transistor in a read operation in which the second memory cell is selected.

16. The semiconductor storage device according to claim 13, wherein
the first local amplifier unit includes a seventh transistor connected between the first bit line and the global bit line, an eighth transistor connected between the first bit line and a power supply line, a ninth transistor connected between the first bit line and a first sense node, a tenth transistor whose gate is connected to the first sense node, and an eleventh transistor connected between the tenth transistor and the global bit line, and
the second local amplifier unit includes a twelfth transistor connected between the second bit line and the global bit line, a thirteenth transistor connected between the second bit line and the power supply line, a fourteenth transistor connected between the first bit line and a second sense node, a fifteenth transistor whose gate is connected to the second sense node, and a sixteenth transistor connected between the fifteenth transistor and the global bit line.

17. The semiconductor storage device according to claim 16, wherein
the circuit unit further includes a controller that executes a write operation, and
the controller
controls the seventh transistor to an ON state and the twelfth transistor to an OFF state in a write operation in which the first memory cell is selected, and controls the seventh transistor to an OFF state and the twelfth transistor to an ON state in a write operation in which the second memory cell is selected.

18. The semiconductor storage device according to claim 10, wherein
- the memory unit includes a plurality of first conductor layers that are separated from each other, first pillars that pass through the plurality of first conductor layers, a plurality of second conductor layers that are separated from each other, second pillars that pass through the plurality of second conductor layers, and third conductor layers and fourth conductor layers that are respectively connected to the first pillars and second pillars,
- the first memory cell is located at an intersection portion between one of the first pillars and one of the first conductor layers,
- the second memory cell is located at an intersection portion between one of the second pillars and one of the second conductor layers,
- the first bit line is one of the third conductor layers and the second bit line is one of the fourth conductor layers, and
- each of the first bonding metal, the second bonding metal, the third bonding metal, and the fourth bonding metal contains copper.

\* \* \* \* \*